US008456836B2

(12) United States Patent
Allen et al.

(10) Patent No.: US 8,456,836 B2
(45) Date of Patent: Jun. 4, 2013

(54) SPRING LOADED SECURITY SLOT ATTACHMENT FOR PORTABLE DEVICE SECURITY

(75) Inventors: Peter Allen, Locust Valley, NY (US); Andrzej Marszalek, Maspeth, NY (US)

(73) Assignee: Think Products, Inc., Hauppauge, NY (US)

(*) Notice: Subject to any disclaimer, the term of this patent is extended or adjusted under 35 U.S.C. 154(b) by 0 days.

(21) Appl. No.: 13/478,933

(22) Filed: May 23, 2012

(65) Prior Publication Data

US 2012/0260698 A1 Oct. 18, 2012

Related U.S. Application Data

(63) Continuation-in-part of application No. 13/365,222, filed on Feb. 2, 2012, which is a continuation-in-part of application No. 13/031,174, filed on Feb. 18, 2011, now Pat. No. 8,223,488, which is a continuation-in-part of application No. 12/657,670, filed on Jan. 25, 2010, now Pat. No. 8,139,356, which is a continuation-in-part of application No. 12/154,561, filed on May 23, 2008, now Pat. No. 7,724,520, which is a continuation-in-part of application No. 11/454,433, filed on Jun. 15, 2006, now Pat. No. 7,443,665, which is a continuation-in-part of application No. 11/359,871, filed on Feb. 22, 2006, now Pat. No. 7,324,333, which is a continuation-in-part of application No. 11/038,591, filed on Jan. 19, 2005, now Pat. No. 7,315,443.

(60) Provisional application No. 60/655,270, filed on Feb. 22, 2005, provisional application No. 60/678,911, filed on May 6, 2005, provisional application No. 60/569,561, filed on May 10, 2004, provisional application No. 60/626,839, filed on Nov. 10, 2004, provisional application No. 60/691,476, filed on Jun. 17, 2005, provisional application No. 60/725,333, filed on Oct. 11, 2005, provisional application No. 60/757,737, filed on Jan. 10, 2006, provisional application No. 60/783,188, filed on Mar. 16, 2006.

(51) Int. Cl.
*H05K 5/00* (2006.01)
*H05K 7/00* (2006.01)

(52) U.S. Cl.
USPC ............ 361/679.57; 361/679.01; 361/679.58; 312/223.2; 211/8; 211/9; 257/727; 70/15; 70/50

(58) Field of Classification Search
USPC ........ 361/679.01, 679.57, 679.58; 312/223.2; 211/8, 9; 257/727; 70/15, 50
See application file for complete search history.

(56) References Cited

U.S. PATENT DOCUMENTS 3,181,319 A 5/1965 Hudon
3,275,160 A 9/1966 Zurker
(Continued)

FOREIGN PATENT DOCUMENTS

CA 454901 3/1949
CA 791364 8/1968
(Continued)

*Primary Examiner* — Anthony Haughton
(74) *Attorney, Agent, or Firm* — Alfred M. Walker; John F. Vodopia

(57) ABSTRACT

A lock includes an assembly of a slot engaging member insertable in a slot of a piece of equipment being locked, such as a portable or desktop computer, a laptop, notebook or other handheld electronic device, a monitor, a television/video screen, a video game, an electronic instrument such as an oscillator or a medical centrifuge or other analytical device, or the like. A rotatable locking member engages an anchor sub-assembly having a rotatable element, wherein the rotatable element communicates with a spring force urging against the rotatable locking member. The rotatable locking member is alternately movable in and out of the slot in which it is inserted, and the locking element is rotatable by finger force overcoming said spring force against the locking member, wherein the lock is locked without use of a tool.

13 Claims, 52 Drawing Sheets

U.S. PATENT DOCUMENTS 3,410,122 A 11/1968 Moses
3,410,580 A 11/1968 Longenecker
3,535,898 A 10/1970 Allport
3,707,860 A 1/1973 Singer
RE28,187 E 10/1974 Longenecker
3,945,227 A 3/1976 Reiland
3,965,705 A 6/1976 Nadler
4,009,599 A 3/1977 Patriquin
4,066,231 A 1/1978 Bahner
4,418,553 A 12/1983 Applegate
4,426,863 A 1/1984 Gillette
4,696,449 A 9/1987 Woo
4,733,840 A 3/1988 D'Amore
4,738,428 A 4/1988 Themistos
4,821,538 A 4/1989 Gray
4,856,304 A 8/1989 Derman
4,870,842 A 10/1989 Plumer
5,052,198 A 10/1991 Watts
5,052,199 A 10/1991 Derman
5,076,079 A 12/1991 Monoson
5,082,232 A 1/1992 Wilson
5,085,395 A 2/1992 Frater
5,135,197 A 8/1992 Kelley
5,154,456 A 10/1992 Moore
5,169,114 A 12/1992 O'Neil
5,265,449 A 11/1993 Rashleigh
5,345,219 A 9/1994 Rogers
5,351,507 A 10/1994 Derman
5,351,508 A 10/1994 Kelley
5,361,610 A 11/1994 Sanders
5,381,685 A 1/1995 Carl
5,406,809 A 4/1995 Iglemund
5,446,618 A 8/1995 Tetsuya
5,469,726 A 11/1995 Rushing
5,493,878 A 2/1996 Murray
5,502,989 A * 4/1996 Murray et al. .................... 70/58
5,526,226 A 6/1996 Katoh
5,531,082 A 7/1996 Wolk
5,542,723 A 8/1996 Scharf
5,560,481 A 10/1996 Doodson
5,568,359 A 10/1996 Cavello
5,582,044 A 12/1996 Bolich
5,595,074 A 1/1997 Munro
5,608,605 A 3/1997 Siow
5,645,261 A 7/1997 Glynn
5,709,110 A 1/1998 Greenfield
5,762,306 A 6/1998 Day
5,787,738 A 8/1998 Brandt
5,787,739 A 8/1998 Derman
5,794,463 A 8/1998 McDaid
5,816,076 A 10/1998 Biedermann
5,836,183 A 11/1998 Derman
D405,348 S 2/1999 Orr
5,927,108 A 7/1999 Pierce
D415,950 S 11/1999 Anderson
6,000,252 A 12/1999 Murray
6,006,557 A 12/1999 Carl
D425,402 S 5/2000 Welborn
6,138,483 A 10/2000 Galant
6,155,088 A 12/2000 Murray
D436,310 S 1/2001 Arnold
6,178,089 B1 1/2001 Alfonso
6,182,481 B1 2/2001 Nagy
6,185,964 B1 2/2001 Addiego
6,212,921 B1 4/2001 Knighton
6,216,499 B1 4/2001 Ronberg
6,237,375 B1 5/2001 Wymer
6,257,542 B1 7/2001 Westfield
6,275,378 B1 8/2001 Lee
6,308,928 B1 10/2001 Galant
6,317,936 B1 11/2001 McDaid
6,331,934 B1 12/2001 Helot
6,427,499 B1 8/2002 Derman
6,443,417 B2 9/2002 Galant
6,477,870 B1 11/2002 Derman
6,477,871 B1 11/2002 Shaw
6,497,125 B1 12/2002 Necchi
6,560,710 B1 5/2003 Leyden
6,578,394 B2 6/2003 Yin
6,581,420 B1 6/2003 Ling
6,590,767 B2 7/2003 Liao
6,612,455 B2 9/2003 Byme
D485,060 S 1/2004 DeCotis
6,684,548 B1 2/2004 Petrus
6,689,954 B2 2/2004 Vaughan
6,697,252 B2 2/2004 Maeda
6,705,133 B1 3/2004 Avganim
6,708,966 B1 3/2004 Troudt
6,711,921 B1 3/2004 Yang
6,735,990 B1 5/2004 Murray
D491,009 S 6/2004 Burdett
6,755,056 B2 6/2004 Igelmund
6,763,690 B2 7/2004 Galant
6,788,216 B2 * 9/2004 Chen .......................... 340/693.5
6,796,536 B1 9/2004 Sevier
6,810,698 B2 11/2004 Weinraub
6,820,362 B1 11/2004 Petrus
D499,546 S 12/2004 Smithers
6,865,914 B2 3/2005 Irgens
D503,532 S 4/2005 Andre
6,913,238 B2 7/2005 Bakker
6,920,770 B2 7/2005 Lurie
6,926,141 B2 8/2005 Montler
7,007,912 B1 3/2006 Giuliani
D519,731 S 5/2006 Andre
D521,232 S 5/2006 Andre
7,104,093 B2 9/2006 Ling
D533,994 S 12/2006 Hussaini
7,255,228 B2 8/2007 Kim
D553,352 S 10/2007 Allen
D559,076 S 1/2008 Allen
7,315,443 B2 1/2008 Allen
D565,839 S 4/2008 Allen
7,409,842 B2 8/2008 Kuo
7,443,665 B2 10/2008 Allen
7,499,269 B2 3/2009 Allen
7,499,270 B2 3/2009 Allen
7,647,796 B2 1/2010 Francke
7,963,132 B2 6/2011 Andres
8,111,511 B2 2/2012 Ruch
2001/0049949 A1 * 12/2001 Igelmund .......................... 70/58
2003/0085143 A1 5/2003 Yatabe
2004/0007651 A1 1/2004 Williams
2005/0150263 A1 7/2005 Murray
2005/0161557 A1 7/2005 Heintz
2005/0178173 A1 8/2005 Kuo
2005/0247584 A1 11/2005 Lu
2006/0032877 A1 2/2006 Obolo
2006/0117814 A1 * 6/2006 Francke ............................ 70/18
2006/0176661 A1 8/2006 Allen
2007/0205125 A1 9/2007 Ikebe
2007/0235493 A1 10/2007 Fortson
2008/0110217 A1 5/2008 Andrews

FOREIGN PATENT DOCUMENTS

CA 987121 4/1976
DE 329934 12/1920
DE 335741 4/1921
DE 361068 4/1923
DE 456219 2/1928
DE 577757 6/1933
DE 3202700 4/1983
DE 3407723 9/1985
DE 3824393 7/1989
FR 455740 8/1913
FR 877220 12/1942
FR 1026519 4/1953
FR 1085107 1/1955
FR 2308006 11/1976
FR 2636686 3/1990
FR 2741375 5/1997
GB 4470901 5/1936
GB 1256295 12/1971
GB 1376011 12/1974
GB 2109109 5/1983
GB 2234856 2/1991
HU P0000398 6/2000

| | | | |
|---|---|---|---|
| HU | 224329 | | 6/2003 |
| IT | 451949 | | 3/1949 |
| JP | 49-91096 | | 11/1947 |
| JP | 37-7592 | | 6/1959 |
| JP | 52-36813 | | 3/1977 |
| JP | 57-25092 | | 2/1982 |
| JP | 57-179618 | | 11/1982 |
| JP | 08-7462 | | 1/1996 |
| JP | 087462 | | 1/1996 |
| JP | 2000-305845 | | 11/2000 |
| JP | 2002149264 | A | 5/2002 |
| JP | 2004318426 | A | 11/2004 |
| JP | 2000-140948 | | 5/2005 |
| NO | 14095 | | 5/1905 |
| WO | WO86/00396 | A1 | 1/1986 |
| WO | WO93/15295 | A1 | 8/1993 |
| WO | WO95/10680 | A1 | 5/1995 |
| WO | WO96/07002 | A1 | 3/1996 |
| WO | WO9615347 | A1 | 5/1996 |
| WO | WO2008/051919 | A2 | 5/2008 |
| WO | WO2008/051930 | A2 | 5/2008 |
| WO | PCT2008067173 | A2 | 6/2008 |
| WO | WO2008/147818 | A1 | 12/2008 |
| WO | WO2009/026225 | A1 | 2/2009 |
| WO | WO2010/080402 | A1 | 7/2010 |
| WO | PCT201100108 | A1 | 3/2011 |

* cited by examiner

SPRING LOADED SECURITY SLOT ATTACHMENT FOR PORTABLE DEVICE SECURITY

RELATED APPLICATIONS

This application is a continuation-in-part ("CIP") of U.S. application Ser. No. 13/365,222 filed Feb. 2, 2012, which application is a continuation-in-part ("CIP") of U.S. application Ser. No. 13/031,174, filed Feb. 18, 2011, which application is a continuation-in-part ("CIP") of U.S. application Ser. No. 12/657,670, filed Jan. 25, 2010, which '670 application is a continuation-in-part (CIP) application of U.S. application Ser. No. 12/154,561, filed May 23, 2008 ('561 application), which '561 application is a CIP application of U.S. application Ser. No. 11/454,433, filed Jun. 16, 2006 ('433 application), which '433 application is a CIP application of U.S. application Ser. No. 11/359,871, filed Feb. 22, 2006 ('871 application), which '871 application is a CIP application that claims priority from a) U.S. Provisional Appln. No. 60/655,270, filed Feb. 22, 2005, b) Provisional Appln. No. 60/678,911, filed May 6, 2005 and c) U.S. application Ser. No. 11/038,591, filed Jan. 19, 2005 ('591 application), which '591 application claims priority from i) U.S. Appln. No. 60/569,561, filed May 10, 2004 and ii) Provisional Appln. No. 60/626,839, filed Nov. 10, 2004. The '433 application further claims priority from A) Provisional Appln. No. 60/691,476 filed Jun. 17, 2005, B) Provisional Appln. No. 60/725,333 filed Oct. 11, 2005, C) Provisional Appln. No. 60/757,737, filed Jan. 10, 2006, and D) Provisional Appln. No. 60/783,188, filed Mar. 16, 2006. These applications are incorporated by reference herein.

FIELD OF THE INVENTION

The present invention relates to security slot attachments to provide for the security of portable electronic devices, such as computers, laptops, notebooks and the like. The present invention also relates to a locking assembly for tablet computers (i.e. iPad®), smart phones, electronic books known as "e-readers", and other hand-held personal digital devices, as well as to plunger security locks, and to laptop computers, notebook computers and other hand-held electronic devices such as cell phones, personal digital assistants, personal music and/or video players (i.e. iPod®), etc., without limitation, which are configured for operational use with a locking assembly associated with such a plunger security lock.

BACKGROUND OF THE INVENTION

Portable devices such as computers or other similar equipment are often supplied with a small security slot in their housing to provide an attachment for a security cable anchored to an immovable object. It is advantageous for the attachment device in the slot to be easily removable when the security cable is no longer required. The slot is approximately 3 mm by 7 mm.

U.S. Pat. No. 6,317,936 of McDaid et al. describes a security anchor comprised of an internal member, an external member and a screw to lock the external member to the exterior of the equipment housing by engaging the internal member within the security slot. The internal member has an bent over end that fits inside the security slot with the screw loosened and then locks to one long edge of the security slot at the inside of the equipment housing when the screw is tightened. A screw driver is required to engage and disengage the security anchor.

U.S. Pat. No. 6,513,350 of Hurd et al. describes two different devices to provide attachment to the security slot. They both involve the insertion of a locking member slightly smaller than the slot dimensions shaped as a rectangle with rounded ends on the small dimension being aligned with the security slot, inserted, and then turned 90 degrees whereby its length would prevent its exit until rotated again into alignment. In the first embodiment, a partitioned cylinder with a locking member extending from the bottom on one half on a rod is first inserted into the security slot and rotated 90 degrees. The mating half of the cylinder with a protruding bar on the bottom is then mated with the first half with the bar end also entering the security slot. The geometry is such that in this configuration with two cylinder halves together, the cylinder cannot be rotated and is prevented from exiting the security hole. A cable threaded through two aligned transverse holes in the two halves will keep the attachment cylinder secured to the outer equipment housing around the security slot. The attachment cylinder which comprises two separate parts can again be removed from the security slot when the security cable is removed.

The preferred embodiment of the Hurd patent ('350) shows a specialized combination lock with a locking member at the distal end of an extended rod emanating from one end. A retaining member, also further down on the locking member rod senses the outer equipment housing wall after the locking member is rotated 90 degrees, and locking pins are engaged by retraction of the rod by the lock preventing the locking member from rotating back into alignment with the security slot thereby securing the combination lock to the equipment housing. The combination lock is attached to a security cable. Upon entering the proper combination, the rod at the end of the lock is again extended releasing it from the security slot.

U.S. Pat. No. 7,100,403 of Murray, Jr. Et al. describes a variety of cable-attached locks which engage the long ends of a security slot by distal engagement wings on arms which expand or are locked in a spread-apart configuration after they are compressed together for insertion. In addition, similar engagement of non-lock security slot attachment devices using resilient engagement fingers with side wings using screw or other mechanical locking methods are also illustrated. A lock with a rotating locking member on a rod is also described. After inserting by alignment through the security slot, the locking member is rotated 90 degrees after which two rods extend from the end of the lock into the distal ends of the security slot preventing rotation back into alignment of the locking member.

The prior art does not show a security slot engagement device that is inexpensive to manufacture, interfaces to a variety of locks or cables, has no separable parts, is easy to use, and requires no tools for installation or removal.

Additionally, notebook computers, tablet computers or other personal electronic devices are increasingly used by students at educational institutions. They are also used by workers at job sites. Notebook computers are often referred to as laptop computers, meaning a portable, foldable computer which can be used while positioned upon the user's lap. In some instances, "laptop computer" refers to the term used in the trade for an older version of a larger portable computer. However, with increasing streamlining and downsizing of portable computers, compact, smaller versions are referred to as "notebook computers", but the terms are generally interchangeable.

Personal electronic devices, such as tablet computers (i.e. iPad®), cell phones, smart phones, personal digital assistants, personal music and/or video players (i.e. iPod®), etc. without limitation, can be used just about anywhere. Other personal digital assistants, including electronic books, known as “e-readers”, such as the Nook®, can download virtual images of books.

In order to safeguard the personal electronic device, such as a tablet computer, a notebook computer, smart phone, e-reader or personal music and/or video player, it must be shut down, closed and transported by the user.

However, it is often advantageous for the user of a tablet computer, notebook computer or other personal electronic device to take a break and leave the device/computer open and operable at a work station, library study carrel, etc., with other papers and books left at their current open position. This leaves the personal electronic device, such as a tablet computer or notebook computer, vulnerable to theft.

Moreover, in the commercial retail environment, it is advantageous to display consumer electronic devices, such as tablet computers, notebook computers, cell phones or personal digital assistants in a secure but visually accessible display.

For that matter, various security devices are known for securing personal electronic devices configured for use with the known security devices.

For example, U.S. Pat. No. 6,755,056 of Igelmund (the ’056 patent), discloses a security device (e.g., male lock fitting 100) for securing portable equipment having a security slot in the chassis of the equipment, and adaptor for adapting electronic portable equipment without a slot for use with the security device. The security device (100, 100') is tethered to a piece of heavy furniture or otherwise immovable structure, typically with a braided cable or like means, and includes an attachment with a slot mating head and an axial movable head locking member. This is inserted into the slot in the housing of the electronic equipment (or in the adaptor affixed to the housing where there is no slot) after the slot mating head to prevent rotation and removal of the head from the slot.

For example, the FIG. 7 security device (100') is inserted into a lock fitting receptacle 106 where pin 104 passes through the head locking aperture 25 into mounting end 22 and into slot opening 12. When fully inserted, the housing lockably engages the fitting by way of conventional locking mechanisms, such as fixed or retractable teeth 108, 108' on the male lock fitting and teeth engaging notches 110 within the receptacle, so the pin is secured in the head locking position.

One of the shortcomings of the ’056 patent, however, is that the security provided is only as strong as either the housing material and therefore slot integrity, or the adhesive adhering the adaptor to the housing. A thin, sheet-metal housing is pliable and a plastic housing is frangible, allowing for easy removal of the attachment with slot mating head and axial moveable head locking member, once in place.

The aforementioned U.S. Pat. No. 6,513,350 of Hurd (the ’350 patent), discloses a physical security system comprising a combination lock for connecting specially designed security slots in portable electronic devices, such as a notebook computer. Like the ’056 patent, the security device of ’350 patent operates with a portable computer with a wall 10 having an inner surface 20, which wall is configured with a slot 15. A lock interface 25 is engageable with wall 10 through slot 15. A locking mechanism 30 comprising a tethering cable and lock 40 allows that, upon inserting lock interface 25 in slot 15 and engaging the interface with inner surface 20, the lock interface is then attached to a stationary object with lock 40 and cable 40.

FIG. 6 shows an alternative locking system 600, including a housing 605 and slot engagement member 610 with locking member 615 and retaining member 620. Engagement member 610 is coupled to the housing 605 so that it moves between an extended and retracted position. Two pins 625 extend from the housing 605 and are located on opposing sides of a shaft of engagement member 610. The housing 605 includes a combination lock mechanism 630 for interacting with the engagement member 610 and retaining in the retracted position until the correct combination coed is dialed in to the lock mechanism.

Also like the ’056 patent, however, the security provided by the ’350 patent is only as strong as the housing material and therefore slot integrity. Moreover, and as is readily apparent in FIG. 6, there does not appear to be a means for effecting retraction and extension of pins 625 to/from housing 605, or means for comfortably grasping the lock mechanism to articulate slot engagement member in the slot 660 in wall 650 (FIG. 6).

OBJECTS OF THE INVENTION

It is therefore an object of the present invention to provide a security slot attachment to provide security for portable or stationary electronic computing devices.

It is also an object of the present invention to provide a lock attachment for a portable electronic computing device which retrofits into a rectangular slot of the housing of the portable electronic computing device and which prevents theft thereof.

It is also therefore an object of the present invention to provide a locking assembly security apparatus for a non-foldable tablet computer, e-reader or smart phone preferably associated with a plunger-type security lock or other locking device, and an electronic device configured to be secured in cooperation with the locking assembly and plunger-type security lock, which overcome the shortcomings of the prior art.

Other objects which become apparent from the following description of the present invention.

SUMMARY OF THE INVENTION

The present invention is a security slot attachment device that is comprised of several major parts secured together by pins which permit movement among the parts to facilitate engagement with the security slot and removal therefrom, without the use of any tools. The parts themselves, typically four in number, can be machined of aluminum or stainless steel, molded from a wide variety of rigid plastic resins, die cast from zinc-aluminum alloys, or molded using a metal injection molding process.

In general, the lock of the present invention includes an assembly of a slot engaging member insertable in a slot of a piece of equipment being locked, such as a portable or desktop computer, a laptop, notebook or other handheld electronic device, a monitor, a television/video screen, a video game, an electronic instrument such as an oscillator or a medical centrifuge or other analytical device, or the like. The slot engaging member is lockable by a dual action rotation and pivoting of an anchor sub-assembly grasping the slot engaging member; whereby the slot engaging member is unlocked by a reverse dual action pivoting and rotation of the anchor sub-assembly for the slot engaging member; wherein the lock is locked without use of a tool.

For example, the lock assembly includes the rotatable locking member insertable within a slot in a housing of an electronic equipment. The rotatable locking member engages with the anchor sub-assembly having a rotatable element, where the rotatable element communicates with a pivotable member having a recess through which a further locking member is inserted, wherein said lock is locked without use of a tool.

In the embodiment with four major parts, there are a locking element, a guide, a pivot block, and a locking plate, arranged in an array in that sequential order. The locking element is a rod with an elongated locking end centrally attached to a distal end of the rod, forming a T-shape rod end, which is insertable and rotatable within a rectangular slot in the housings of portable or stationary computing devices. The guide is a generally flat substrate block having the same crossection as the elongated locking end at its front portion. The guide also has a central hole, and a top portion with extended wings. The pivot block is preferably a short rectangular shaped cylinder, preferably round shouldered, with a large hole to accept the free end of the locking rod therein, opposite to the T-shaped slot engaging end of the locking element, and small holes, such as two small holes, to accept fasteners, such as pins. The locking plate is preferably a thick rectangular plate with a large hole, such as, for example, a rectangular hole, in its center and a pair of two transverse holes in positional register for a pivoting pin or axle insertable therein, to permit pivoting of the pivot block within the large hole of the locking plate.

The assembly of the four parts is as follows. The guide part is engaged onto the rod of the locking element; and the central hole of the guide is sized to allow it to rotate freely. The free end of rod is then inserted into the snug large hole of the pivot block and the transverse hole near the end of the rod (now capturing the guide) is aligned with the small hole through the side of the pivot block at the large hole site. The rod and the pivot block are then rigidly attached by a small short force-fit pin. This anchor subassembly of three major parts is now attached to the locking plate by inserting the distal end of the pivot block into the large rectangular hole, aligning the transverse clearance hole with the force-fit holes in the locking plate and pushing the longer pin through the locking plate and the pivot block. The distal end of the large rectangular hole (away from the pivot block) is used for security attachments, such as the prong or other protruding element of a lock.

The size of the locking end of the rod and the distal portion of the guide is just slightly smaller than the dimensions of the rectangular security slot of the housing of the computing device, such as a laptop or other portable or fixed computing device. To attach the security slot attachment of this invention to the security hole, the locking end is aligned with the end of the guide and both are inserted through the security slot with the wings of the guide resting on the outside surface of the device housing. The locking plate is turned 90 degrees in its own plane, and then the locking plate is pivoted up 90 degrees so that the side of its pinned end now rests against one long side of the guide that protrudes from the housing. In that position, the locking plate and the attached locking end within the housing cannot be rotated and therefore are locked to the housing. Anything inserted through the protruding tang formed by the pivoted locking plate that will prevent it from pivoting back will keep the attachment secured to the housing. A cable, a properly sized loop of an ordinary padlock, or a specialty locking prong engaging the tang will suffice. To remove, the attachments are removed from the protruding tang, the locking plate is pivoted 90 degrees, rotated 90 degrees in its own plane, and the attachment is pulled out of the security hole.

An optional washer of compressive elastomer foam can be slipped onto the insertable portion of the guide for a snug locking feel which would also eliminate the possibility of buzzing or other noise induced by vibration. The elastomeric foam washer lies flattened somewhat between the winged portion of the guide and the equipment housing when attached.

In a preferred embodiment of the security slot attachment, two parts are modified. The pivot block has three corners rounded for a better operational fit. Also, the guide has one long side of the winged portion (which sits above the housing when attached) made wider. The locking plate can only lock against the other narrow side in the new embodiment. This change enhances security because it denies access to both sides of the security slot (for malicious prying with a tool) when the attachment is installed.

In another embodiment, the invention comprises a locking bar associated with a plunger-type or other security lock comprising a cradle including at least one diagonally extending chassis bar with respective pockets at opposite ends, wherein one of the pockets is hingeably releasable to insert one corner of the tablet computer, smart phone, e-reader, or other hand held personal digital assistant device therein while the other end is a non-hingable pocket into which the opposite corner of the tablet computer, smart phone, e-reader or other hand held personal digital assistant is inserted therein. The hingeable pocket includes a hingable housing which pivots to allow insertion of one corner of the device to be inserted therein, after the opposite corner has already been inserted in the slot of the fixed, non-hingable pocket at the opposite side of the at least one chassis bar. The chassis bar is preferably adjustable in length, to allow for different sized devices to be locked therewith. Although there is preferably one diagonal chassis bar with opposite corner pockets to receive one of respective diagonally opposed corners of the device, it is contemplated that more than one chassis bar can be utilized, and/or comprise a frame with at least a pair of pockets each pocket supporting a respective corner of the device therein. One end of the chassis bar is configured as an axially extending flange with an aperture hole, which flange is insertable within a corresponding slot in lock having a movable pin or hook of a combination lock and locking mechanism in a housing.

For example, in a preferred embodiment, the security apparatus of this invention is designed to engage diagonal corners of an electronic tablet (such as an iPad®. The locking assembly apparatus engages with a tablet computer or similar device, which is securely locked to it via a combination pin lock, such as, for example, a plunger lock. A respective distal corner pocket engages one corner of the tablet computer, while a respective proximal lockable corner pocket engages the diagonally opposite corner of the tablet computer. The security apparatus includes a chassis bar, such as a flat metal chassis bar connecting the fixed distal pocket to the diagonally opposite proximal hingable pocket.

The base of the proximal pocket extends from the attachment portion to the diagonally extending chassis bar to the flanges at the proximal end on the other side of the integral hinge pin housing of the proximal pocket, which flips up to permit a corner of the tablet computer or other device to be inserted or disengaged. The hingable tail section of the flange fits between the forked flange protrusions of the base of the proximal hingable pocket; when it is co-planar with the base and the slot of the pin lock can be fit over the end and locked by its pin engaging the hole within the hingable tail section of the hingable pocket, to complete the locking procedure.

Although a pre-determined sized security apparatus can be provided for the size most popular tablets or similar devices on the market, an adjustable single unit can also be provided as an alternate embodiment. In one embodiment, the adjustability feature is formed by permitting the metal chassis bar to slide through a slot in a modified distal pocket. An array of holes in the chassis provides the adjustability by virtue of a friction fit removable locking pin The pin cannot be taken out once the tablet computer is engaged, but it is simply lifted up for adjustment to permit the pocket to slide on the bar.

Another adjustable embodiment uses a two-part telescoping metal chassis bar. This embodiment is more compact for smaller tablets or like items since there is no distal metal bar extending beyond the distal engagement pocket.

While any kind of plunger type pin lock having a slot and movable pin or hook can be utilized, in another embodiment a connector is provided connecting permanently connecting the locking housing to a tether, a plunger operational in cooperation with locking mechanism and a sliding key operate to lock the tether to a one end of a locking strip, which end extend part way through the electronic device. The other end of the locking strip comprises wedge stop, to prevent the locking strip from passing all the way through the housing, for example, a hinge gap between upper and lower housings.

The plunger-type security lock preferably operates by grasping the housing, dialing in a correct combination and pushing the plunger through the hole associated with one of the pockets. In another embodiment the plunger is pushed to extend the sliding key from a housing in order to engage a portion of the locking member. Once engaged, and upon release of the pushing force, the sliding key retracts the engaged portion of the locking member at least partially into the housing, and maintains it until the combination locking mechanism is unlocked.

In another embodiment, the invention comprises an electronic device configured for allowing a locking member to pass partially through, but not completely through some part of the electronic device chassis or housing, a locking member and a plunger-type security lock configured for lockingly engaging some part of the locking member once passed through the chassis or housing part.

When locked in place, the notebook computer or other personal electronic device is secure from being taken away from the surface to which it is locked. Furthermore, taking advantage of software and/or software/biometric security systems, the computer or other personal electronic device will also be unusable by unauthorized individuals when its owner is away from the area for a break, telephone call, or other short-term pursuits. With a few keystrokes, the owner of the computer or other personal electronic device can resume activity in exactly the same place as when activity had been suspended. This is especially useful for leaving an active computer or other personal electronic device on a study desk or library carrel.

In an alternate embodiment, a security slot attachment locking device incorporates a compression spring to facilitate easy attachment and detachment of the locking device from the object being locked, such as, for example, a portable computer or other portable electronics device having an elongated security slot in its housing. The locking device includes a tang support, such as, for example, preferably a flat plate element which has an engagement tang at the forward end, with a hole at an opposite end of the tang support plate for insertion of a coupling lock or for cable access for locking adjacent the rear distal end of the flat plate element, and a central elongated access hole for engaging the compression spring, all fitting within a housing, such as, for example, a clamshell housing.

A coupling lock engageable with the security slot attachment may be, for example, a combination lock, a padlock with a U-shaped shackle, a protruding lock with a rod or plate, a lock with a slot insertable movable tang, a plunger lock, or any other portable lock known to those skilled in the art of locking portable devices.

The clamshell housing of the security slot attachment preferably has two protruding front extensions on either side of the flat plate engagement tang. The engagement tang fits through the security slot of the device being locked, when aligned so that its width fits through the length of the security slot, and the plate then necks down so that the neck portion can be rotated within the security slot.

In operation, the back end of the flat plate is pushed forward so that the plate slides forward within the clamshell housing against spring force, thereby pushing the front tang forward beyond the adjacent protruding extensions exposing the neck. In this position, the tang is inserted within the security slot and then rotated 90 degrees in either direction such that the tang ends engage the inside surface of the device housing, above and below the security slot of the device being locked. The rear force is then released, permitting the spring to withdraw the tang inward and drive the two housing extensions inside the security slot on either side of the now locked tang. The hole near the distal end of the tang support plate in now exposed at the rear since it protrudes rearward from the housing end. A coupling lock or a secure cable engaging through this hole will prevent the tang support plate from being moved forward within the housing thereby locking it to the device housing.

To remove the security slot attachment device of the alternate embodiment, the coupling lock or cable is removed from the distal hole and this back end of the tang support plate is again pushed forward against spring force. The attachment is then rotated 90 degrees in either direction and just withdrawn from the security slot of the device.

This embodiment has ergonomic features which enhance usability. It is more intuitive in operation as it provides finger grasping wings to facilitate pushing on the rear of the plate. The spring also holds the attachment device snugly against the device housing, thereby facilitating the use of both hands (if desired) to attach or remove the cable or coupling lock.

BRIEF DESCRIPTION OF THE DRAWINGS

The present invention can best be understood in connection with the accompanying drawings. It is noted that the invention is not limited to the precise embodiments shown in drawings, in which.

DETAILED DESCRIPTION OF THE INVENTION

Figure 1:
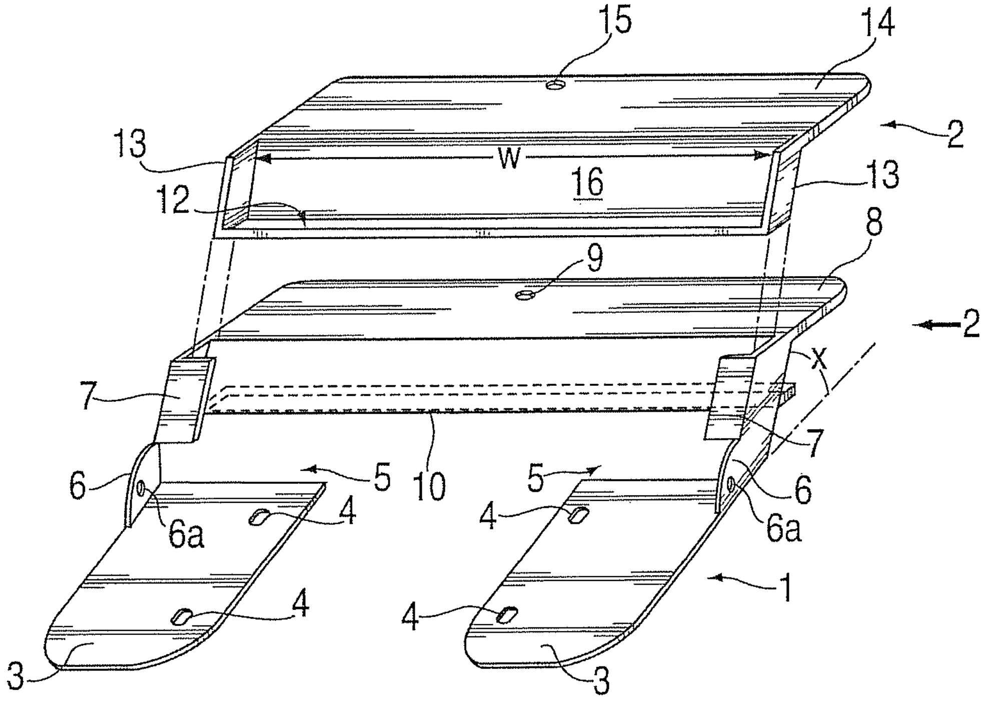
FIG. 1 is a perspective view of a locking base and locking collar of one of the embodiments for a notebook computer lock of this invention.

FIG. 1 shows locking base 1 for a notebook computer lock, which is secured to a working surface by fastener holes, such as screw through holes 4 in base mounting pads 3. A back surface 10 is tilted at angle "X" to provide a good viewing angle of the computer screen. Side panel members 6 with bent tabs 7 provide a space for sliding locking collar 2. Locking flange 8 with a locking hole, such as padlock hole 9, is used to secure locking collar 2 with flange 14 via hole 15, which is in positional registration with hole 9 when mated. Width "W" is wider than the widest notebook computer or other personal electronic device to be accommodated by this locking base system. Locking bar 12, attached to the distal ends of sides 13, actually secures the notebook computer or other personal electronic device. This is the preferred embodiment. The display screen portion rests within space 16 between sides 13. In use, the keyboard portion of a notebook computer or other personal electronic device would deny access to the fasteners, such as retaining screws, in holes 4.

Side panel members 6 may have one or more ports 6*a* to accommodate computer cables therethrough.

Figure 2:
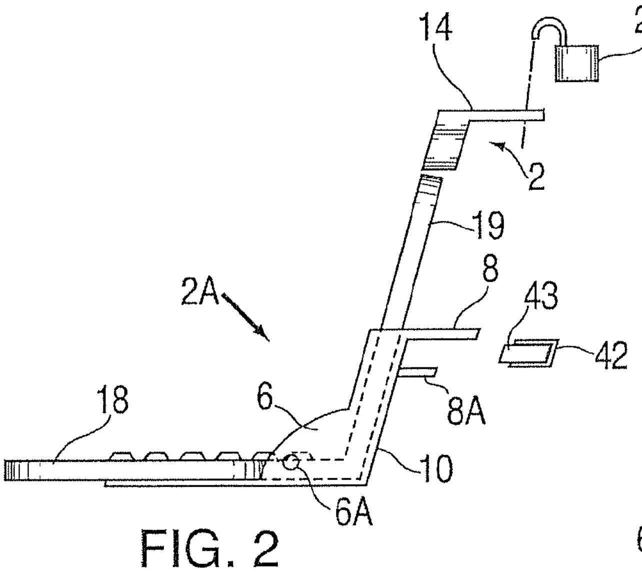
FIG. 2 is a side view of the embodiment of FIG. 1, taken along in the direction of arrow "2" of FIG. 1, showing a typical notebook computer locked with a locking base and locking collar to a work surface with a padlock.
Figure 2A:
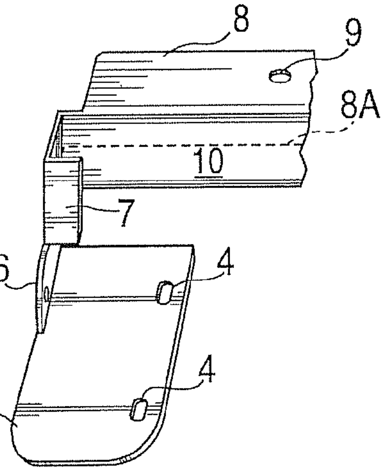
FIG. 2A is a partial fragmentary view of the locking base as in FIG. 2, taken along in the direction of arrow "2A" of FIG. 2.
Figure 2B:
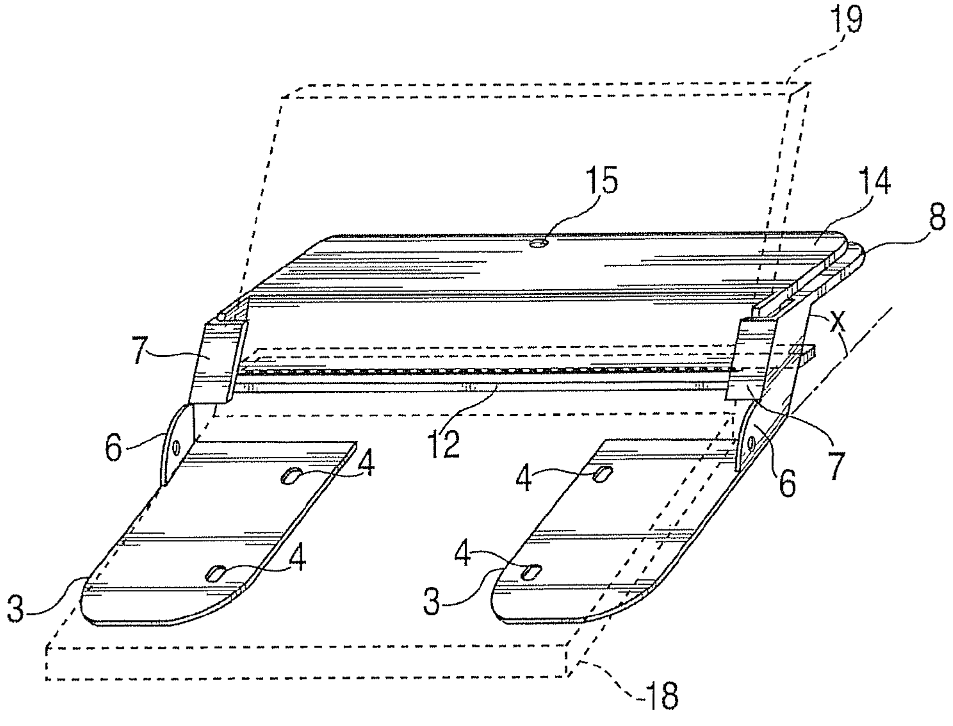
FIG. 2B is a partial perspective view of the typical notebook computer locked in place between the locking base and locking collar of FIG. 2.
Figure 2C:
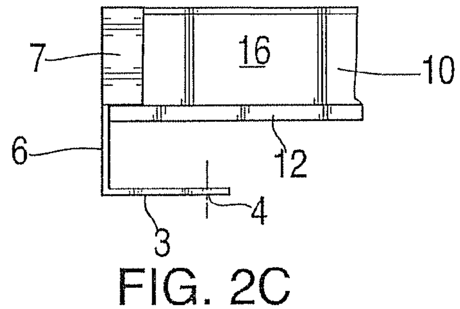
FIG. 2C is a partial front elevational view of the locking base and locking collar as in FIG. 2.

FIGS. 2, 2A, 2B and 2C show how locking collar 2 is placed over notebook computer screen 19 and then upon flange 14, and is locked to lower flange 8 via a lock, such as padlock 20. Keyboard 18 fits between sides 6. Space 5 is created by a raised back panel 10 so as to permit access to a variety of connectors at the back of computer keyboard portion 18. FIG. 2 also shows an optional compartment 42 for a power source accessory 43, such as an auxiliary battery charger or battery eliminator, wherein compartment 42 extends between power flange 8 and further lower flange 8A.

Figure 3:
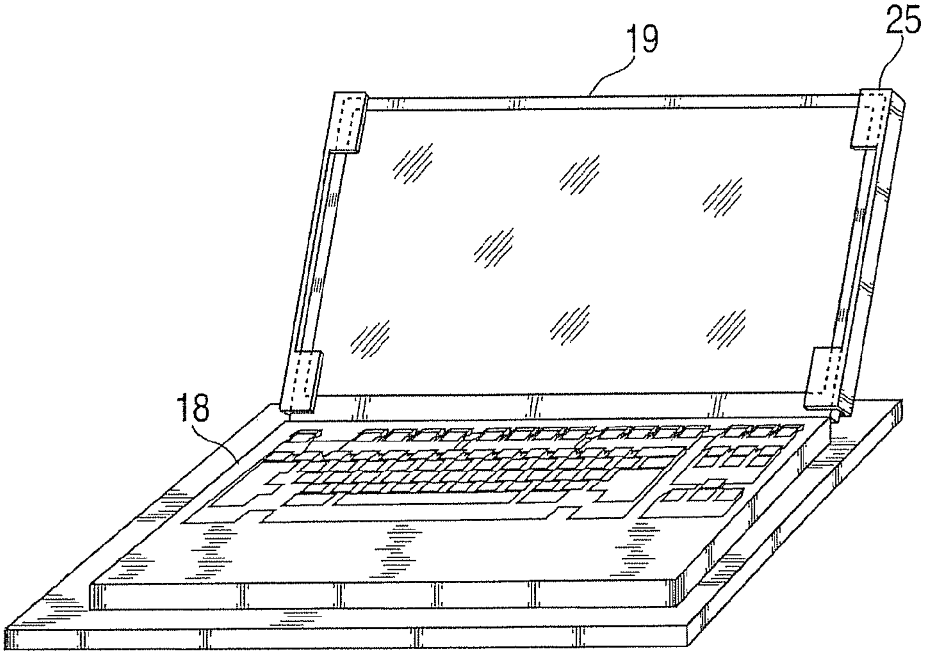
FIG. 3 is a perspective view of an alternate embodiment showing a typical notebook computer in the locking base with an elongated back side.
Figure 2D:
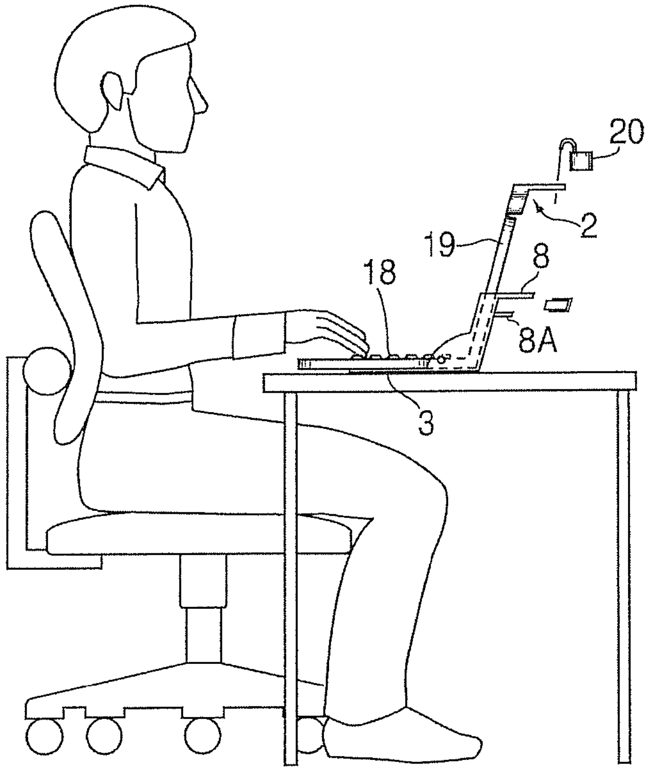
FIG. 2D is a side elevational view of the notebook computer shown used by a person at a work station.
Figure 3B:
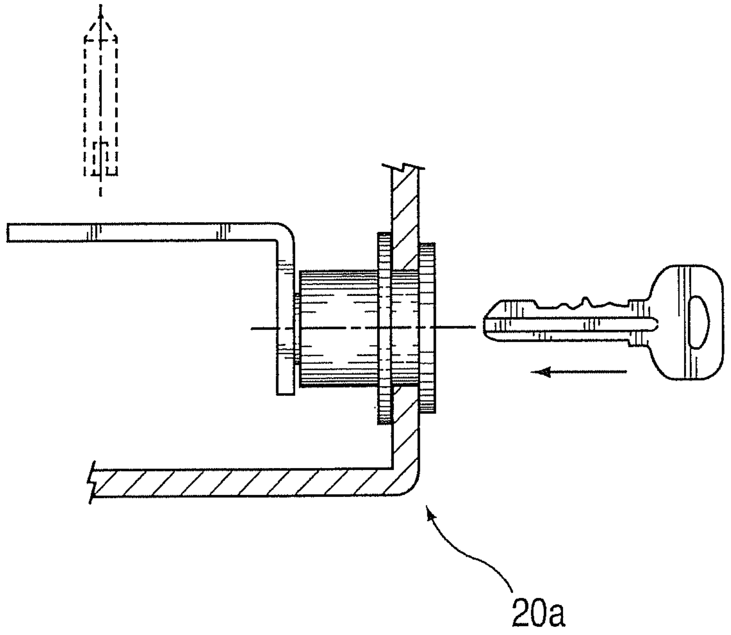
FIG. 3B is a close-up of one type of key lock used with the notebook computer lock of the present invention.
Figure 4:
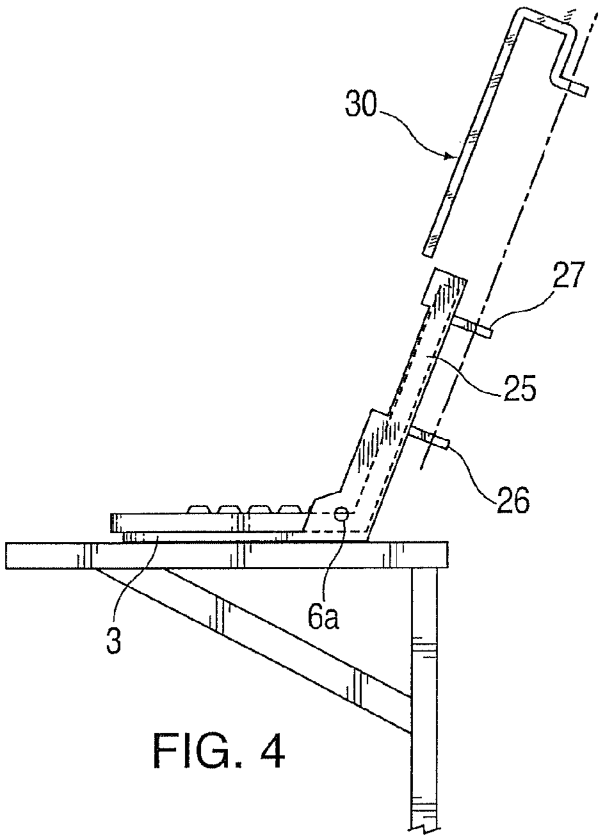
FIG. 4 is a side view of alternate embodiment for a notebook computer lock of FIG. 3, showing dual locking flanges.
Figure 6:
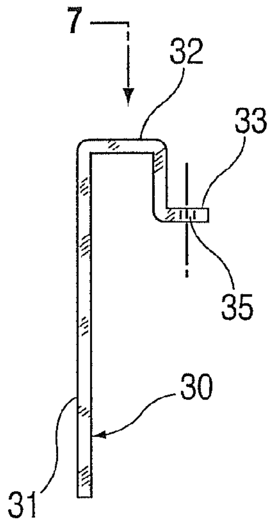
FIG. 6 is a side edge view of the transparent locking panel showing a locking flange, taken along in the direction of arrow "6" of FIG. 5.

FIG. 2D shows the notebook computer being used by a person at a work station;

In an alternate embodiment shown in FIG. 3, upright portion 25 supports the entire height of screen 19 above raised back panel 10 mounted upon base pads 3. This can also be shown in FIG. 4. FIG. 3B shows another example of a lock 20*a*, which can be used in lieu of padlock 20.

Figure 3A:
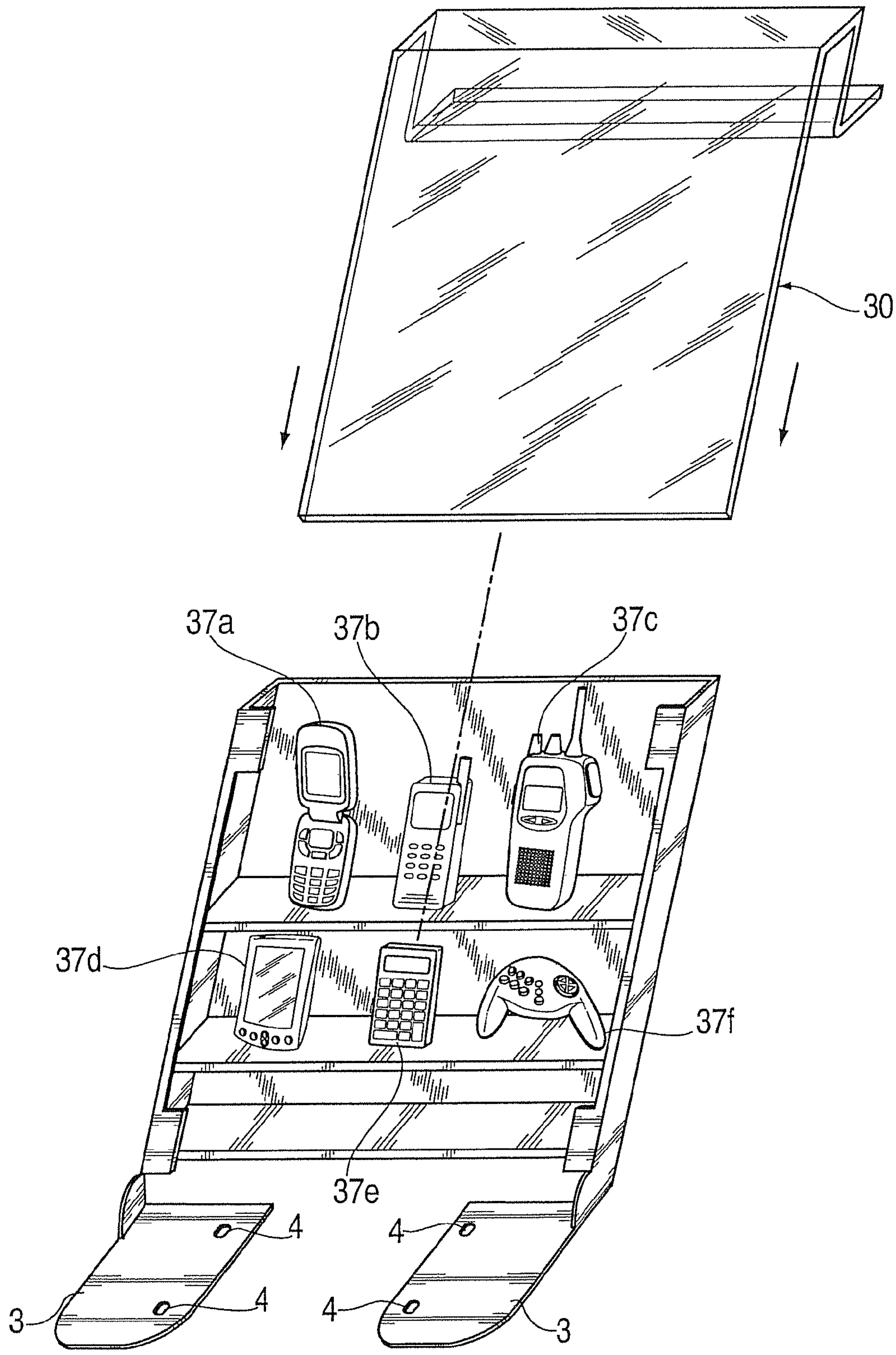
FIG. 3A is an exploded perspective view of a further embodiment, showing handheld electronic accessories displayed upon respective shelves, added to the front side of the locking base of FIG. 3.

FIG. 3A shows a further alternate embodiment where shelves 36 and 36*a* are depicted supporting electronic handheld devices such as folding cell phone 37*a*, upright cell phone 37*b*, marine VHF radio 37*c*, personal digital assistant 37*d*, calculator 37*e* and video game pad controller 37*f*.

Figure 5:
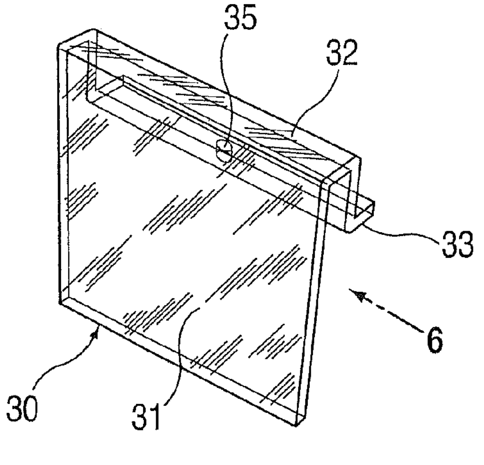
FIG. 5 is a perspective view of a transparent locking panel of the alternate embodiment shown in FIG. 4.
Figure 7:
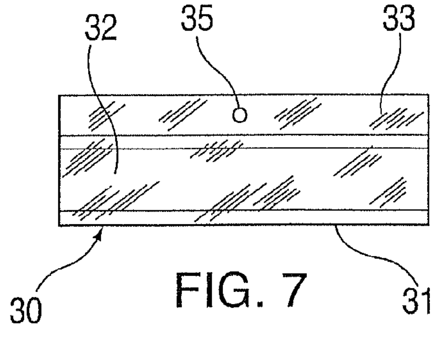
FIG. 7 is a top plan view of the transparent locking panel showing a padlock hole in the locking flange, taken along in the direction of arrow "7" of FIG. 6.

A transparent panel, such as LEXAN® polycarbonate panel 30, shown in FIG. 5, is used as a locking frame, by sliding it over screen 19 within the four tabs shown in FIG. 3 at the distal corners of upright 25.

Panel 30, shown in FIGS. 4-7, has a top portion 32 and a locking flange 33 with padlock hole 35. In use, this hole is in positional registration with that of upper locking flange 27 shown in FIG. 4. A padlock 20 or other small lock 20*a* can be used to secure the two members together. Front face 31 of transparent panel 30 protects the surface of computer screen 19. This can be used to advantage in a retail demo environment. Alternately, the locking collar of FIG. 1 can be used with base of FIG. 3 by locking into lower locking tab 26; this would offer a better unencumbered view of screen 19.

Figure 8:
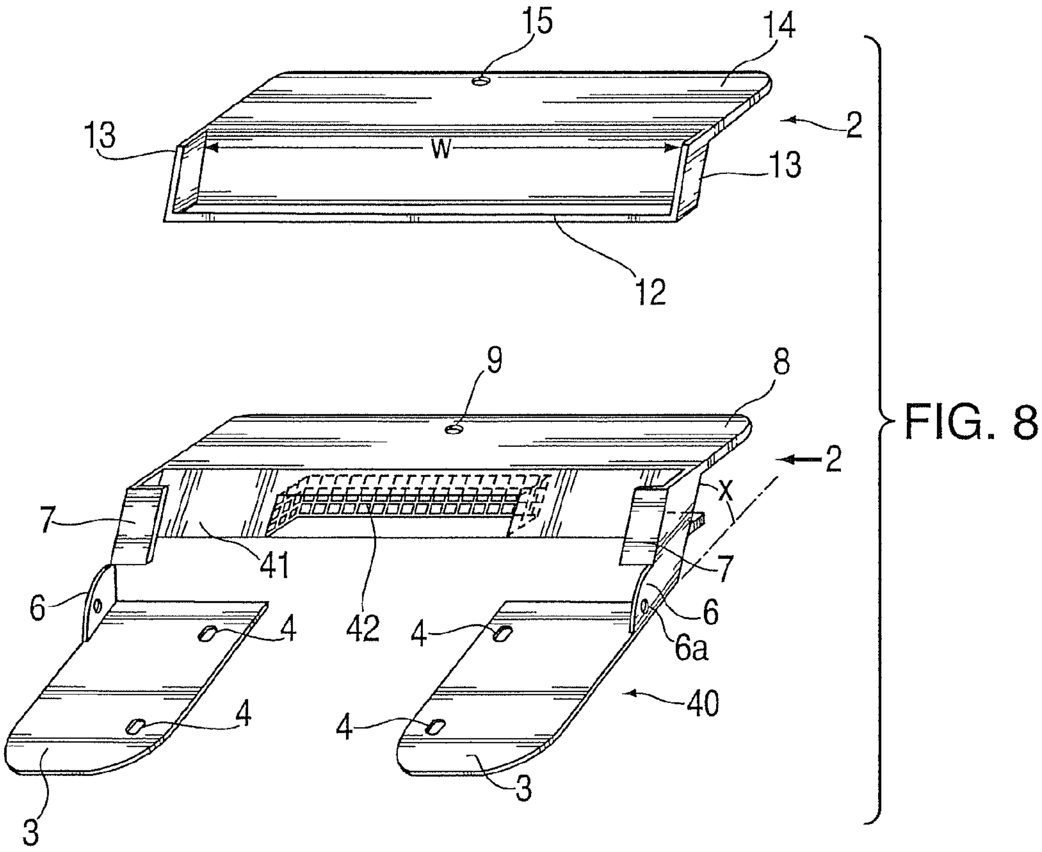
FIG. 8 is an exploded perspective view showing the addition of an optional battery pack housing cage feature to the locking apparatus of the embodiment shown in FIG. 1, although it can be used with any of the embodiments herein.

FIG. 8 shows the addition of an optional battery pack housing cage 42 feature to the locking apparatus of the embodiment shown in FIG. 1, although it can be used with any of the embodiments herein;

The optional power source component 42 of FIGS. 2 and 8 can be added to any of the embodiments of this invention, including those shown in FIGS. 3-51. It is preferably a cage made of heavy duty wire screen or perforated metal that is attached (as by welding or rivets) to a rear panel, such as panel 41 in FIG. 8. This provides a secure compartment 42 for a power source accessory 43, such as an auxiliary battery, charger, or battery eliminator.

Figure 9:
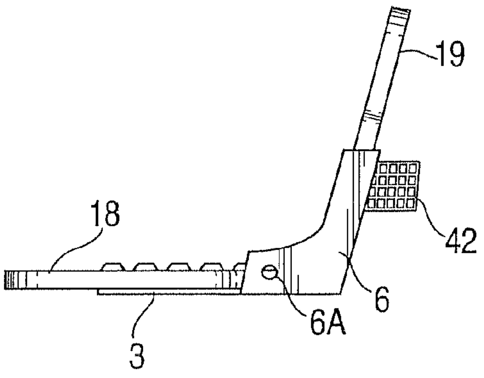
FIG. 9 is a side view of the locking apparatus of FIG. 8 used on a notebook computer showing the housing cage feature.

Compartment 42 is also shown in the side view of FIG. 9.

Figure 10:
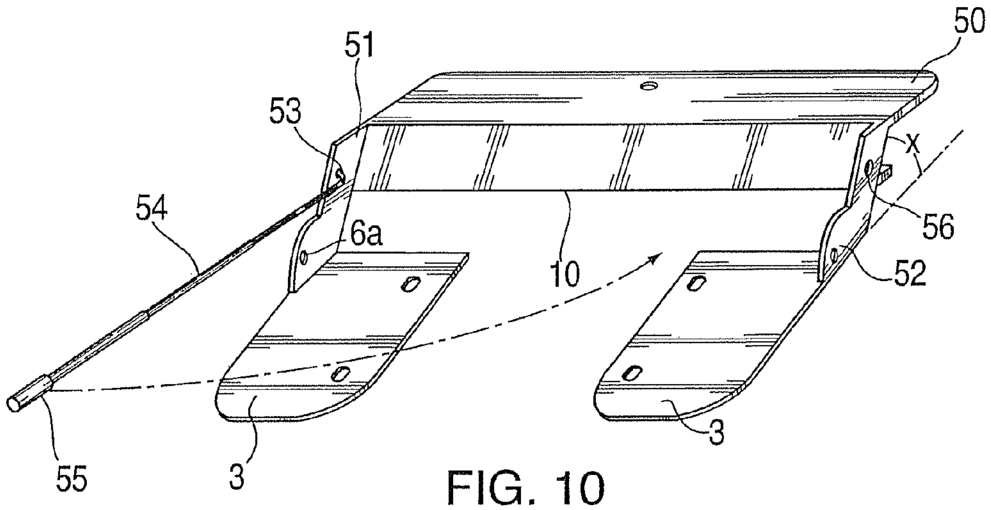
FIG. 10 is a perspective view of a further alternate swing arm embodiment using a swinging arm, such as a telescoping bar, to secure a typical notebook computer.

In a further alternate embodiment, shown in FIG. 10, a locking base using a telescoping rod 54 is shown. In this embodiment, there is no member such as locking collar 2 or transparent panel 30 that can be readily removed from the locking base when a computer or other personal electronic device is not secured to the base. This should reduce the incidence of vandalism or theft of the removable item which would render the base unusable. In FIG. 10, one end of bar 54 is attached to the left side panel member 51 of base 50 via a pivotable fastener, such as ball joint 53. After the notebook computer or other personal electronic device is inserted between sides 51 and 52, bar 54 is swung over the lower (hinge) portion of the notebook computer's screen, such as a liquid crystal display (LCD) screen and is elongated so as to insert lock plug 55 through locking hole 56 in right side 52. A lock (not shown), such as padlock 20, is then inserted through the hole in plug 55 thus locking computer to base.

Figure 11:
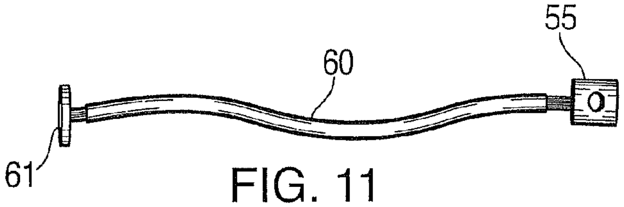
FIG. 11 is a top plan view of a clad steel cable used as a locking element for the further alternate swinging arm embodiment.
Figure 12:
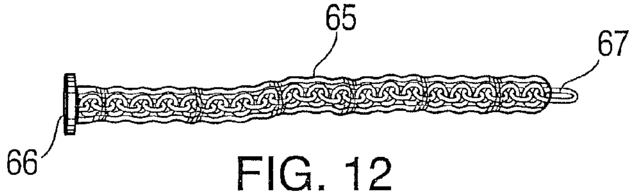
FIG. 12 is a top plan view of a chain inside a flexible tube as an alternate locking element in the embodiment of FIG. 10.

Alternate locking members include locking members such as vinyl clad steel cable 60 shown in FIG. 11, and the flexible tubing clad chain 65 shown in FIG. 12. These two devices do not require a ball joint attachment to left flange 51. Cable 60 can be simply inserted through a hole in flange 51 and then retaining washer 61 can be permanently attached as by spot welding. Lock plug 55, used as for telescoping rod, is attached to the distal end of cable 60. Chain 65 can be attached to flange 51 in a similar fashion by attaching washer 66 to its proximal end after threading through a hole. The distal end of chain 65 has an elongated link 67 with stop washer attached. The padlock is engaged through this link after it emerges through hole 56 in side 52.

Figure 13:
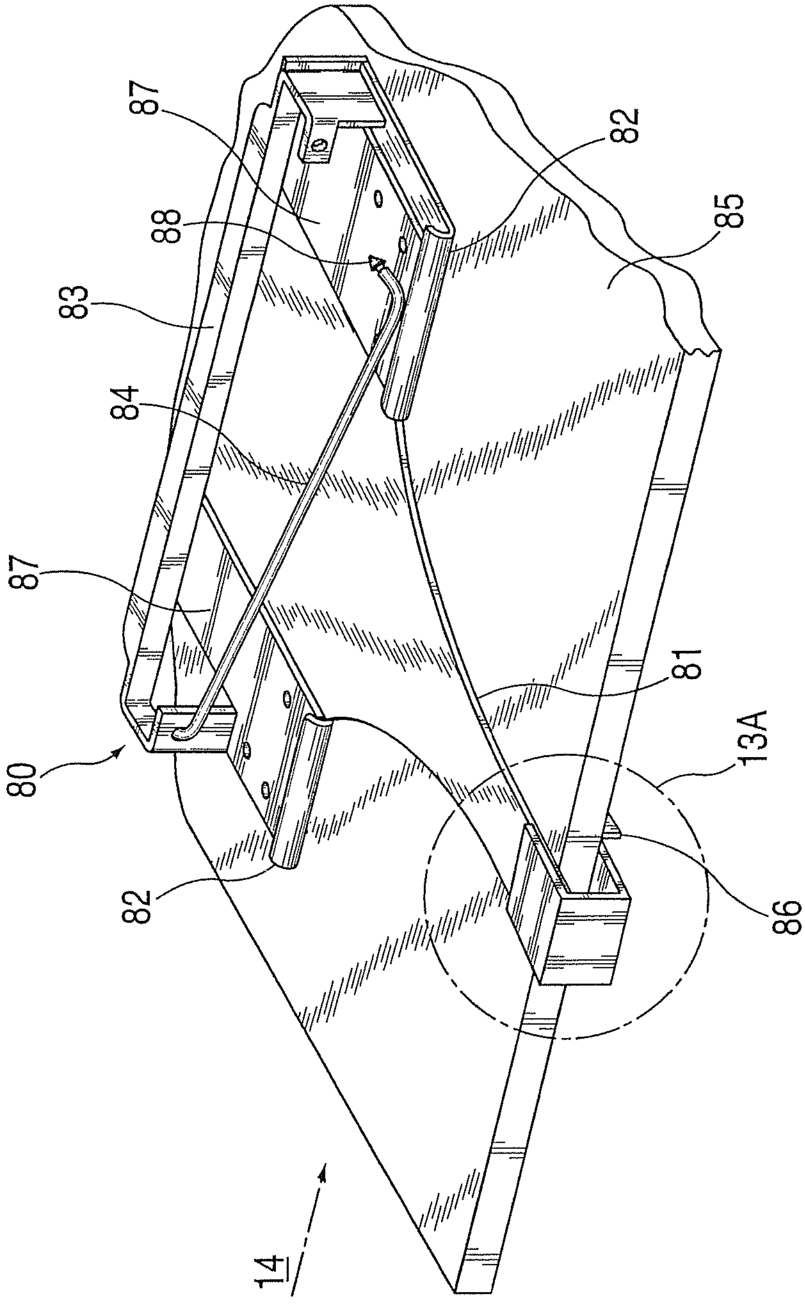
FIG. 13 is a perspective view of an alternate embodiment of a notebook computer lock using a separate "over the table" locking base and a computer lock using a captive swinging locking bar, which fits across lower portion of the display.
Figure 14:
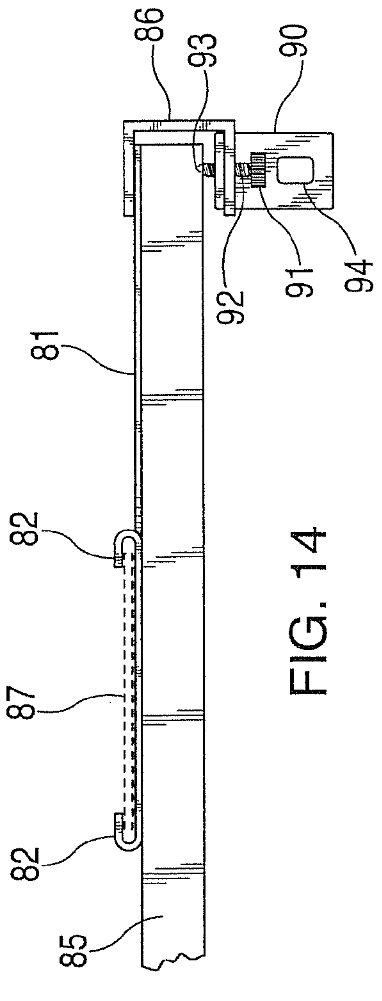
FIG. 14 is a side edge view of the locking base of FIG. 13, shown attached to a work surface.

FIG. 13 shows an alternate embodiment using a separate locking base 81 used with a notebook computer or other personal electronic device lock 80 which slides in from the left so that one or more base pads 87 are retained by one or more brackets 82 on base 81. FIGS. 13 and 14 also show a clamp 86 which secures the lock in place by clamping the lock over a working surface, such as a table top 85:

A better view of this is the side edge view of FIG. 14. Clamp 86 slips over the edge of work surface 85. Locking bar 84 is captive in left bracket of computer or other personal electronic device lock 80, but it can swing out to permit access of computer or other personal electronic device display. The distal end 88 is grooved to accommodate a key lock to secure the computer or other personal electronic device as well as lock 80 to base 81. The long neck portion of base 81 from clamp 86 to brackets 82 positions the computer or other personal electronic device at a convenient distance from the front edge of table working surface 85. The detail of clamp 86 in FIG. 13A shows how screw 92 with optional security head 91 is screwed into the bottom surface of table working surface 85 via pointed end 93.

Figure 13B:
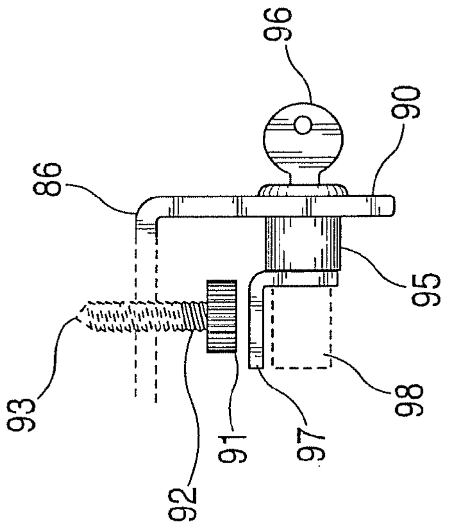
FIG. 13B is a clamp bracket side elevational view thereof, showing use of a key lock.
Figure 13A:
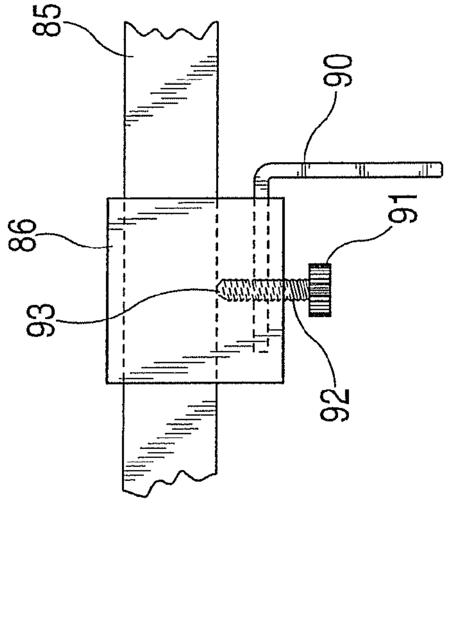
FIG. 13A is a front elevation of a clamp detail of the locking base shown in FIG. 13, taken along the ellipse 13A of FIG. 13.

FIG. 13B shows how tang 97 prevents screw 91 from being loosened when lock 95 is locked via key 96. Lock 95 can be easily removed from hole 94 in lock bracket 90. When tang 97 is turned to position 98, screw head 91 is not obstructed so that it can be removed or tightened.

Figure 15:
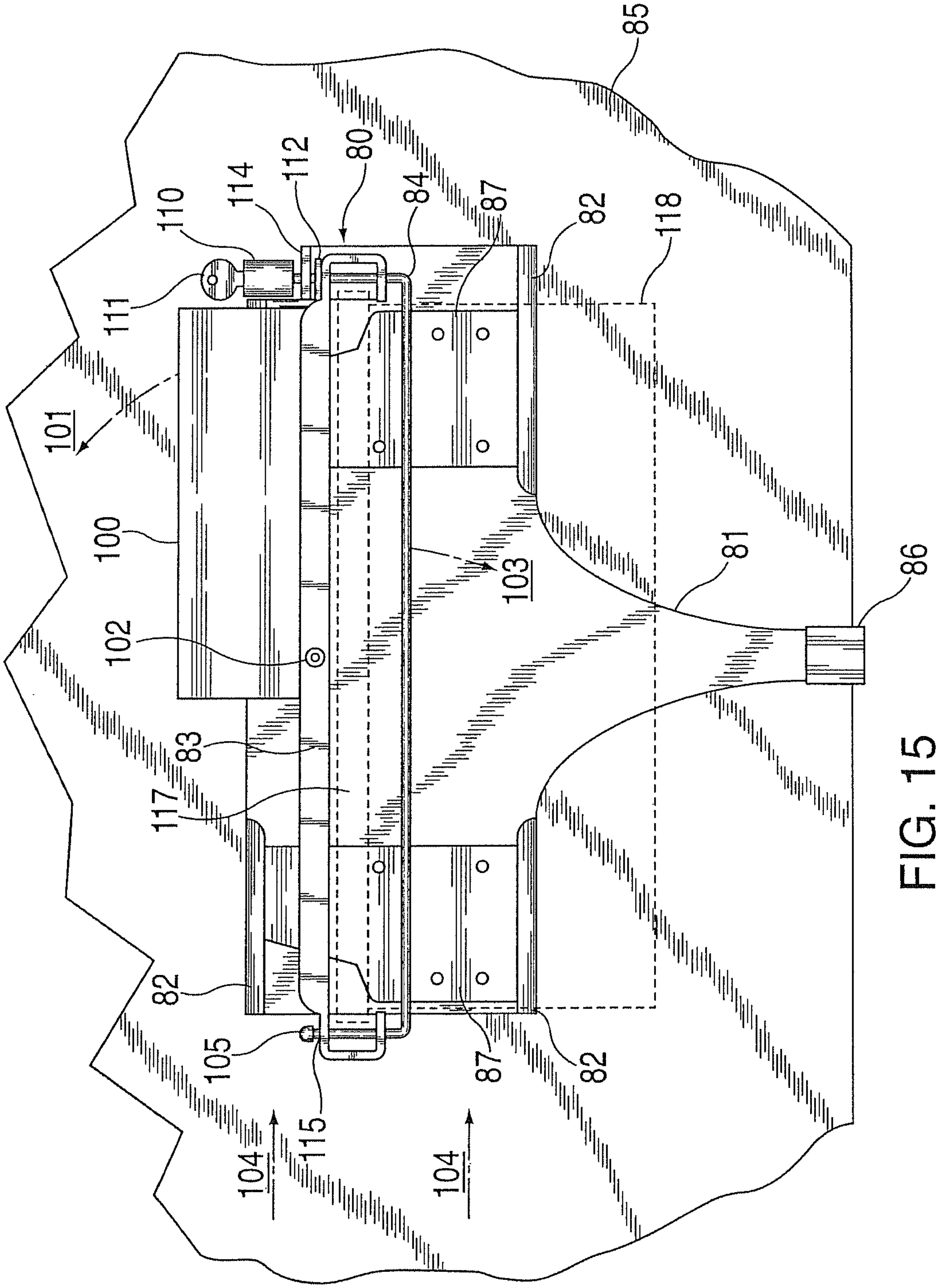
FIG. 15 is a top plan view of the computer lock of FIG. 13, secured within a locking base, also showing the position of the notebook computer with dashed lines.

FIG. 15 is a top plan view showing details of notebook computer or other personal electronic device lock 80 locked to base 81 with a computer or other personal electronic device display shown in dashed lines in position 117 and keyboard shown in dashed lines in position 118. Power supply box 100 can pivot open in the direction of arrow 101 on shaft 102 with a retaining cap; it is locked via tang 112. Notebook computer or other personal electronic device lock 80 is slid into a captive position within brackets 82 retaining the edges of base plates 87 in the direction of arrow 104. The left end of swinging locking bar 84 (which can swing out in the direction of arrow 103) is retained via retaining cap 105 within slotted hole 115 and an oversize hole on front of the left bracket. Key lock 110 grasps rod end 88 of swinging locking bar 84, which maintains the security of the assemblage via bracket tang 114, which is part of locking base 81. Key 111 can be used to remove the lock body from the end of swinging locking bar 84.

While FIG. 13-15 shows a separate over the table locking base 81 used with a notebook computer or other personal electronic device lock 80 which slides in from the left so that base pads 87 are retained by brackets 82 on base 81 of notebook computer or other personal electronic device lock 80, it is contemplated that a further alternate embodiment includes attaching notebook computer or other personal electronic device lock 80 directly to a work surface 85, such as a study desk, by providing fastener receptacles within base pads 87, wherein fasteners, such as screws or bolts fasten base 81 directly to an upper side of the work surface 85, without the use of over the table base 81.

Figure 16:
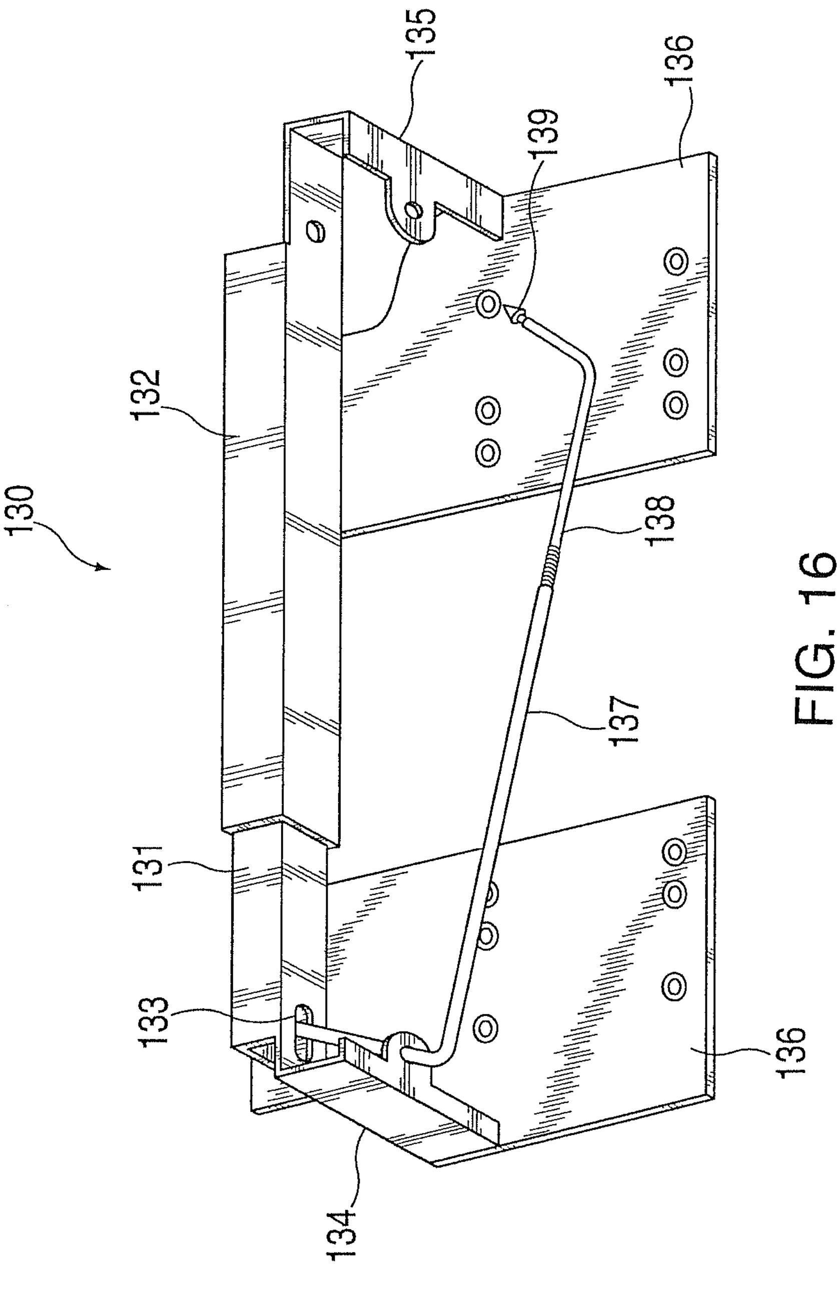
FIG. 16 is a perspective view of one embodiment for a width adjustable notebook computer lock.

FIG. 16 shows another embodiment of a notebook computer or other personal electronic device lock 130 with a telescoping width adjusting feature to accommodate computer or other personal electronic devices of varying widths more securely. Base pads 136 are compatible with the use of locking base 81 of the previous embodiment to retain this continuous adjustment feature. Locking bar portions 137 and 138 are adjustable in size.

Figure 17:
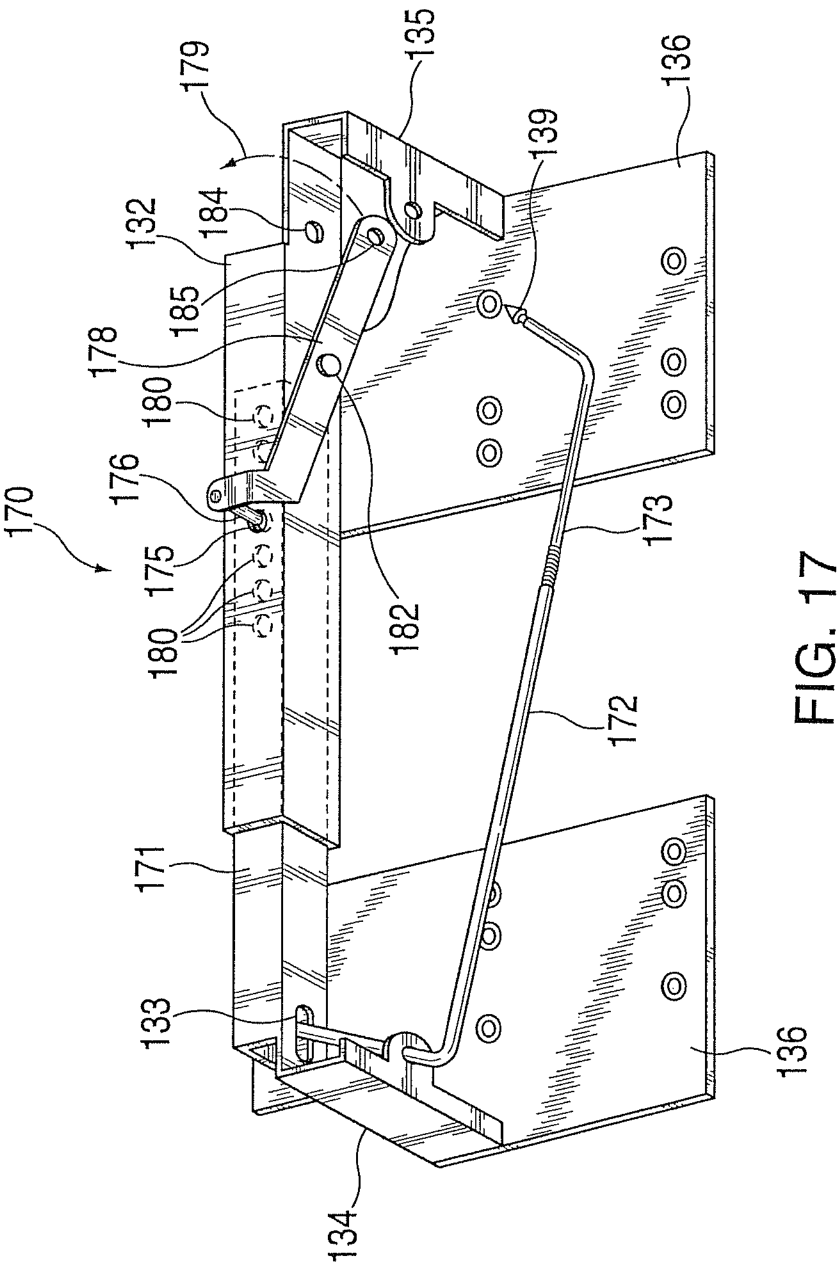
FIG. 17 is a perspective view of a further embodiment for a discrete width adjustable notebook computer lock.

For example, as in FIG. 17, incrementally spaced detents or pins and holes may be used to facilitate width adjustment.

Alternatively, as in FIG. 16, locking bar 137 may be hollow and threaded with a coarse thread; it is captive within left bracket 134 and slotted back hole 133. Right section of locking bar 138 is screwed into portion 137 and can be quickly length adjusted by twisting it clockwise or counter-clockwise. Horizontal section 131 fits into section 132 in a telescoping fashion. After the notebook or laptop computer or other personal electronic device display is placed between the spread-apart brackets, the brackets are pushed against its sides and swinging locking bar portions 137 and 138 are adjusted accordingly to fit into holes in right bracket 135 for locking.

FIG. 17 shows a different width adjustable computer or other personal electronic device lock 170 with a discrete locking mechanism including pivoted flange 178 with peg 176 at its distal end. Flange 178 is pivoted on pivot 182, such as a rivet, attached to outer telescoping member 132 of notebook computer or other personal electronic device lock 170. When swung in the direction of arrow 179, flange 178 will force peg 176 through hole 175 in telescoping section 132 and further into one of the holes 180 in inner telescoping member 171 when in positional registration. Flange 178 is locked in position when hole 185 is in positional registration with hole 184 and locking bar 173 end 139 is passed through both. The swinging locking bar includes hollow side section 172 and inner, preferably solid, side section 173, which is telescopic within outer hollow side section 172.

Figure 18:
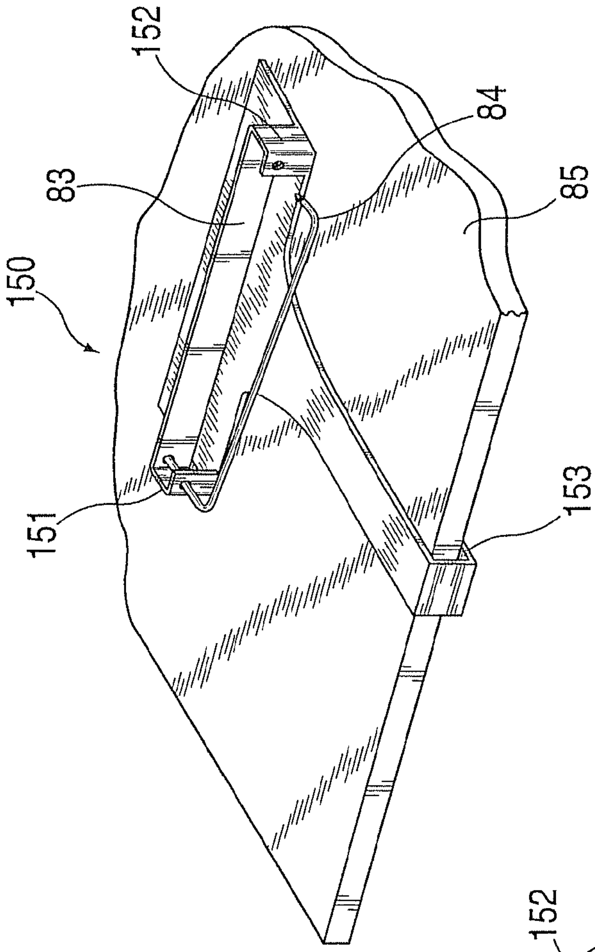
FIG. 18 is a perspective view of an integrated locking base/computer lock embodiment.

FIG. 18 shows another embodiment 150 of this invention wherein the locking base has been integrated with the notebook computer or other personal electronic device lock. Clamp 153 locks onto work surface 85 as described in a previous embodiment with a separate locking base 81 (see FIGS. 13-14). Upright brackets 151 and 152 with bar 83 between capture the notebook computer or other personal electronic device display which is then locked via swinging locking bar 84 and a key lock (not shown).

Figure 19:
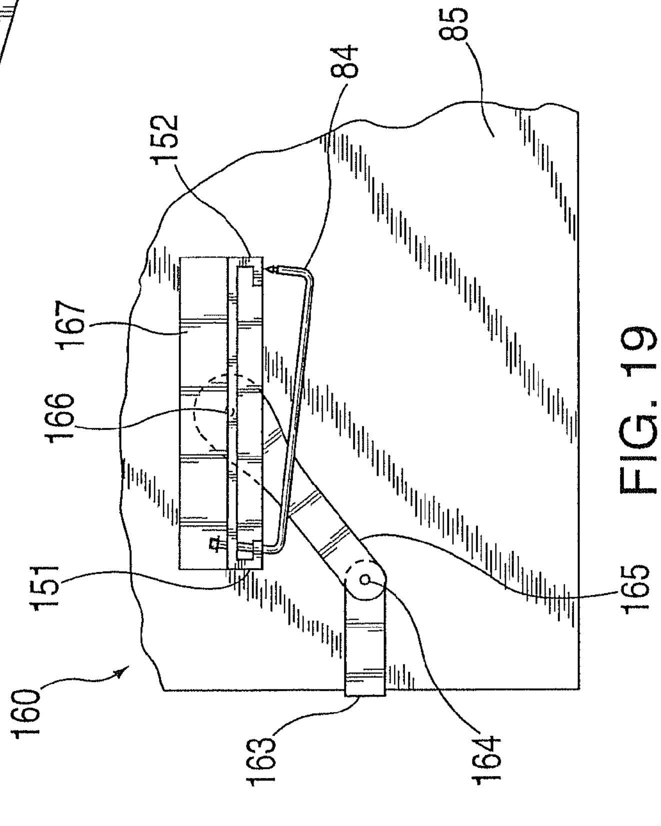
FIG. 19 is a top plan view of another integrated locking base/computer lock with two pivot links.

A related embodiment in FIG. 19 shows integrated base/computer or other personal electronic device lock 160 which has one or more pivot points 164 and 166 (on base part 167). Link 165 now pivots in relation to clamp section 163 such that the notebook computer or other personal electronic device lock 160 can be more conveniently positioned on work surface 85.

In FIG. 19, for example, clamp 163 is placed on the edge to the side of computer or other personal electronic device lock base 167 instead of directly in front of it as would be necessary in the embodiment of FIG. 18.

The preferred low profile locking base embodiment of this invention for consumer use is detailed in FIGS. 20-27.

Figure 20:
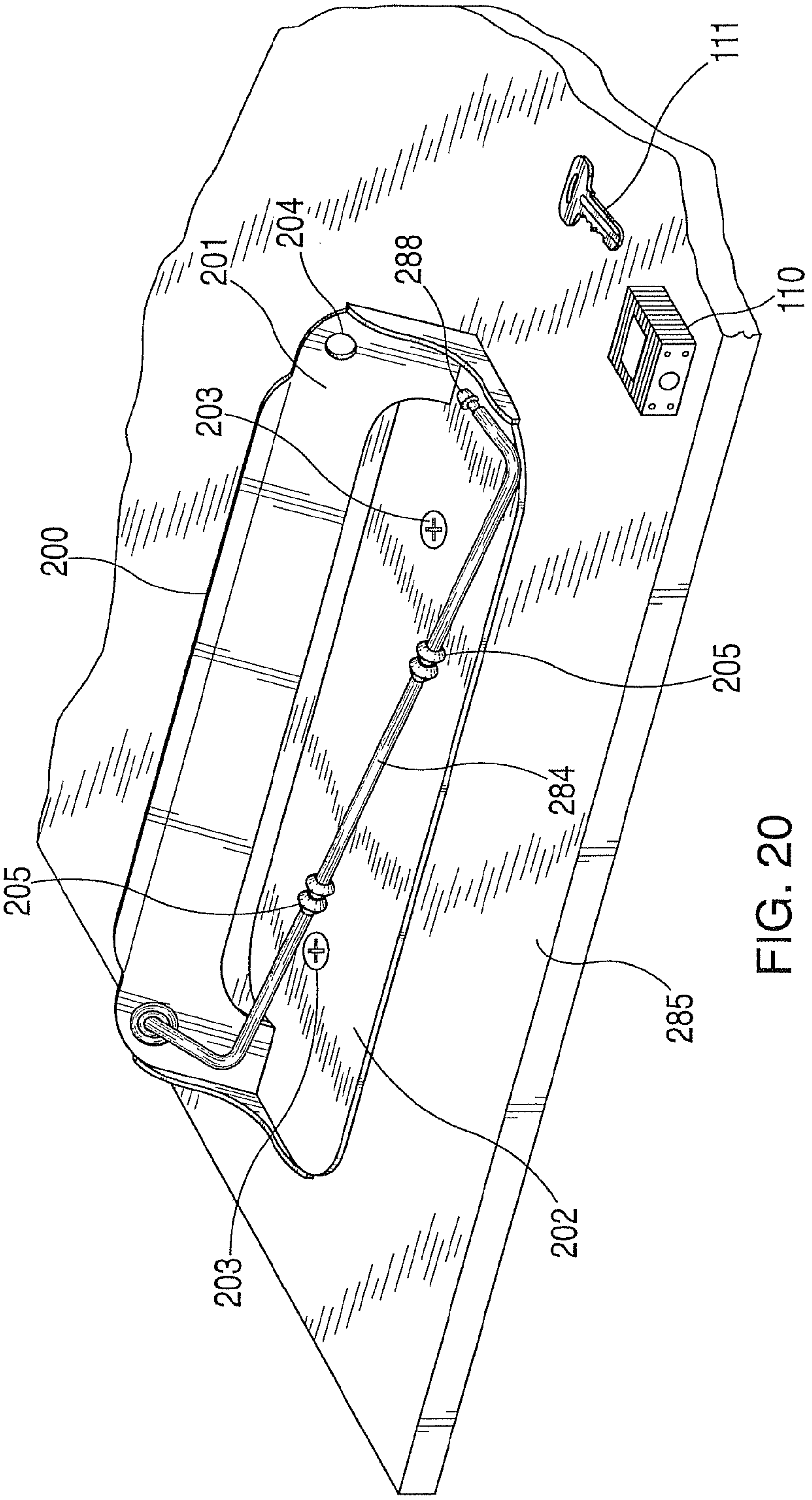
FIG. 20 is a perspective view of a preferred embodiment for a low profile notebook computer, shown attached by fasteners, such as screws, down to the work surface.

FIG. 20 shows a low profile locking base 200 with narrow base 202 and low rise back 201. It is screwed to work surface 285 via fasteners, such as screws 203. Locking bar 284 with optional rubber or elastomer grommets 205 and machined end 288 is used to lock the display of a notebook or laptop computer or other personal electronic device (not shown) to locking base 200. End 288 is passed through hole 204 and locked with pin lock 110. Key 111 is used to unlock and remove the computer or other personal electronic device.

Figure 21:
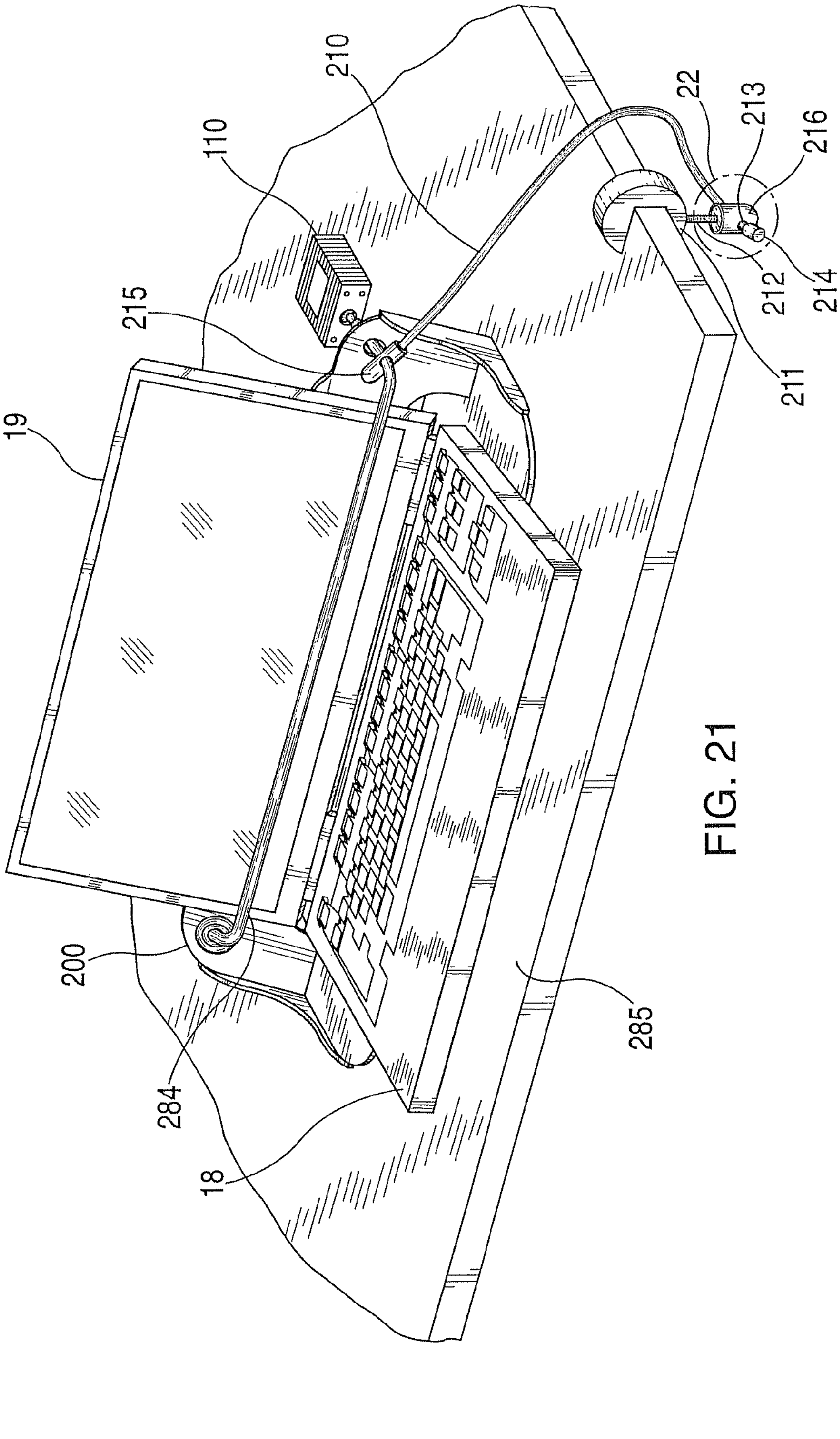
FIG. 21 is a perspective view of the locking base of FIG. 20 used as a portable device secured to the work surface via a cable and clamp.
Figure 26:
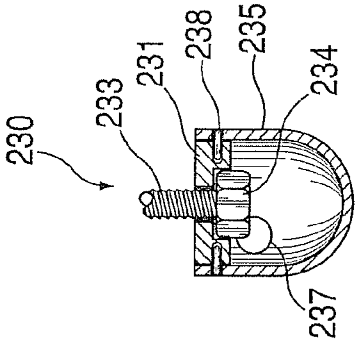
FIG. 26 is a side view cross-section of the clamp screw assembly as in FIG. 23, taken along line "26-26" of FIG. 25, shown with the screw head seated in the socket wrench recess and preventing insertion of the cable.

The preferred simpler method of use of a locking base is not to screw it down as shown in FIG. 20 but instead to create a portable locking kit by adding a clamp 211 and cable 210 as shown in FIG. 21.

Due to the low profile design with a narrow base, all components of the portable kit conveniently fit into a tubular carrying case (not shown).

FIG. 21 also shows Clamp 211 having a fastener, such as a screw subassembly, including screw 212 and short container, such as a cylinder 216, with transverse cable attachment hole 213. At the first end of cable 210 is a ferrule 215 with a transverse hole. This fits through hole 213. The cable is threaded through hole 213 after clamp 211 is secured using the appropriate tool to tighten screw 212. The distal end of cable 210 has ferrule 214 with enlarged end which does not fit through hole 213.

Figure 22:
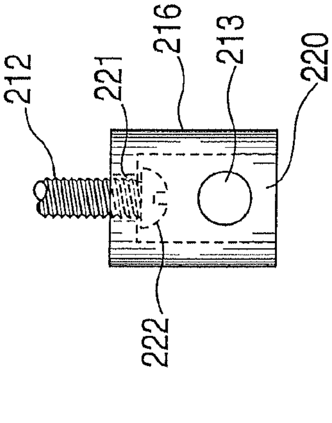
FIG. 22 is a detail side view of the clamp screw subassembly used in FIG. 21, shown in the ellipse "22" of FIG. 21.

FIG. 22 shows the arrangement more clearly. It is noted that cylinder 216 has distal hole 220 which accommodates the screw head and also has a screw clearance hole 221 on its top surface. After cable 210 is threaded through hole 213, a tool cannot reach screw head 222 to loosen clamp 211 since access is denied through distal hole 220. After cable 210 is installed through cylinder 216, the end 288 of locking bar 284 is passed through the transverse hole in ferrule 215 prior to locking bar 284 to base 200.

In an alternate embodiment of the clamp screw subassembly no tool is required to tighten or loosen clamp 211.

Figure 23:
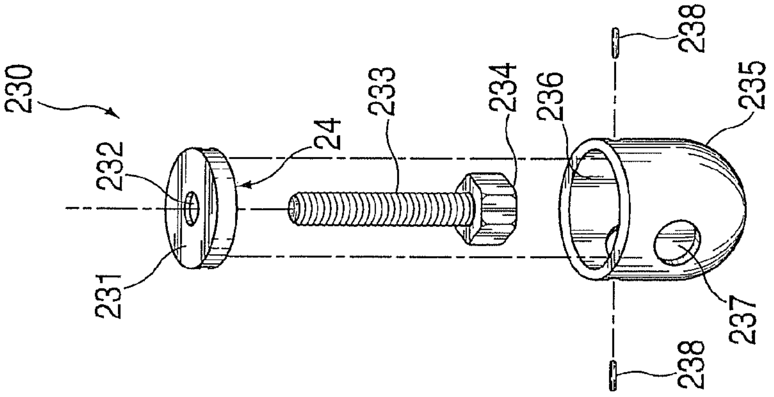
FIG. 23 is an exploded perspective view of the components of an alternate embodiment with a socket wrench type clamp screw subassembly.

For example, an exploded view of subassembly 230 is shown in FIG. 23 with end cap 231 pushed down over clamp screw 233 and press fit into the end of knob 235. Optional pins 238 can be driven radially to insure positive attachment. Cap 231 has screw clearance hole 232 at its center. Screw 233 becomes captive as a subassembly with tall head 234 within knob 235 once cap 231 is attached. Offset transverse hole 237 in knob 235 goes through both walls and is sized for cable attachment.

Figure 24:
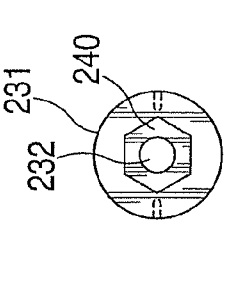
FIG. 24 is a bottom view of the end cap of the embodiment of FIG. 23, showing the recess which forms the socket wrench element.

FIG. 24 shows the underside of cap 231 revealing hexagonal recess 240 sized to engage bolt head 234.

Figure 25:
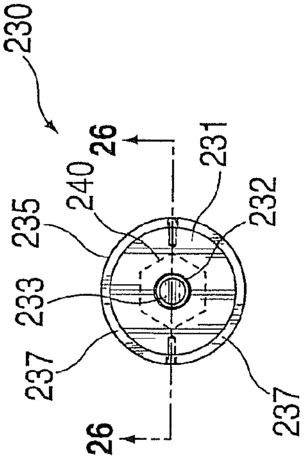
FIG. 25 is a top view of the clamp screw assembly as in FIG. 23, shown with the captive screw.

FIG. 25 is a top view of subassembly 230. In the side cross-section of FIG. 26, bolt head 234 is seated in recess 240 of cap 231. This is prior to the insertion of cable 210 through holes 237. Clamp 211 can be tightened in this depicted configuration by turning knob 235 since recess 240 acts as a socket wrench to bolt 233. It is noted also that the size of head 234 interferes with the placement of hole 237 thereby preventing insertion of cable 210 while head 234 is seated in recess 240.

Figure 27:
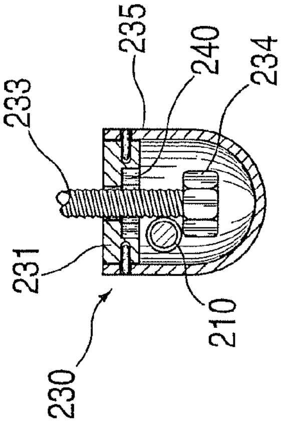
FIG. 27 is a side view in cross-section of the clamp screw assembly as in FIG. 23, shown with the cable preventing seating of the screw head in the socket wrench recess.

If knob 235 is pushed up as shown in FIG. 27, cable 210 can now be easily inserted through holes 237 adjacent to screw 233 and spacing head 234 away from recess 240. In this configuration with cable 210 installed through knob 235, if turned, knob 235 will spin freely regardless of the up or down forces exerted. Clamp 211 can only be removed after cable 210 is removed and head 234 is re-seated in recess 240. In lieu of a non-standard screw 233 with tall head 234, a standard hex screw can be used with a nut screwed up against the head and adhesively bonded as a unit. A washer between the nut and the screw head would only enhance the operation creating a more positive barrier with cable 210.

In an alternate protruding member locking embodiment of this invention, spikes, security rods or strips are used to secure a personal electronic device, such as a notebook computer, cell phone, personal digital assistant (PDA) or electronic music and/or video player (i.e. iPod®).

Figure 28:
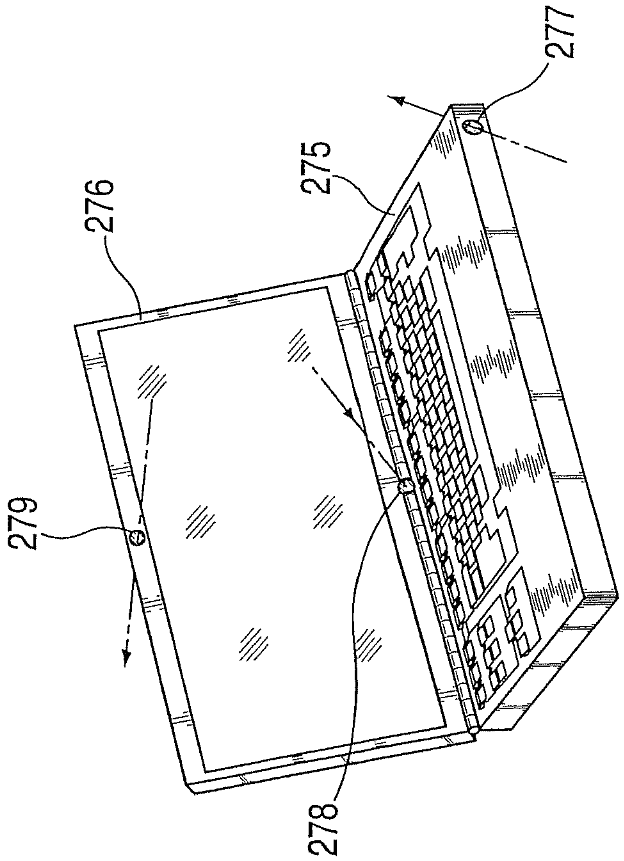
FIG. 28 is a perspective view showing the possible locations of through-holes for use of an alternate protrusion spike embodiment security feature used with a cable.

For example, in FIG. 28, a notebook computer or other personal electronic device with base 275 and display 276 is shown. One of the three through-holes is required for this embodiment. Hole 278 is at the hinge line, while hole 279 is through the display housing; hole 277 is diagonally through one of the front or rear corners of the base.

Figure 28A:
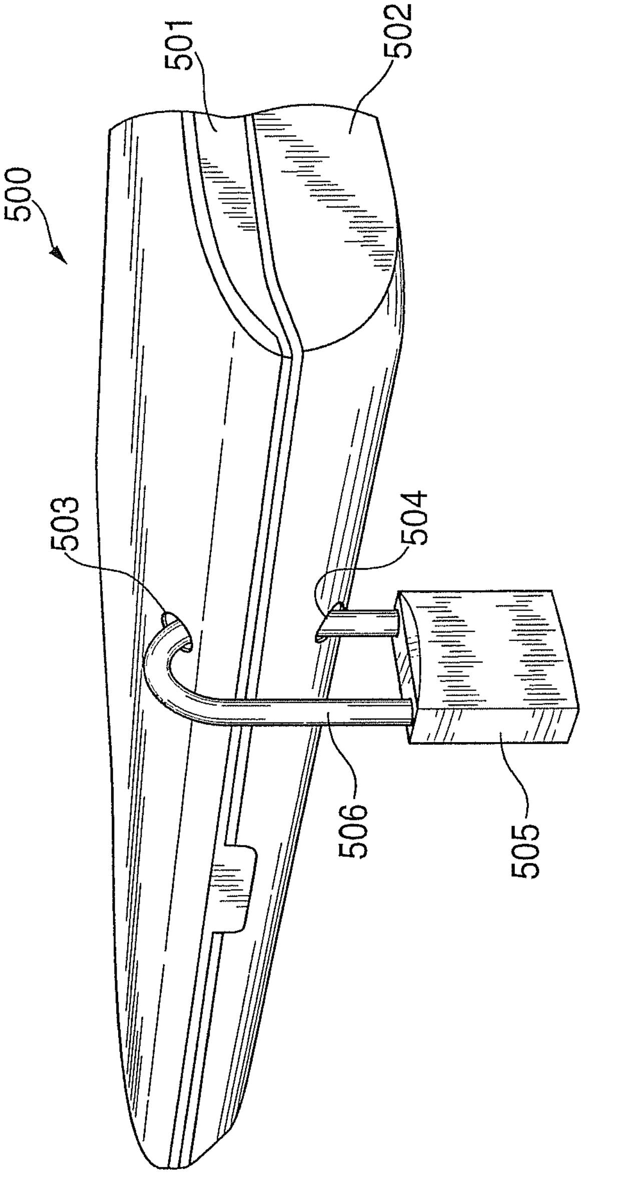
FIG. 28A is a perspective detail showing the closed front section of a notebook computer wherein a security feature is two through holes which align upon closing display lid permitting a padlock with an elongated hasp to lock the display to the keyboard base.

In the alternate locking embodiment shown in FIG. 28A, a notebook computer 500 has a through hole 503 in the display portion which aligns in positional register with through hole 504 in the base or keyboard portion 502 when in the closed position. A protruding lock, such as, for example, padlock 505 with elongated hasp 506, is used to prevent display portion 501 from being opened in a usable position. In addition, if a secure cable with a loop on its distal end is in the vicinity, this loop can also be engaged by hasp 506 thereby securing computer 500 to fixed location. Other protruding locks, such as spikes, security rods or strips, can also be used to lock display portion 501 with keyboard portion 502 when in the closed position.

Figure 28B:
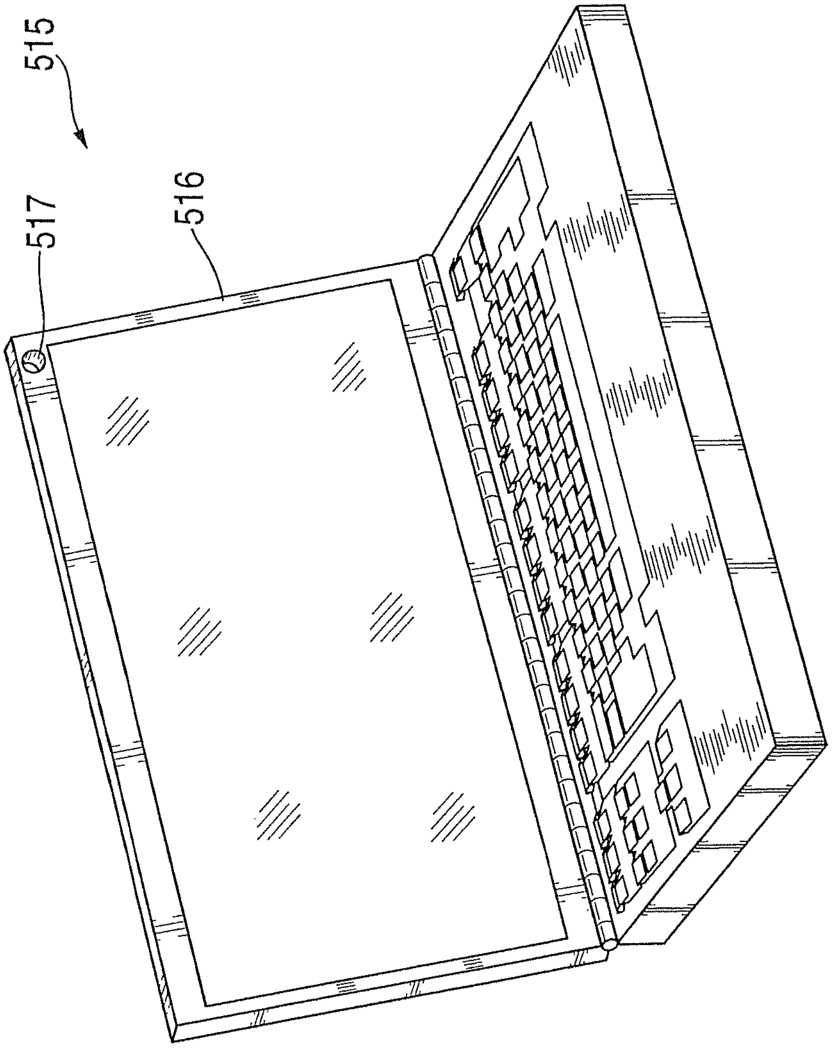
FIG. 28B is a perspective view of a notebook computer with a security hole in the top right corner of the display section.
Figure 28C:
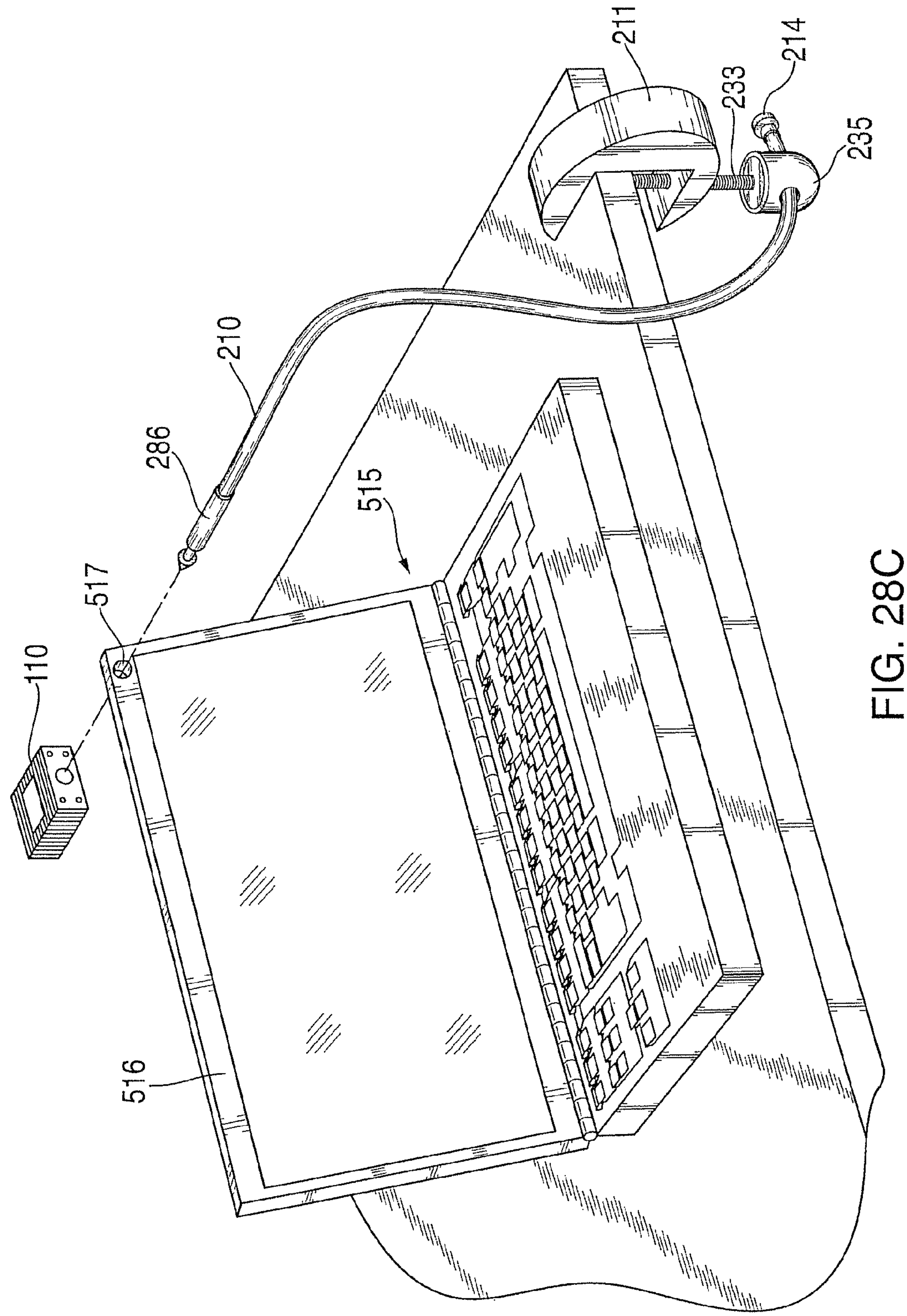
FIG. 28C is a perspective view of the computer of FIG. 28B with a pin lock and locking ferrule aligned prior to insertion through security hole.
Figure 28D:
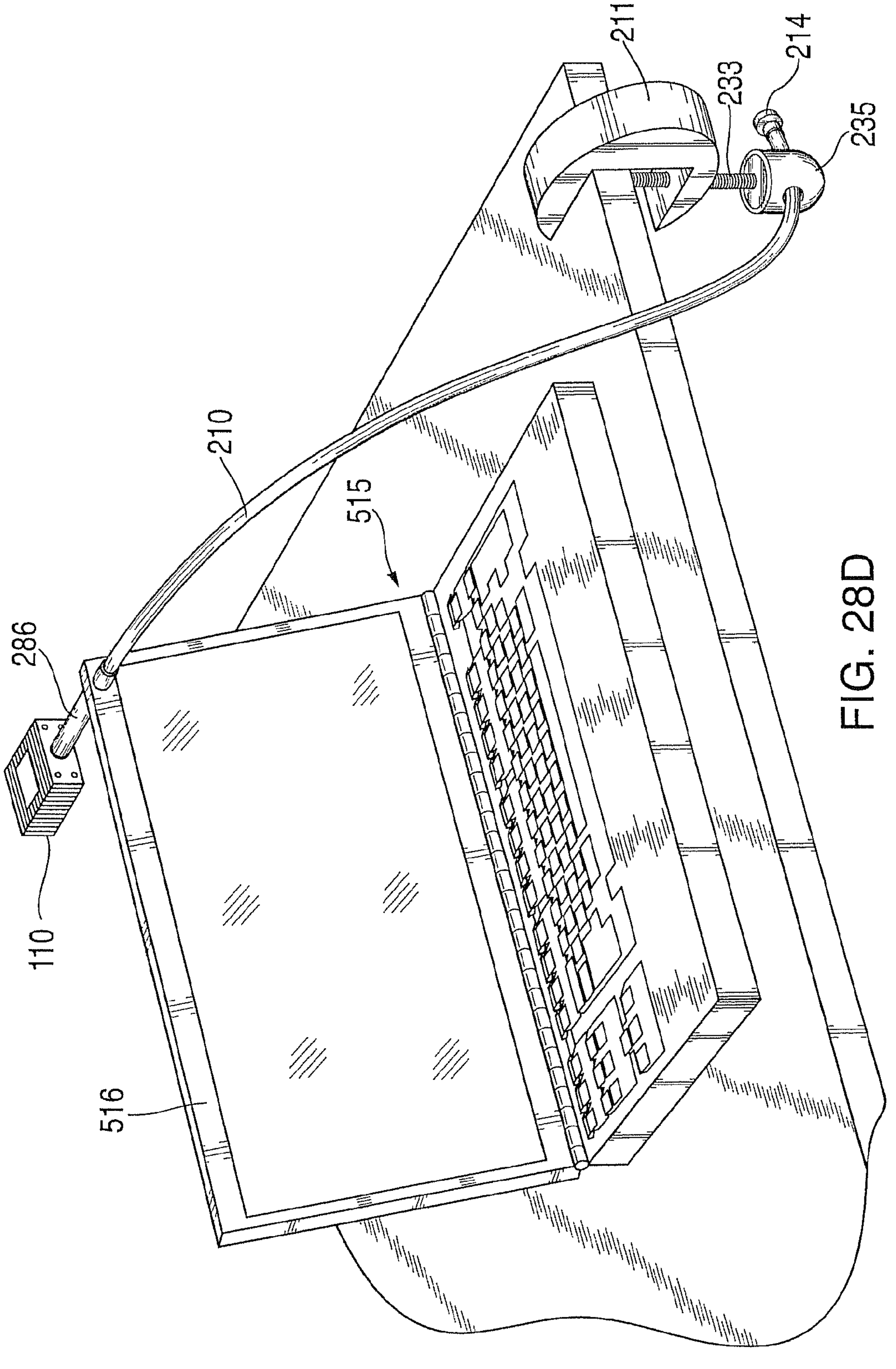
FIG. 28D is a perspective view of the computer of FIG. 28C after pin lock is used to secure ferrule thereby using a cable to secure computer to a table top.

FIGS. 28B-D illustrate yet another locking embodiment for notebook computer 515 with display 516 which has a security hole 517 in the upper right corner of display portion 516. Hole 517 is a through hole. FIGS. 28C and 28D illustrate how the apparatus of FIG. 29 (without spike 285) is used to secure computer 515. Ferrule 286 is passed through hole 517 and locked by pin lock 110. In this manner cable 210 attaches computer 515 to secure table top clamp 211 or to another securing member, such as a table leg of the work surface upon which notebook computer 500 is placed.

It is further noted that ferrule 286 can also be used to lock notebook computer 500 in place in the closed position as in FIG. 28A, or the hasp 506 of FIG. 28A can also be used to lock the display portion 516 of notebook computer 500 instead of ferrule 286 and pin lock 110 shown in FIG. 28C.

Figure 29:
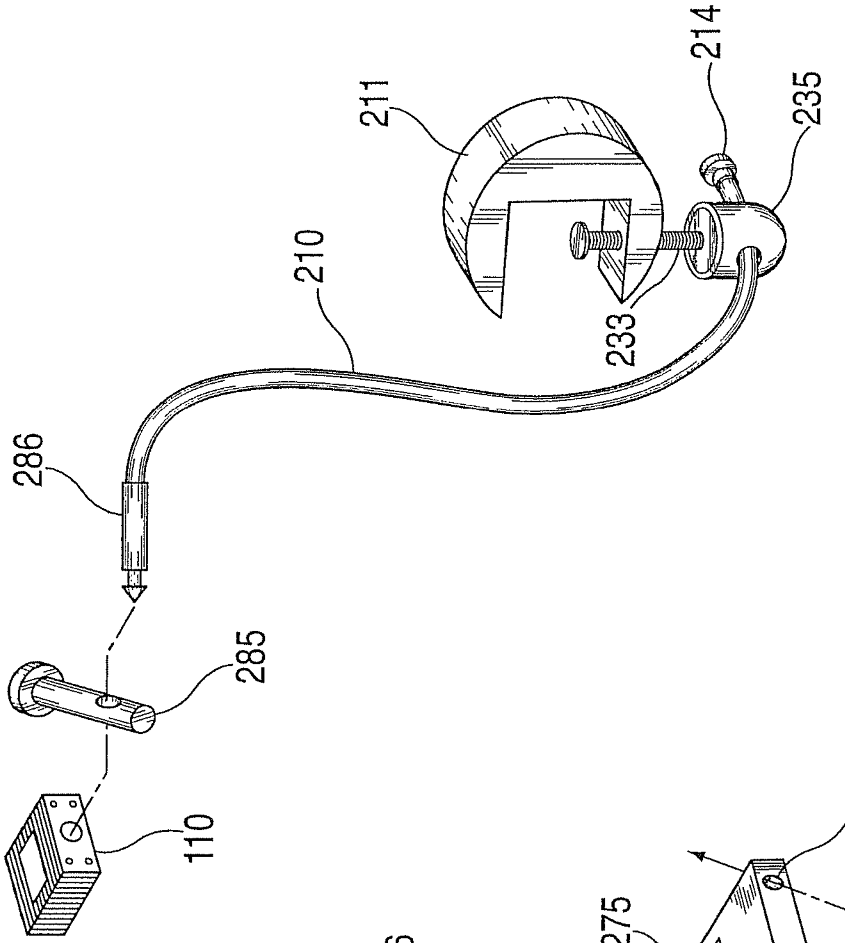
FIG. 29 is a perspective view of the spike with a cable attached ferrule, pin lock, and secure cable clamp used to secure a notebook computer.

FIG. 29 shows locking rod or spike 285 which is inserted in any of the three hole locations discussed. Ferrule 286 with a groove near its distal end is then inserted through the transverse hole of spike 285 and locked with pin lock 110. Ferrule 286 is securely attached to cable 210 which had been passed through knob 235 after clamp 211 had been tightened at the edge of a table or desk top. In this manner, the illustrated notebook computer or other personal electronic device is secured via a secure cable.

Figure 30:
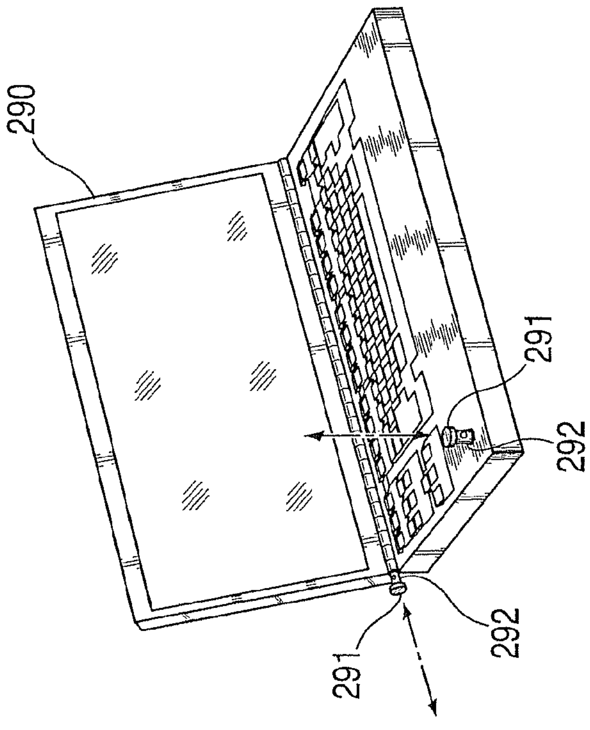
FIG. 30 is a schematic perspective view of a notebook computer with captive security rods for cable attachment.

In a variation of this embodiment, the separate spike 285 is replaced by a captive security rod 291 as shown in FIG. 30. Note that rod 291 may be attached either to one end of the hinge or alternatively to the top surface of the base of computer or other personal electronic device 290 at any convenient location where space permits. Rods 291 are stored in a recessed position with only a small knob protruding so that they may be easily grasped to unlock into the extended position to expose a transverse hole. Ferrule 286 and lock 110 are then used in the same manner as with the separate spike 285.

Figure 31:
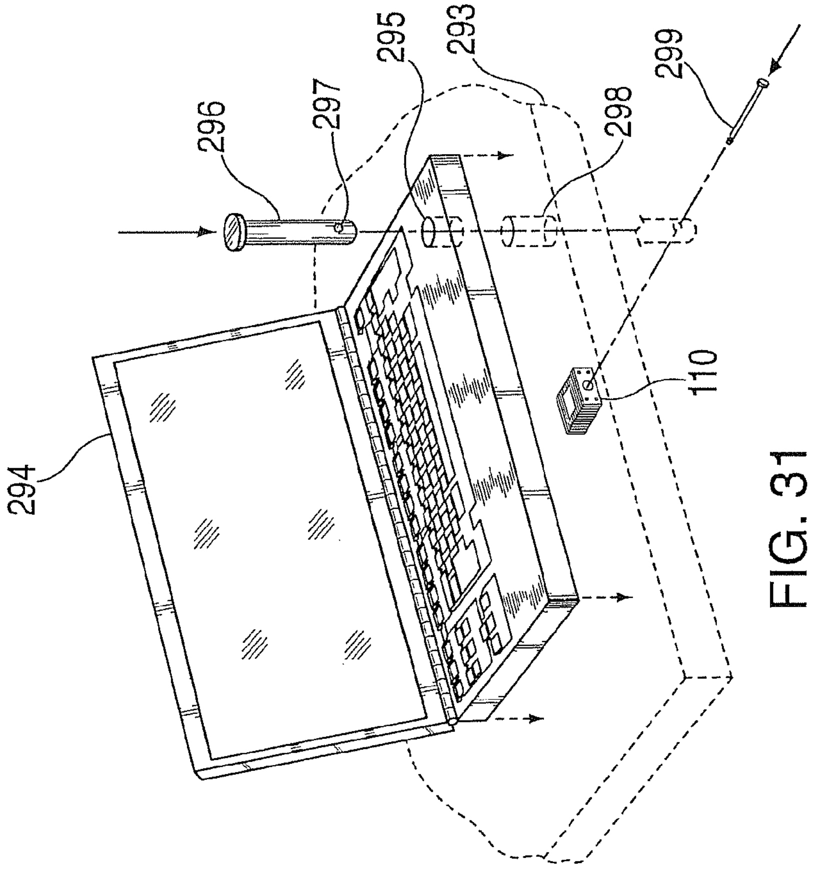
FIG. 31 is a schematic perspective view of a notebook computer with a hole downward through the base for use with a long protrusion spike and a transverse locking pin.

In another spike variation shown in FIG. 31, long spike 296 is used to secure computer or other personal electronic device 294 which has a hole 295 through its base. Hole 295 is placed over pre-existing hole 298 through table top 293; then spike 296 is inserted such that transverse hole 297 is accessible beneath table top 293. Then transverse pin 299 with a groove adjacent its distal end is inserted through hole 297 and locked with pin lock 110. Thus this variation locks a notebook computer or other personal electronic device using a spike without the aid of a cable.

Figure 32:
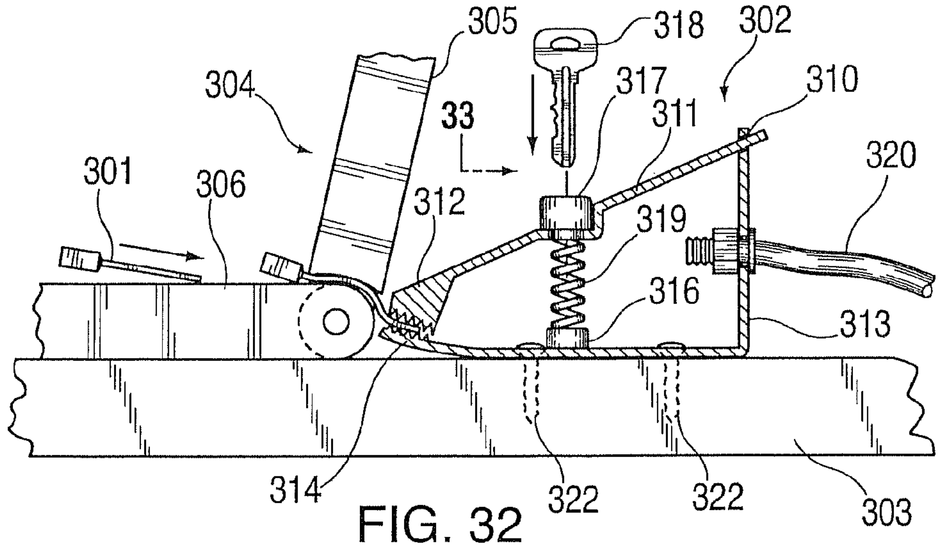
FIG. 32 is a diagrammatic side elevational view of one embodiment for a flexible strip lock for a computer.

In another embodiment shown in FIG. 32 with a flexible locking strip 301, a detail of notebook computer 304 with display 305 and keyboard portion 306 is shown adjacent to clamp 302. Flexible locking strip 301 is shown prior to insertion through the hinge gap between display 305 and keyboard 306 (not shown) and further between bottom jaw 314 and top movable jaw 312 of clamp 302.

In lieu of being inserted within a hinge gap, flexible kicking strip 301 may be inserted within a thin, longitudinally extending slot, similar to holes 277, 278, 279 for rod 285 of FIG. 29.

Figure 33:
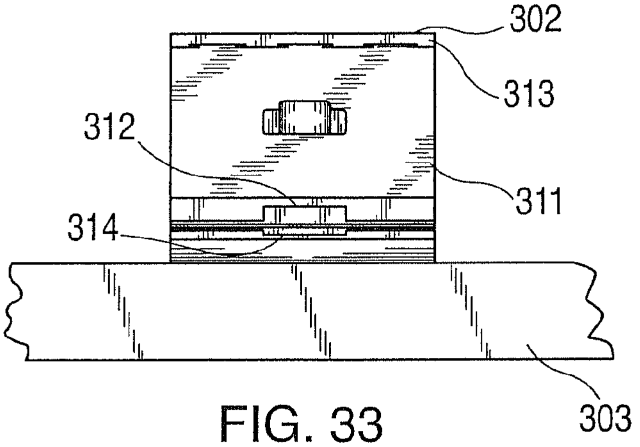
FIG. 33 is a front elevational view thereof, taken in the view direction of arrow "33" shown in FIG. 32.
Figure 34:
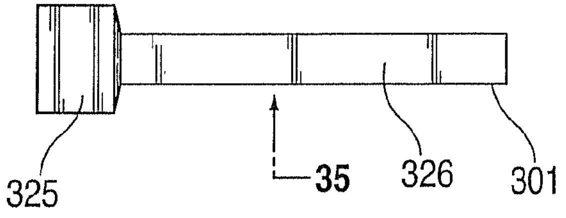
FIG. 34 is a top plan view of the shim strip of the flexible lock.
Figure 35:
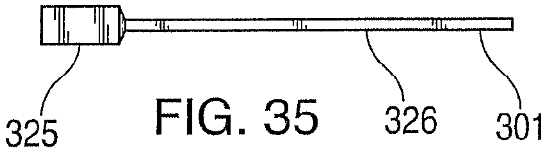
FIG. 35 is a side elevational view taken in the view direction of arrow "35" of FIG. 34.
Figure 36:
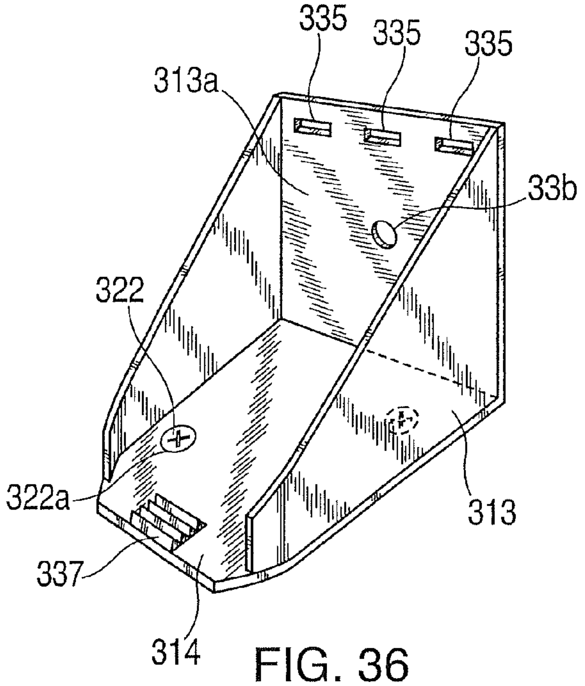
FIG. 36 is a perspective view of a lower protective shoe of the flexible lock.
Figure 37:
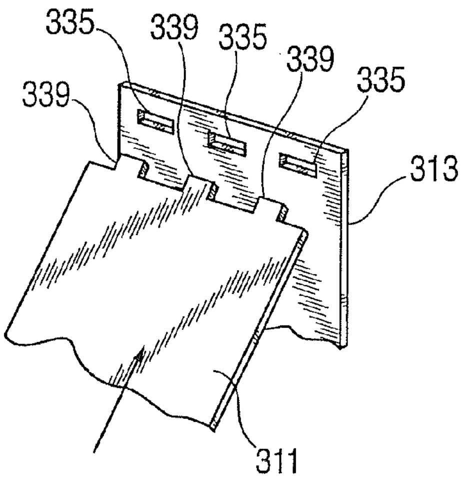
FIG. 37 is a diagrammatic perspective view illustrating a flexible locking means.

FIGS. 33, 36 and 37 show other features of clamp 302 with movable top 311 and stationary base 313. Locking strip 301 is clearly shown in top view and side view in FIGS. 34 and 35 respectively. Wedge stop 325 is shown at one the proximal end with narrow rectangular strip 326 at the distal end. Wedge stop 325 is preferably plastic which is bonded to strip 326 as by overmolding. It is noted that base portion 313 of clamp 302 is typically screwed to work surface 303 via screws 322, however, alternatively security cable 320 with secured distal end (not shown) can be used.

Gripping means, such as serrations 337 in FIG. 36, form lower static jaw 314 of FIGS. 32 and 33; they engage strip 301. Hole 336 is used for optional cable 320. Holes 322*a* accommodate fasteners 322, such as screws. Rectangular holes 335 accept tabs 339 of upper movable jaw 311 to form a hinge. The vertical wall 313*a* of base 313 can be alternatively joined to movable section 311 via ordinary hinges.

Figure 39:
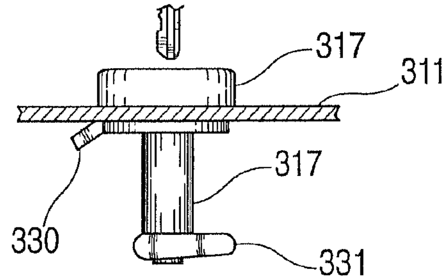
FIG. 39 is a partial view of a key locking means.
Figure 38:
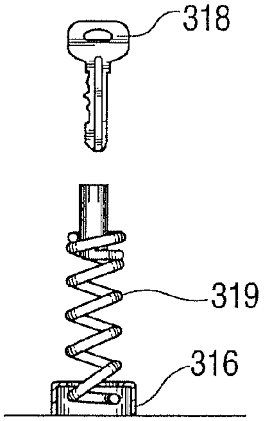
FIG. 38 is a diagrammatic exploded view of a key locking means with a spring.

As in FIGS. 38 and 39, spring 319 tends to keep jaws 312 and 314 slightly apart unless lock 317 is locked via key 318. In that case if key 318 is rotated while moving member 311 is pressed down, lock tang 331 will engage lock recess 316 at the distal end of spring 319; recess 316 is attached to base 313. This action will lock locking strip 301 between jaws 312 and 314. Note that lock 317 is attached to hinged part 311 via a fastener, such as lock nut 330.

FIGS. 40-43 show notebook computer 304, cellular phone 346, PDA 347 and personal DVD player 348 each with hinge gap 345. In addition, the entry path of locking strip 301 is shown by arrows in FIG. 40.

Figure 40:
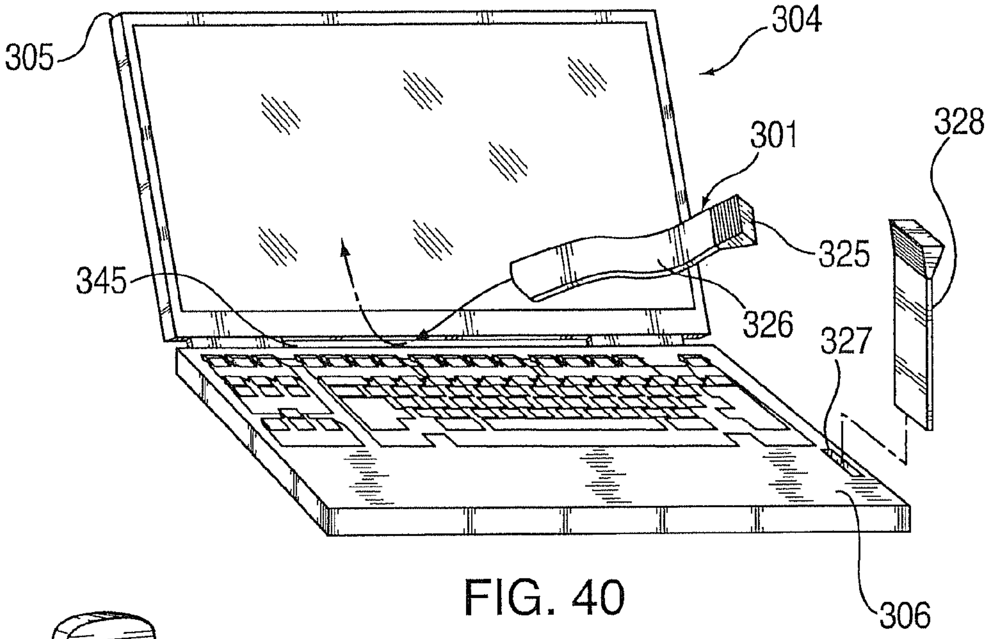
FIG. 40 is a perspective view of a notebook computer showing the hinge gap and the path of weaving the distal end of a locking strip through the hinge gap, as well a slot in the housing of the notebook computer permitting access to a rigid protruding locking strip therein.
Figure 41:
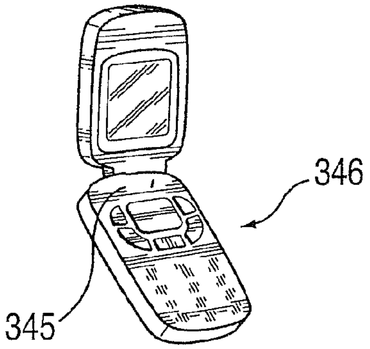
FIG. 41 is a perspective view of a "flip top" cellular phone showing the hinge gap.
Figure 42:
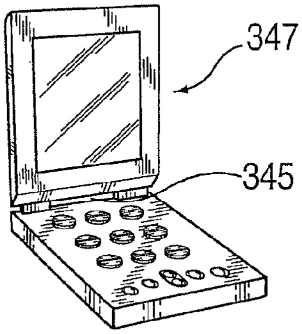
FIG. 42 is a perspective view of a PDA showing the hinge gap.
Figure 43:
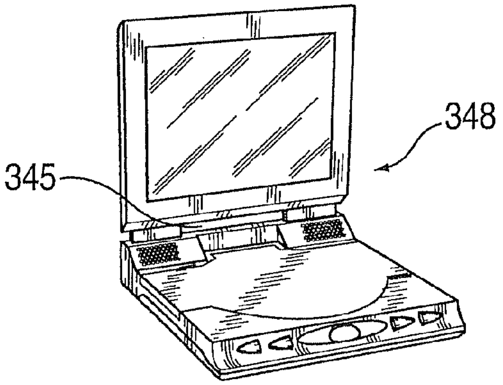
FIG. 43 is a perspective view of a personal DVD player showing the hinge gap.
Figure 44:
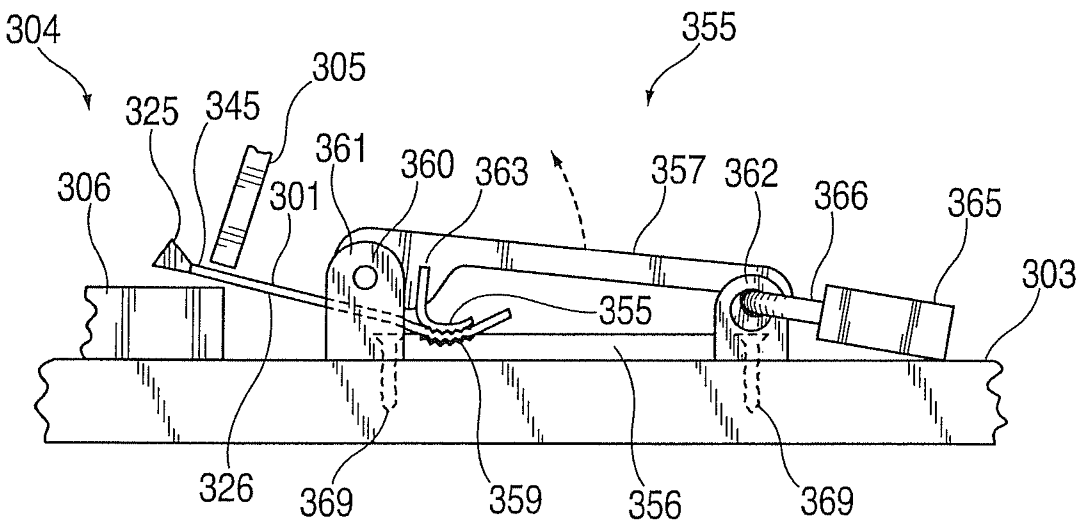
FIG. 44 is a side elevation of an alternative embodiment of a strip captivating locking clamp of this invention, shown using an ordinary padlock.
Figure 45:
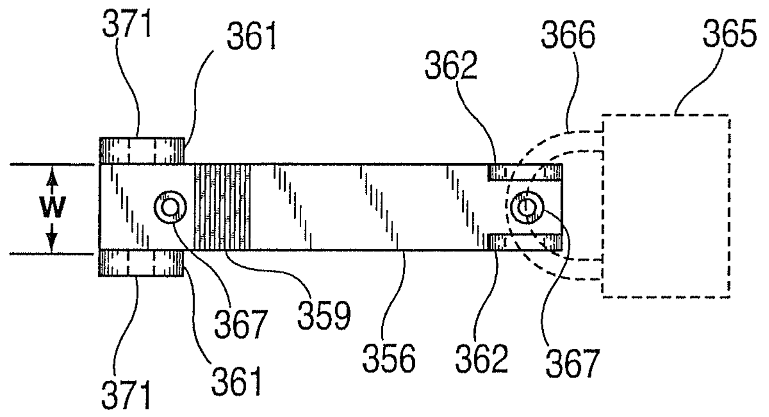
FIG. 45 is a top view of the base portion of FIG. 44.

FIG. 40 also shows a further alternate embodiment whereby the housing of notebook computer 304 contains a slot 326 for insertion of a flexible or rigid locking strip 328 therethrough.

Figure 46:
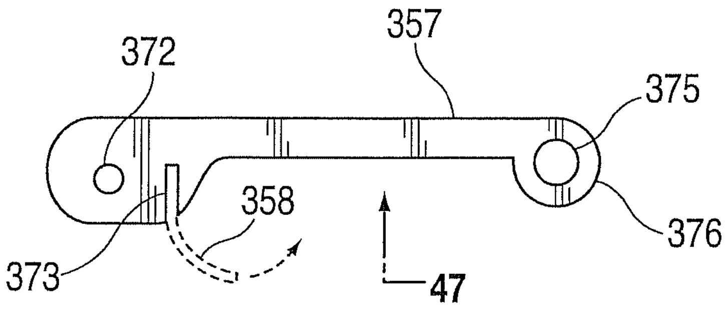
FIG. 46 is a side elevation of the handle portion of the alternate embodiment clamp of FIG. 44.
Figure 47:
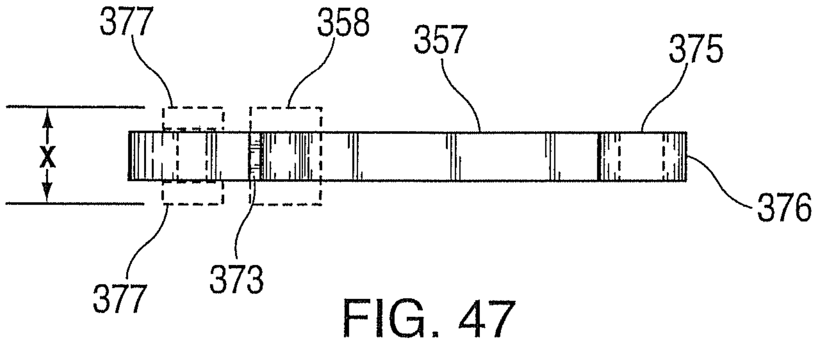
FIG. 47 is a bottom view (in the direction of arrow "47" in FIG. 46) of the handle of FIG. 46.

FIGS. 44-47 relate to an alternate embodiment of clamp 355 which incorporates a leaf spring 358 to impart locking force to locking strip 301 when shackle 366 of padlock 365 is passed through lock loops 362 and handle loop 376 (as in FIG. 46). In this embodiment, shallow recess 359 with transverse serrations aggressively grasps strip end 326 under bending force of spring 358, which itself can have optional transverse serrations on its contact surface.

When handle 357 is free to swing up, strip end 326 can be easily passed between brackets 371 which are spaced apart a distance "W" (as in FIG. 45) to accommodate the width of strip end 326. Base 356 is secured to work surface 303 via fasteners, such as screws 369, which are passed through countersink holes 367 (as in FIG. 45). Leaf spring 358 is swaged or brazed at region 363 within slot 373 of handle 357. Hole 375 in loop 376 accommodates shackle 366. It is noted that spring 358 has to be bent somewhat for handle 357 to be in registration with the holes in padlock brackets 362. This bending also permits clamp 355 to accommodate strip ends 326 of varying thicknesses. Also, with respect to the geometry of spring 358 in FIG. 44, if a pulling force is placed on locking strip 301, frictional forces will tend to rotate the free end of spring 358 in a counter-clockwise direction thereby increasing clamping force on strip end 326; this further counteracts the pull-out force. Since spring 358 is wider than handle 357 (as in FIG. 47), centering washers 377 are used on either side of it to increase the combined width to X which is just slightly smaller than W. Rivet 360 in brackets 361 acts as an axle for handle 357; hole 372 is a clearance fit for rivet 360.

Figure 48:
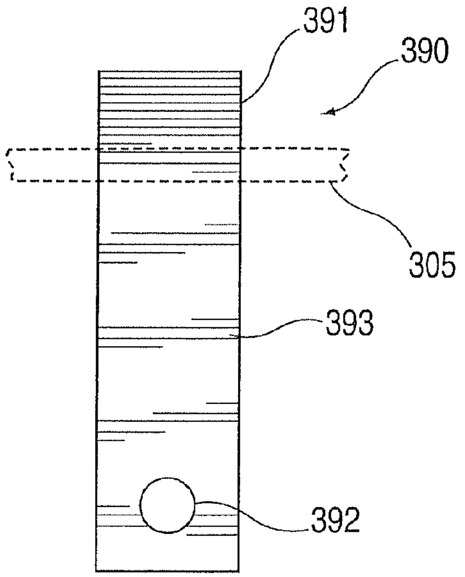
FIG. 48 is a top plan view of a further alternate embodiment for a locking strip of this invention.

FIG. 48 illustrates alternate embodiment locking strip 390 with locking wedge 391, strip 393 and end hole 392. Locking strip 390 may be rigid or flexible.

Figure 50:
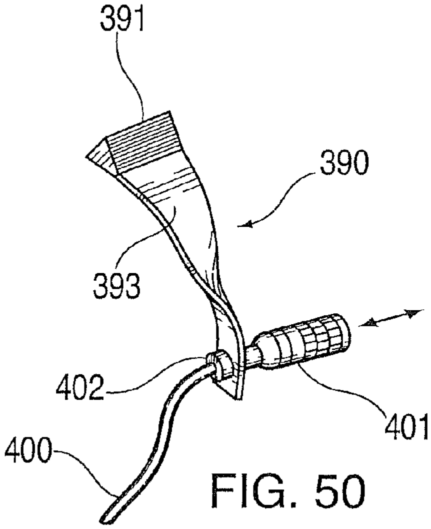
FIG. 50 is a perspective of an alternate method of securing the locking strip of FIG. 48 by the use of a secure cable and a cable lock.
Figure 51:
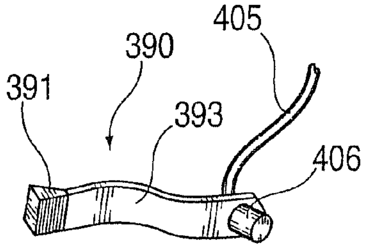
FIG. 51 is a perspective view of yet another method of securing the locking strip of FIG. 48 by virtue of a free cable with attached stop member.

Dashed lines 305 of FIG. 48 show the position of a computer display if this is being secured. Added hole 392 permits at least three non-clamp locking methods to be used. These are illustrated in FIGS. 49-51; for clarity, no item is shown being locked in these FIGS. 49-51.

It is understood that instead of being inserted through a hinge gap, locking strip 390 may be first passed through a thin, longitudinally extending slot in the housing of the personal electronic device, such as a notebook computer, instead of a round hole provided for a rod 285 or 296, as is shown in FIGS. 29-31. In this case, the thinness of the slot 327 for strip 328 minimizes any intrusion into the interior of the walls of the personal electronic device, such as a notebook computer 305 and the like, with its intricate wiring located in a tight space within the walls of the notebook computer 305, or other personal electronic device.

The strip 390 may be a rigid rectangle or other geometric shape. Additionally strip 390 may be flexible. If flexible, strip 390 may pass through a slot in the housing of the personal electronic device, or if the device is hinged, through a hinge gap between the display of the device and the main body of the device being secured.

Figure 49:
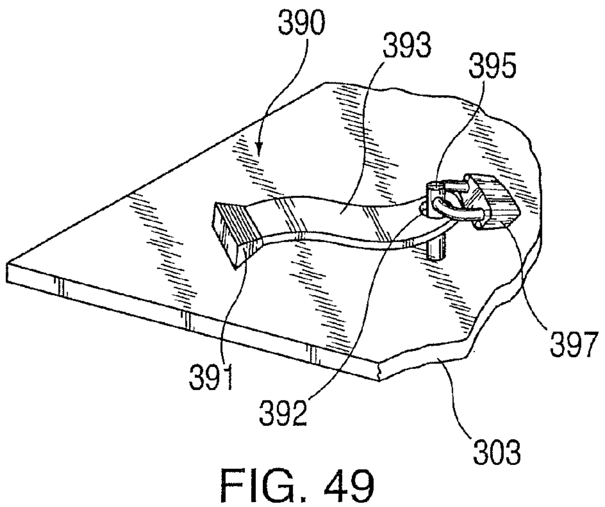
FIG. 49 is a perspective view of the locking strip of FIG. 48 secured to a stud attached to the work surface by the use of a padlock.

In FIG. 49, stud 395 is attached to and protrudes from work surface 303. Hole 392 is simply passed over the distal end of stud 395 and then the shackle of padlock 397 is passed through the transverse hole in stud 395 to lock strip 390.

In FIG. 50, secure cable 400 with collar 402 and a rigid stud at its distal end is used to secure strip 390. After the rigid stud is passed through hole 392, cable lock 401 is snapped over the end of the stud thereby securing strip 390.

In FIG. 51, free cable 405 with lock member 406 permanently attached is passed through hole 392. Since member 406 is a bulge larger than the diameter of hole 392, locking strip 390 will be secured when the distal end of cable 405 is looped or otherwise secured to work surface 303 or to some point adjacent to it.

The plunger type security lock will now be described with reference to FIGS. 52, 53, 54A, 54B, 55A, 55B, 56, 57, 58A and 58B.

Figure 52:
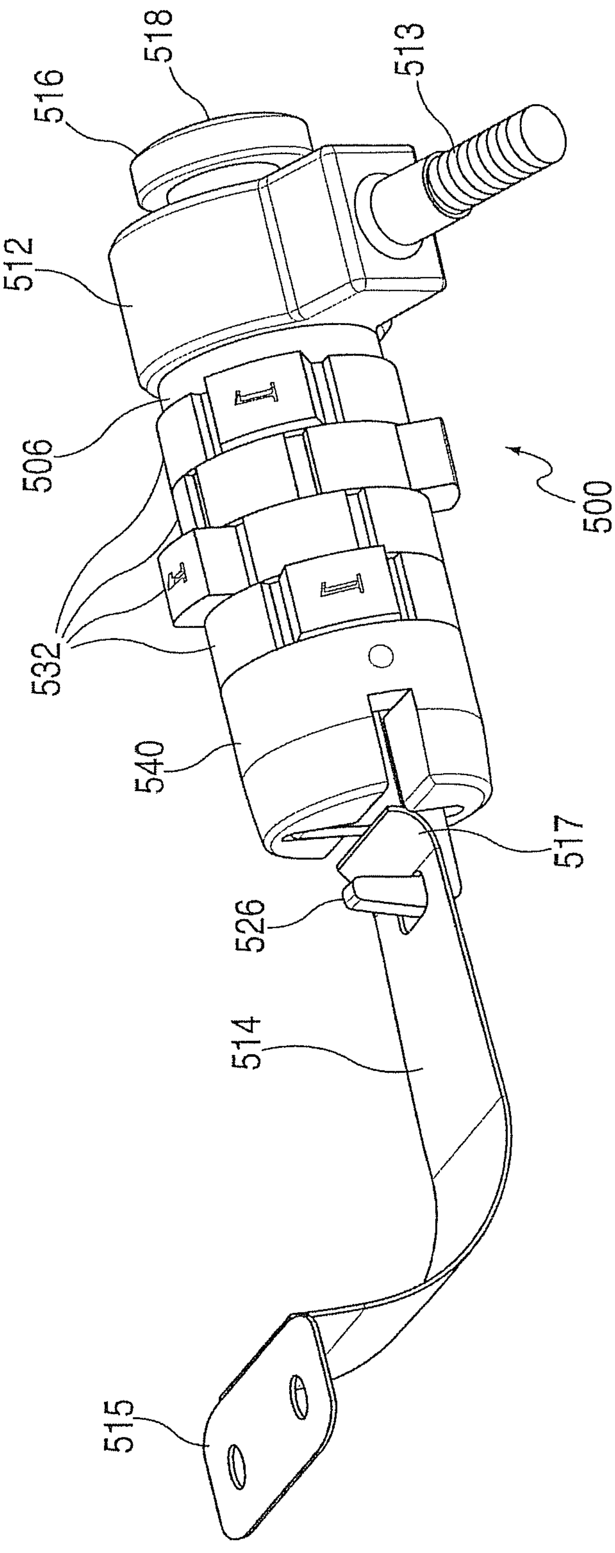
FIG. 52 is a perspective view of one embodiment of a plunger-type security lock of the invention.
Figure 53:
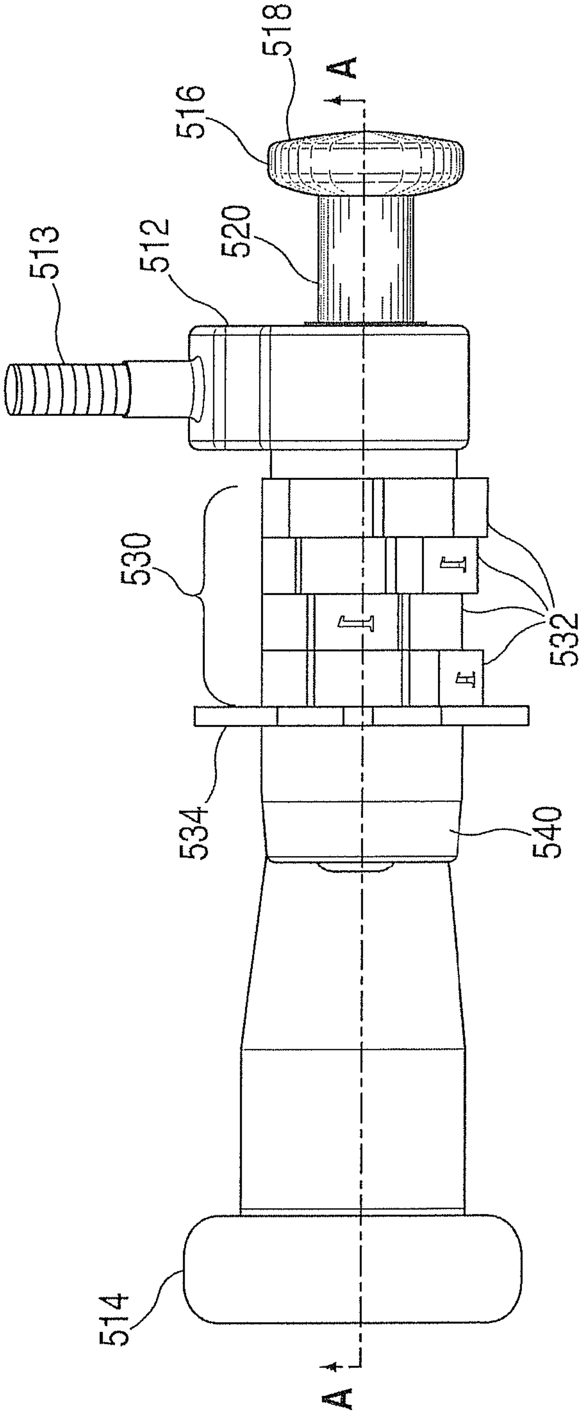
FIG. 53 is a plan view of another embodiment of a plunger-type security lock of the invention.
Figure 54A:
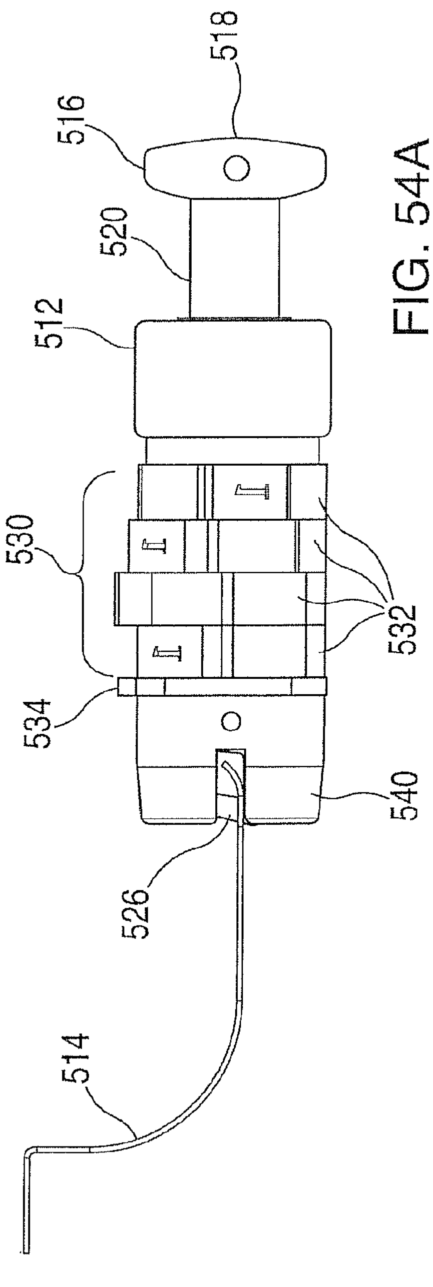
FIG. 54A is a plan view of the plunger-type security lock of FIG. 53, seen along A-A therein.
Figure 54B:
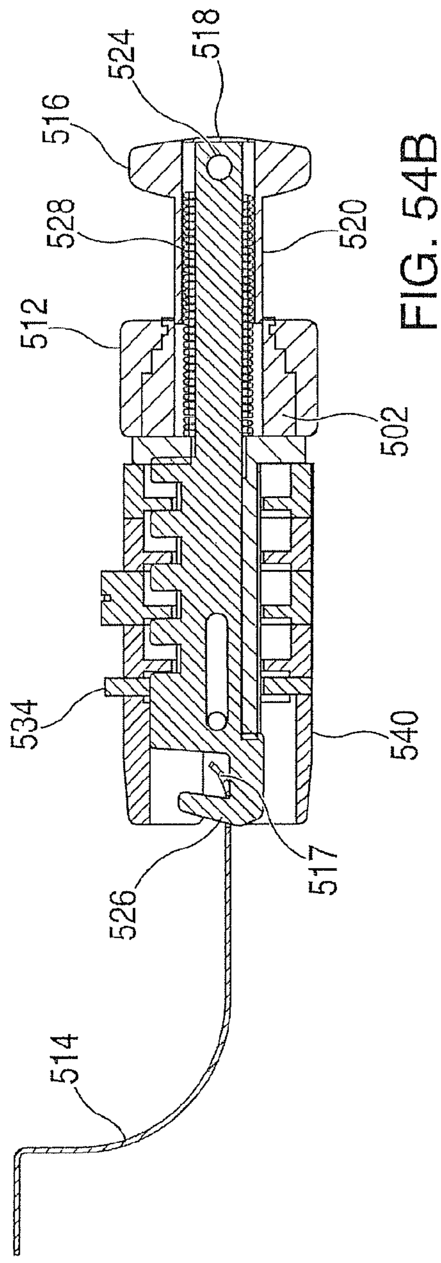
FIG. 54B is a cut away view of the plan view of the plunger-type security lock as shown in FIG. 54A.

FIG. 52 depicts a perspective view of a plunger-type security lock 500 of the invention. While security lock 500 is designed for use with electronic devices such as notebook computers and like devices, e.g., those with a base connected by a hinge to an upper section typically comprising a display device, the invention is not limited thereto. The invention is not limited to what is to be locked or secured, but only that the object to be locked or secured have a hinge or through hole through which a flexible locking strip may pass to its stopping means (e.g., wedge), which is then hooked or captured by the end of the sliding key of the security look, as will now be described in detail.

Figure 55B:
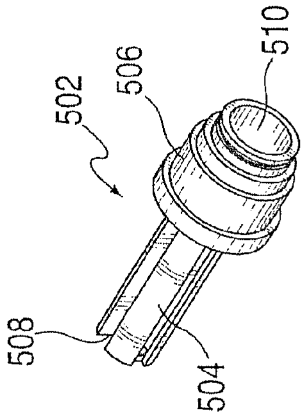
FIGS. 55A and 55B are alternative perspective views of a cylindrical sliding key receptacle.
Figure 56:
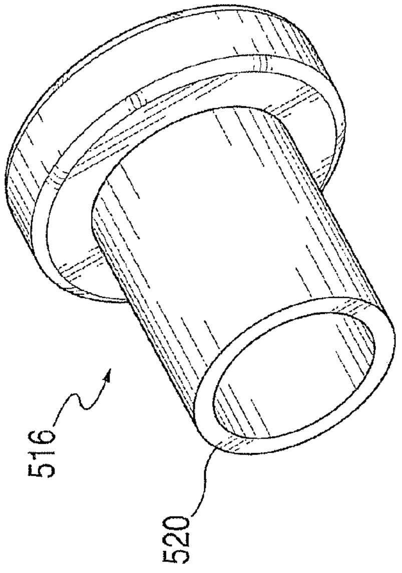
FIG. 56 is a perspective view of a cylindrical plunger.
Figure 55A:
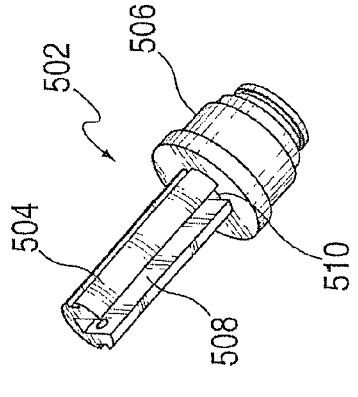
Figure 57:
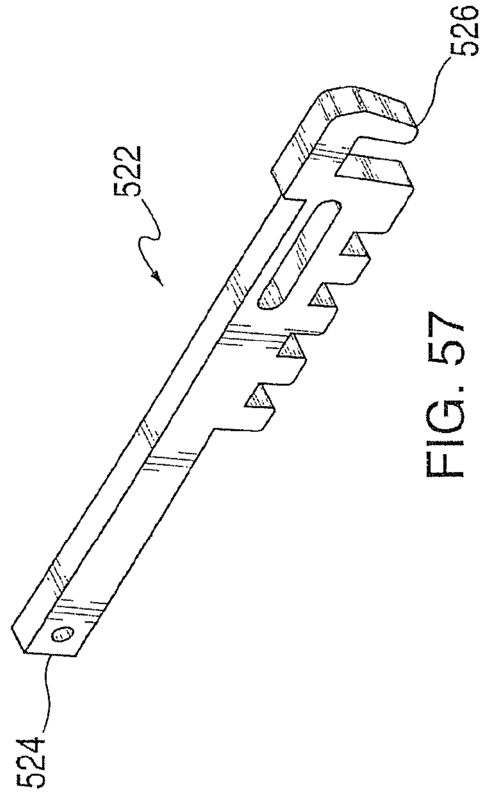
FIG. 57 is a perspective view of a sliding key.
Figure 58B:
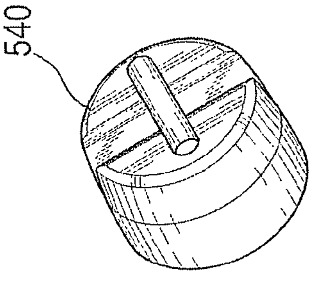
FIGS. 58A and 58B are bezels.
Figure 58A:
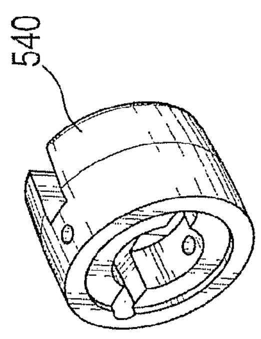

Plunger-type security lock 500 includes a cylindrical sliding key receptacle 502, shown in the perspective views of FIGS. 55A and 55B. The cylindrical sliding key receptacle comprises a slotted, first cylindrical portion 504 and a second cylindrical portion 506. The slotted, first cylindrical portion 504 includes a first end formed with a slot 508 extending longitudinally through to its other end, and opening into the second cylindrical portion. The second cylindrical portion is formed as an open cylindrical cavity 510 that is contiguous with the first cylindrical portion's open slot 508.

A locking member 512 (for example, a ferrule) is arranged on an outer cylindrical surface of the second cylindrical portion 504 of the sliding key receptacle 502 that is configured for attachment to a cable 513. The cable is then attached to a stationary object such as a post, pillar, heavy desk, or other fixture that is substantially immobile.

A cylindrical plunger 516, having a pushing end 518 and a cylindrical plunger end 520, is configured for insertion into the second cylindrical portion of the sliding key receptacle 502. A sliding key 522, comprising a flat, longitudinal member constructed with a rectangular cross-section that includes a hooking end 524 and a plunger-contact end 526, which sliding key is configured with a key definition (see rectangular cut out teeth) and for slidable spring-loaded operation within (slot 508) the slotted, first cylindrical portion 504 in cooperation with the cylindrical plunger 516 and spring 528 in order to extend and hook a flexible locking strip and retract with and lock the locking strip 514 in locking state.

A locking mechanism 530 defines the locking state in cooperation with the key dentition. Locking mechanism 30 comprises a plurality of number dials 532 (four in the embodiment shown) arranged about an outer surface of the slotted, first cylindrical portion 508 to prevent the extending of the sliding key 522 when arranged in the locking state and to allow extending of the sliding key when in an unlock state. The locking state and unlock state are correlated to a numerical setting of the number dials in cooperation with the key definition. Spring washers (not shown in the drawing) are included to maintain the number dials, as well as a finger grip flange 534 (not shown in the FIG. 51 embodiment).

The locking member 512 or ferrule preferably comprises a cable for tethering the security lock to an anchoring means, such as a desk or stanchion, without limitation. The locking strip 514 for which the hooking end 526 of the sliding key 522 is configured to hook when extending from the sliding key receptacle 502 is configured with a blocking end 515, and to slide through an electronic device (304; FIG. 40), i.e., via a through opening, up to the blocking end. For example, a through opening may comprise a hinge gap between two parts. The blocking end may be formed as a wedge. In this way, the electronic device is secured to the plunger-type security lock (500) when in a locking state.

A bezel 540 is arranged about an outside diameter of the open end of the slotted, first cylindrical portion 504 of the sliding key receptacle 502, through which a portion of the longitudinal member of the sliding key 522 extends and retracts.

Spring 528 is positioned to cooperate with the sliding key 522, the sliding key receptacle 502 and the plunger 516 to provide the spring loaded sliding key movement in cooperation with locking mechanism 530.

In another embodiment, the invention comprises an electronic device with security locking system. The electronic device 305 is required t have a through slot, such as a hinge gap (FIG. 40). A flexible locking strip 514 includes an insertion end 517 and a stopping end 515, configured for insertion partially through the through slot or hinge gap up to the stopping end 515. A plunger-type security lock (500) comprising a cylindrical sliding key receptacle 502 with a slotted, first cylindrical portion 504 and a second cylindrical portion 506, a locking member 512 arranged on an outer cylindrical surface of the second cylindrical portion 506 of the sliding key receptacle 502 is configured for attachment to a tether means (i.e., cable, chain, etc.) 513, a cylindrical plunger 516, a sliding key 522 including a hooking end 526 and a plunger-contact end 524 that is configured with a key definition (cut out teeth) and for slidable spring-loaded operation within the slotted, first cylindrical portion 504 in cooperation with the cylindrical plunger 516 to extend and hook the flexible locking strip 514 and to retract with and lock the locking strip 514 in locking state and a locking mechanism 530 that defines the locking state in cooperation with the key definition.

In another embodiment, the invention includes a locking assembly for a notebook computer or other personal electronic device having a visual display portion attached to a keyboard base portion by a hinge. The assembly includes a notebook computer or other personal electronic device with visual display portion separated from a keyboard base portion by a hinge. A flexible locking strip including an insertion end and a stopping end, configured for insertion partially through the hinge up to the stopping end.

A plunger-type security lock 500 comprising a slotted, cylindrical sliding key receptacle 502, a locking member 512 or ferrule is arranged on an outer cylindrical surface of the sliding key receptacle 502 and is preferably attached to a tether means (e.g., cable or chain) 513: A cylindrical plunger 516 is included, as well as a sliding key 522 formed to include a hooking end 526 and a plunger-contact end 524. The sliding key is configured with a key definition to capture the numbers dialed in via the locking mechanism. A spring 528 is included to provide for spring loaded sliding key cooperation with the plunger and locking mechanism 530 within the slotted, cylindrical sliding key receptacle to extend and hook the flexible locking strip 514 and to retract with and lock the locking strip 514 in locking state.

In the embodiment shown in FIGS. 59-65, the security apparatus of this invention is designed to engage diagonal corners of an electronic tablet (such as an iPad®).

Figure 59:
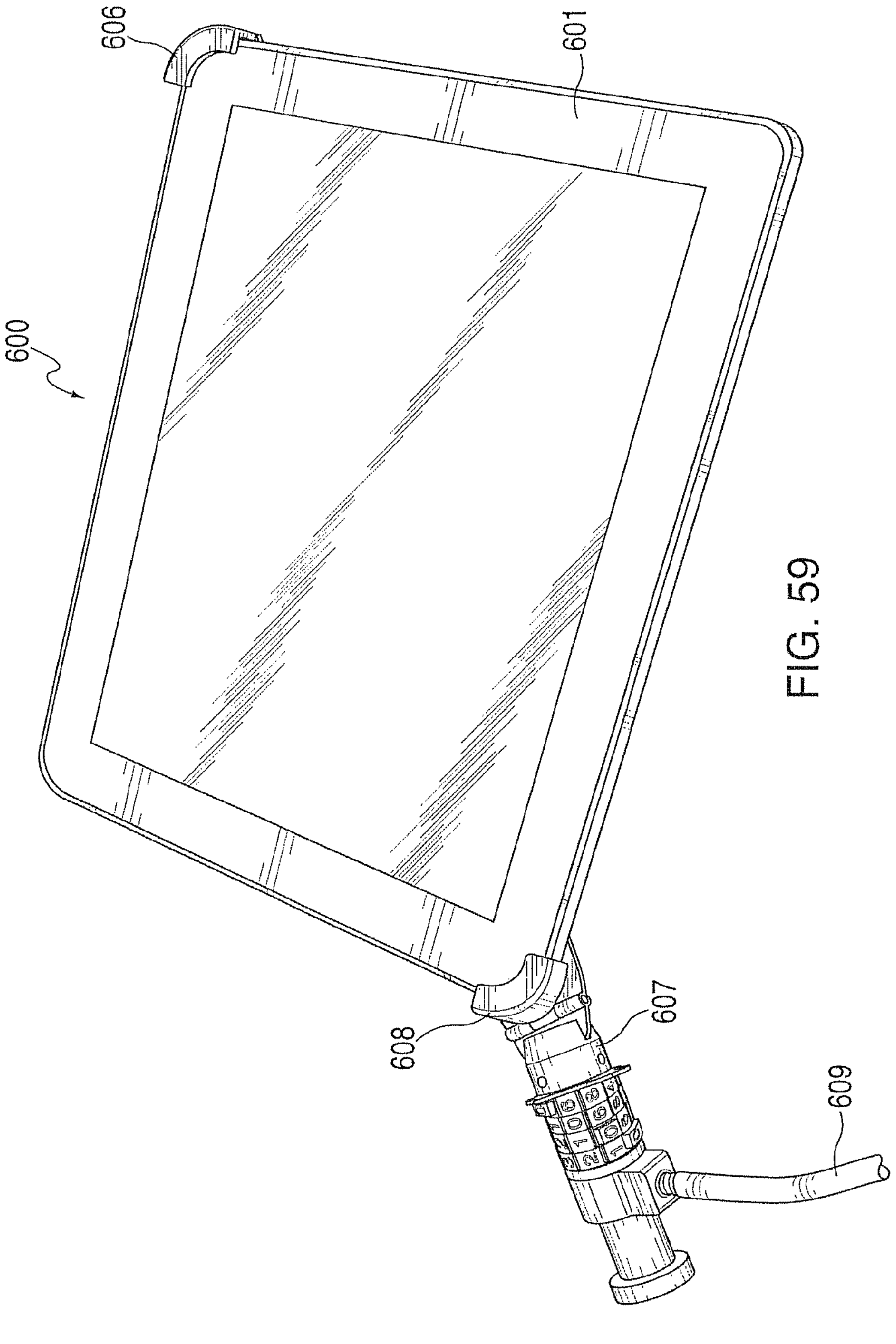
FIG. 59 is a perspective view of the security apparatus of this invention engaged with a computer tablet.

FIG. 59 shows apparatus 600 engaged with tablet 601 and securely locked to it via combination pin lock 607, such as, for example, plunger lock 500 of FIGS. 52-58. Distal corner pocket 606 engages one corner while proximal lockable corner pocket 608 assembly engages the diagonally opposite corner of tablet 601.

Figure 60:
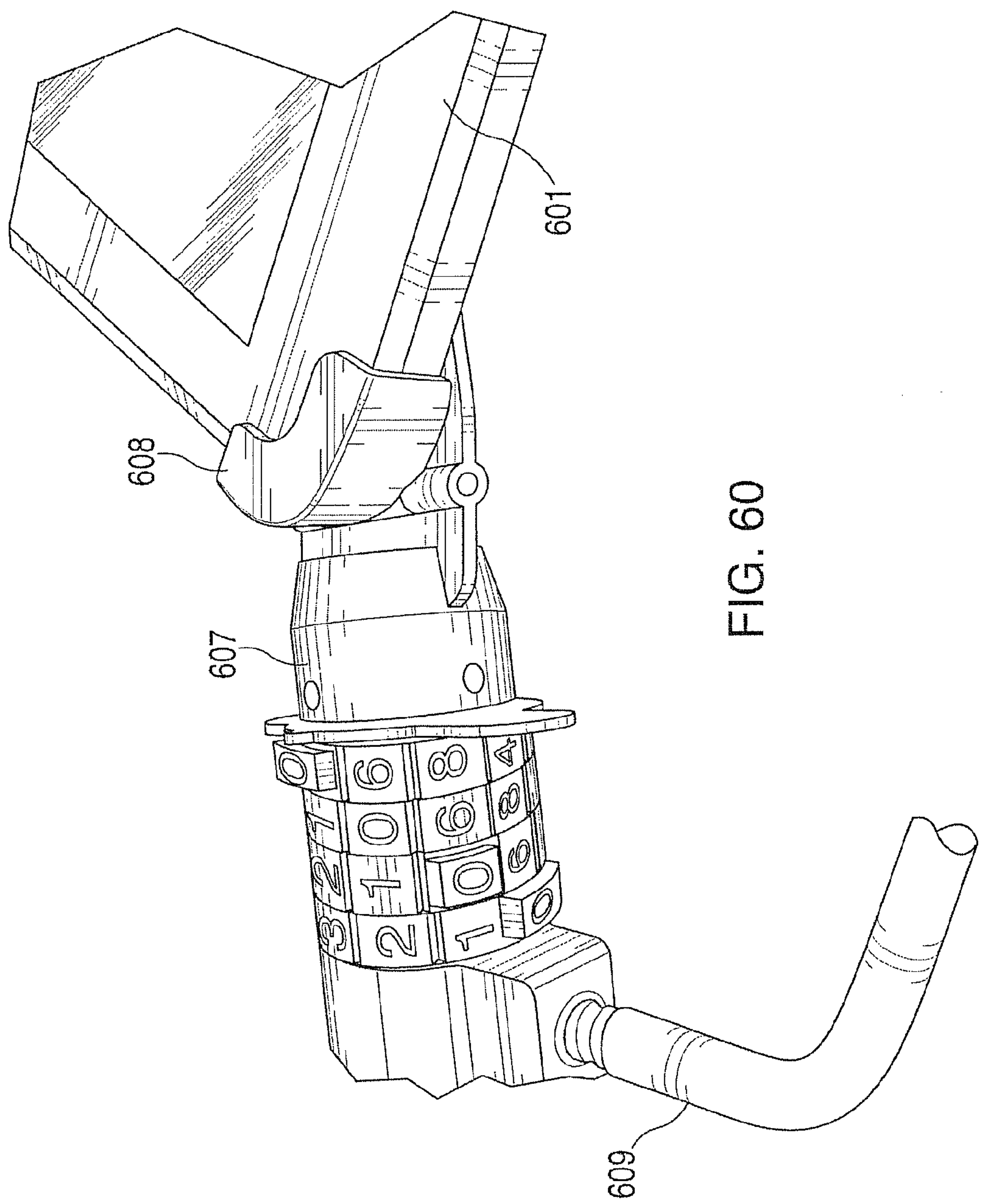
FIG. 60 is a perspective detail of the apparatus of FIG. 59 showing a close-up of the proximal locking mechanism with a pin lock.

FIG. 60 is a close-up detail view showing the engagement of pin lock 607. Cable 609, which is attached to lock 607 is used secure tablet 601 by engaging one corner thereof within proximal lockable corner pocket 608.

Figure 61:
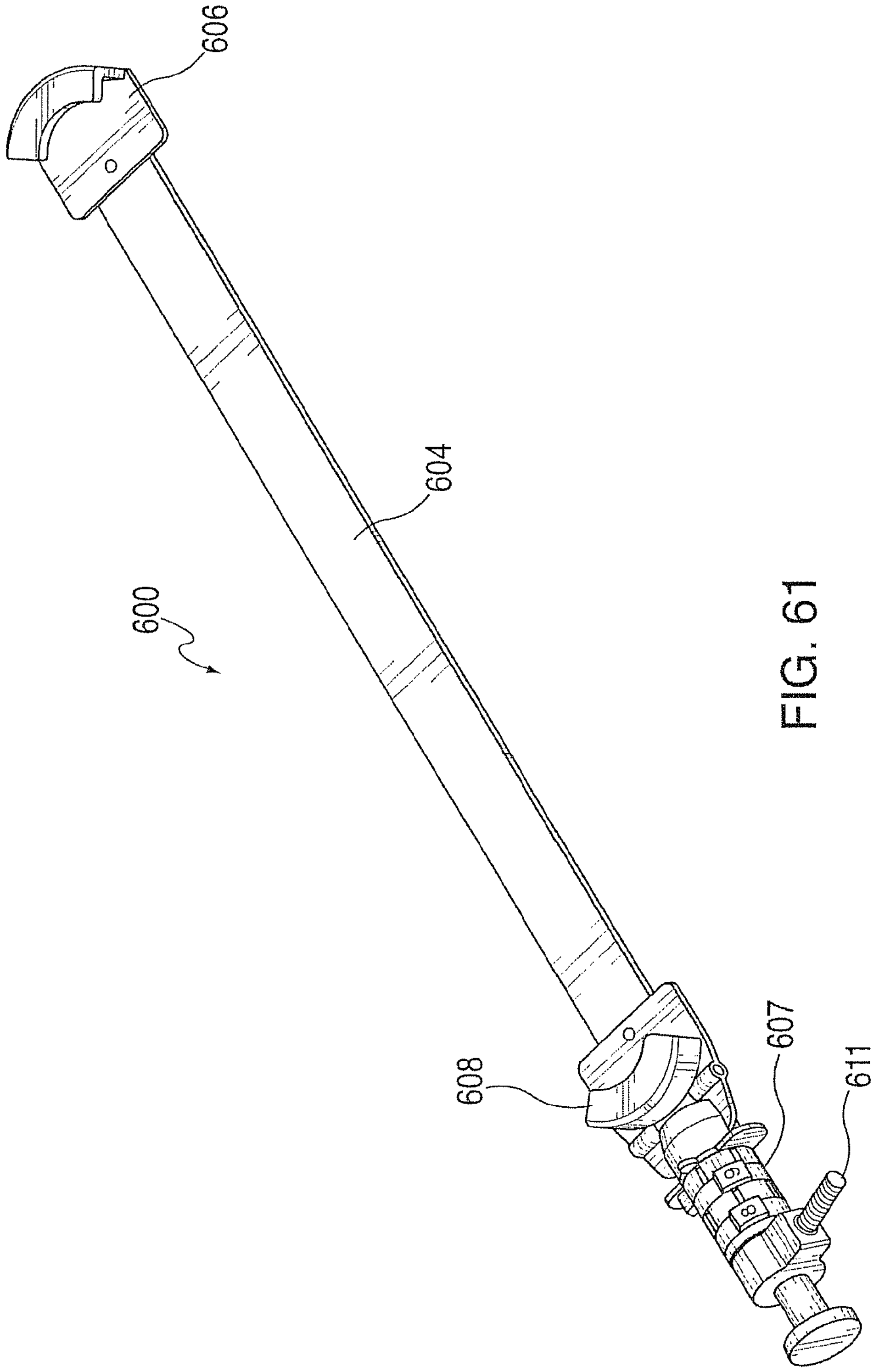
FIG. 61 is a perspective view of the security apparatus with the computer tablet removed for clarity.

Security apparatus 600 is more clearly shown in FIG. 61 which now reveals flat metal chassis bar 604 connecting distal pocket 606 to proximal pocket assembly 608. Note stud 611 attached to lock 607; it is permanently secured to cable 609.

Figure 62:
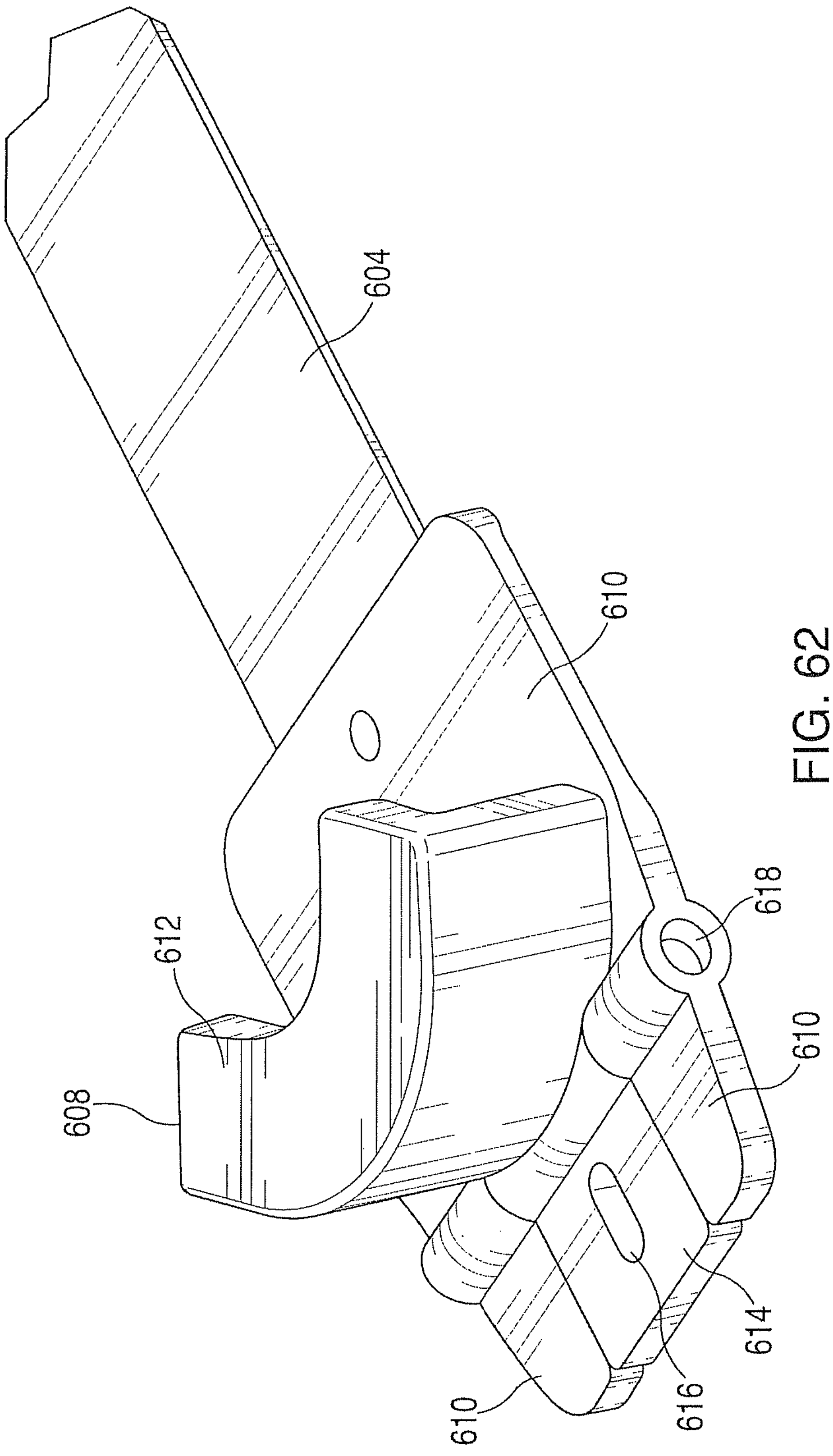
FIG. 62 is a perspective view of the proximal locking mechanism in the closed or engaged position.
Figure 63:
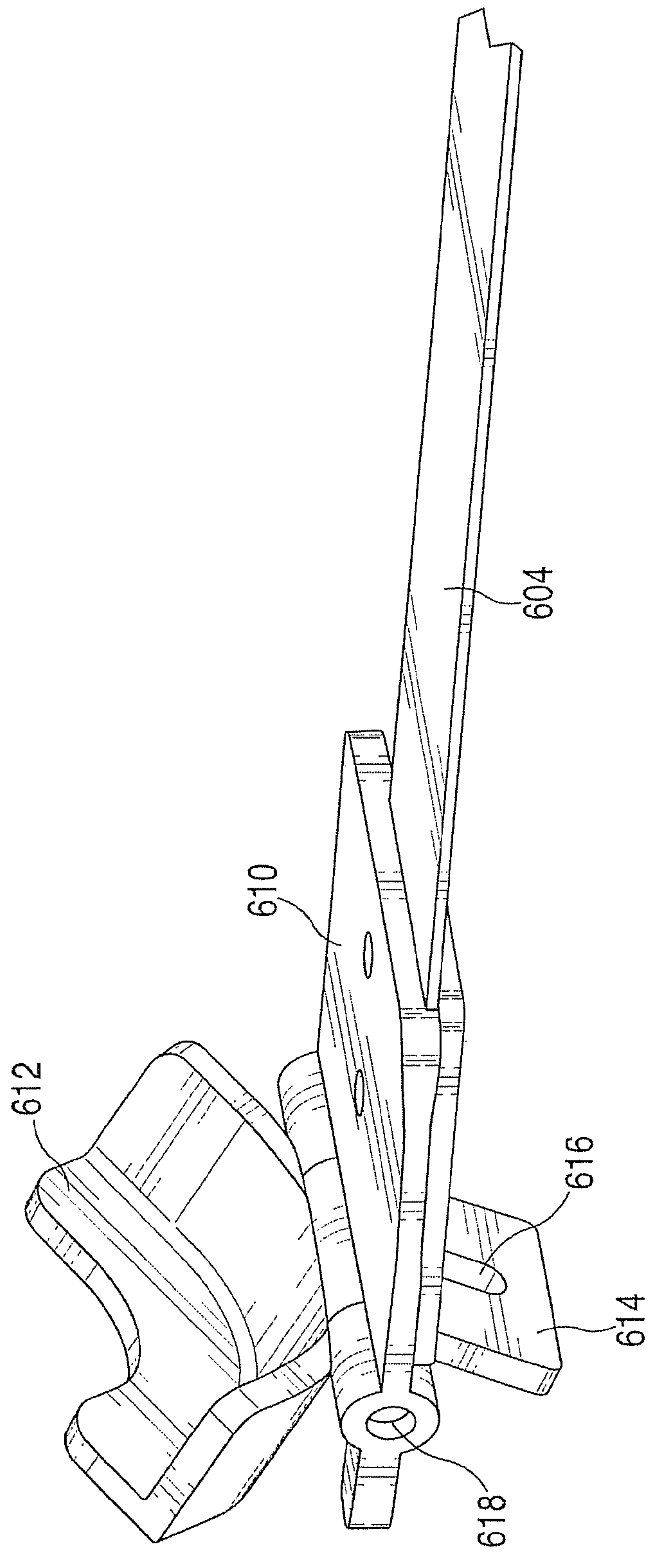
FIG. 63 is a perspective view of the proximal locking mechanism in the open position as it would be when engaging or disengaging the security apparatus to or from a tablet.
Figure 64:
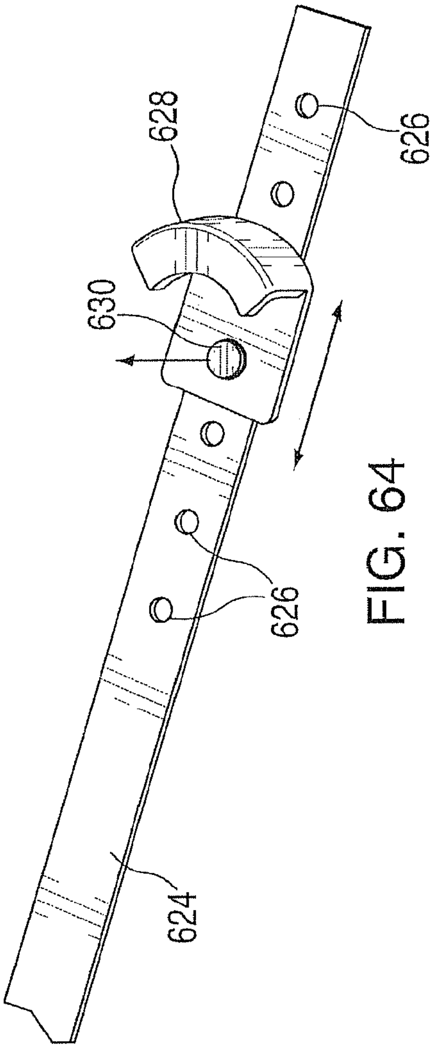
FIG. 64 is a perspective detail of an embodiment of this invention with adjustment for accommodating different sized tablets or similar devices by using a movable distal engagement pocket.

FIGS. 62 and 63 show proximal locking pocket assembly 608 in the closed and open positions respectively. Note that base 610 extends from the attachment portion to chassis bar 604 to the flanges at the proximal end on the other side of the integral hinge pin housing 618. Pocket 612 flips up (see FIG. 63) to permit a corner of tablet 601 to be inserted or disengaged. The hingable tail section 614 fits between flange protrusions of base 610; when it is co-planar with base 610 (see FIG. 62), the slot of pin lock 607 can be fit over the end and locked by its pin engaging hole 616. This completes the locking procedure.

Although purpose-sized security apparatus 600 of this invention can be provided for the most popular tablets or similar devices on the market, an adjustable single unit can also be configured. In one embodiment, the adjustability feature is formed by permitting metal chassis bar 624 in FIG. 64 to slide through a slot in a modified distal pocket 628. An array of holes 626 in chassis 624 provides the adjustability by virtue of a friction fit removable locking pin 630 with a large flat head. The pin cannot be taken out once tablet 601 is engaged, but it is simply lifted up for adjustment to permit pocket 628 to slide on bar 624.

Figure 65:
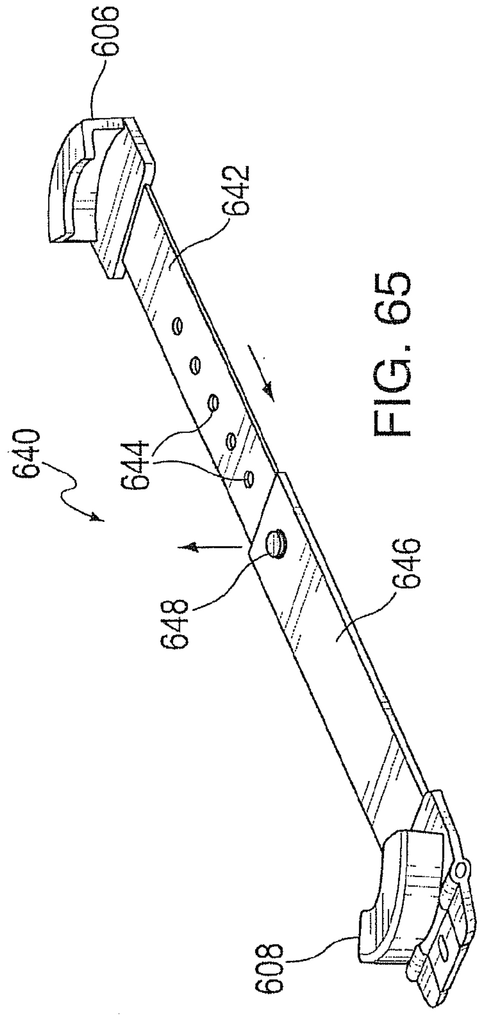
FIG. 65 is another adjustable embodiment using a telescoping chassis bar.

Another adjustable embodiment 640 shown in FIG. 65 uses a two-part telescoping metal chassis bar consisting of hollow proximal portion 646 and solid distal portion 642 which fits inside. An array of holes 644 provides adjustability by virtue of friction fit pin 648 with a large flat head. Again, this pin is locked once tablet 601 is installed. This embodiment is more compact for smaller tablets or like items since there is no distal metal bar extending beyond the distal engagement pocket as in embodiment of FIG. 64.

A further embodiment for a security slot attachment assembly is shown in FIGS. 66-79.

Figure 66:
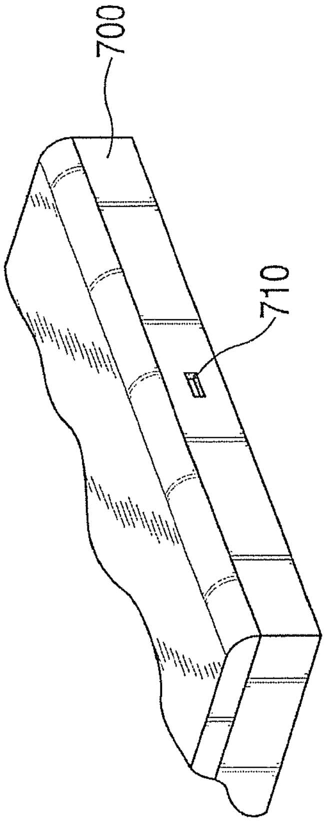
FIG. 66 is a perspective drawing of a security slot in the housing of a piece of equipment, such as a laptop computer.

FIG. 66 shows a detail view in partial cutaway of an equipment (e.g., a laptop) housing 700 with security slot 710. This slot is preferably approximately 3 mm by 7 mm, although dimensions may vary with varying equipment.

Figure 67:
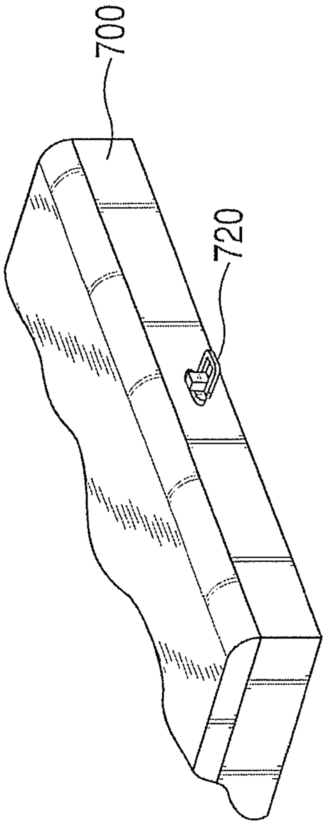
FIG. 67 is a perspective drawing of a security slot attachment of this invention, shown installed in the security slot of FIG. 66.

FIG. 67 shows the security slot attachment 720 of this invention installed to equipment housing 700.

Figure 68:
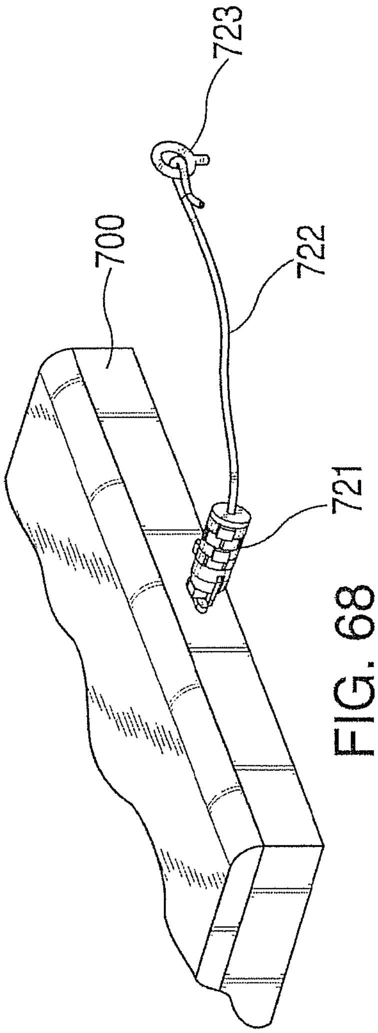
FIG. 68 is a perspective drawing of a lock attached to the security slot attachment of FIG. 67, showing a secure cable installation attached to the lock.

FIG. 68 shows a lock 721 engaged with a security slot attachment 720 (not shown in this view, since it is obscured by lock 721). Cable 722 is shown attached to lock 721, lock 721 locked to security slot attachment 720 fixed in slot 710 of housing 700. Another end of cable 722 is secured to a secure anchor 723.

Figure 69:
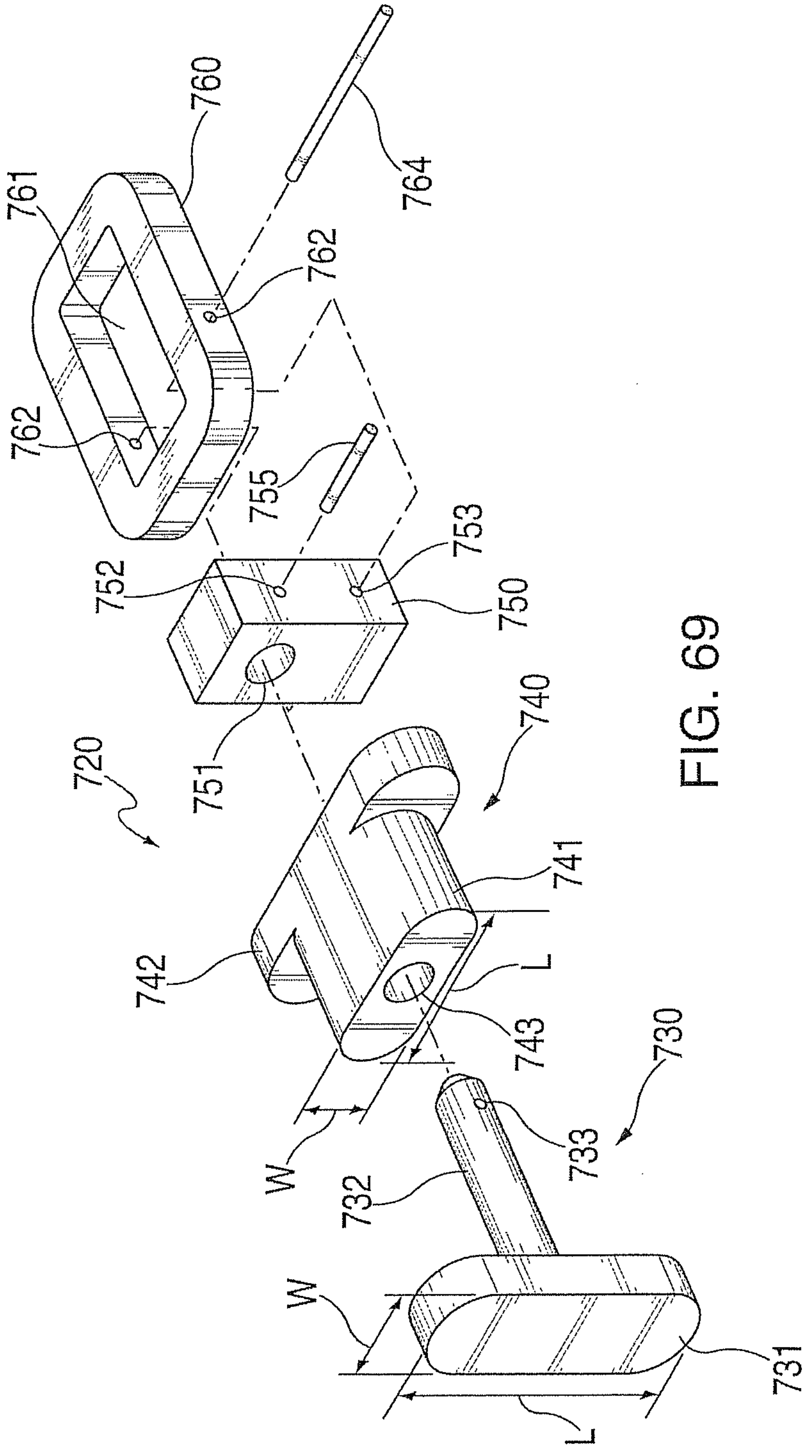
FIG. 69 is a perspective exploded view of the four major parts of one embodiment of the security slot attachment of this invention.

FIG. 69 is an exploded view of the parts comprising one embodiment of security slot attachment 720. Locking element 730 comprises a generally T-shaped element or end 731 attached to an end of or integrally formed with an elongate rod 732. A transverse pin hole 733 is shown formed in the opposite end of the rod. Length "L" and width "W" of locking end 731 are also slightly less than the dimensions of slot 710, to permit insertion of locking end 731 therethrough. A guide 740 is constructed with peripheral wing portions 742 formed upon or with an extended front portion 741 with a contour that follows that of the T-shaped element 731 of locking element 730. The extended front portion has a through hole 743 to receive and allow through-passage of rod 732 of locking element 730 in a loose fit. That is, the guide is configured to freely rotate about the central axis of rod 732 upon assembly of the security slot attachment 720. Front portion 742 (with extending wings) rests on the exterior surface of housing 700 after the locking end 731 of locking element 730 and extended front portion 741 of guide 740 is inserted in a security slot in use.

During security slot attachment 720 assembly, rod 732 is inserted is inserted and passed through through hole 743. A portion of the rod that extends out of guide 740 is inserted into a (in a snug fit) hole 751 of a pivot block 750. Pivot block 750 also includes two transverse holes 752 and 753. Transverse hole 733 of rod 732 is aligned with transverse hole 752 of pivot block 750 and pin 755 is inserted in a press fit to secure the rod to the pivot block. While the locking element 730, guide 740 and pivot block 750 form a subassembly of three parts, locking element 730 (including rod 732 and locking end 731) and pivot block 750 operate together as one functional unit, which further includes guide 740 when assembled into a sub-assembly.

Figure 70:
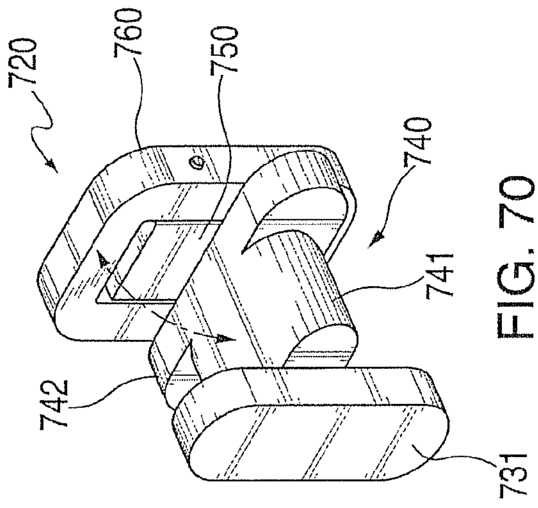
FIG. 70 is a perspective view of the assembled security slot attachment.
Figure 71:
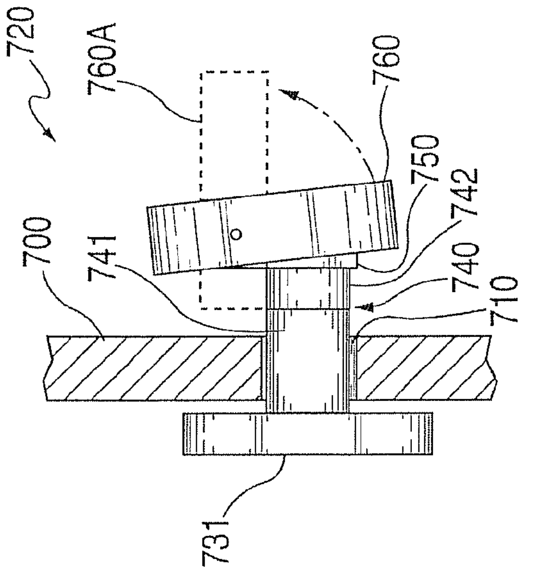
FIG. 71 is a side elevation of the attachment showing the locking position and the equipment housing in dashed lines.

The last member of the security slot attachment 720 is lock plate 760, with larger rectangular locking hole 761 and pivot bar hole 762. The lock plate 760 functions to prevent further movement of the locking element 730 (including rod 732 and locking end 731), guide and pivot block 750 after placement in equipment by attachment of a locking device through rectangular locking hole 761. The final assembly step is to invert the subassembly so that hole 753 of pivot block 750 can align with holes 762, in positional registration with each other, and of lock plate 760. Pin 764 is a press fit in lock plate 760 but a clearance fit in block 750. When pin 764 is pressed through lock plate 760 and pivot block 750, the assembly is complete as shown in FIGS. 70 and 71. Once so arranged, lock plate pivots about the axis of pin in such a way that pivot block 750 is positioned within and outside of the large rectangular hole 761 of lock plate 760.

FIG. 71 shows the locking plate 760 in the locked position with the pivot block 750. An unlocked position of the locking plate 760 is designated as 760A (shown in dashed lines) along the side of exterior portion 742 of guide 740. T-shaped locking end 731 of locking element 730 is now perpendicular to the side of exterior portion 742 of guide 740 with extending wings 742. That is, locking plate is able to extend to its open position (760A) only when the longitudinal length of the T-shaped locking end 731 is rotated (about rod 732) 90° with respect to the longitudinal length of extended front portion 741 of guide 740. That is, the extended front portion 741 of guide 740 enters through locking slot 710 and therefore housing 700 separates T-shaped locking end 731 of locking element 730 from exterior portion 742 of guide 740. (See dashed lines of FIG. 71.)

Figure 72:
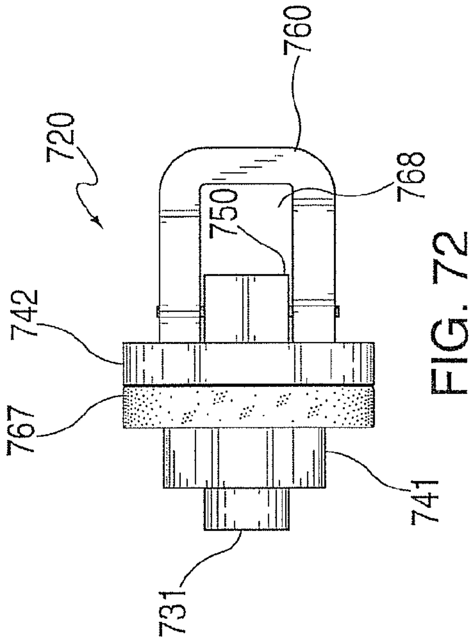
FIG. 72 is a front elevation of the security slot attachment in a locked position with compression foam washer installed.

FIG. 72 shows distal portion or space 768 within rectangular locking hole 761 of lock plate 760 when positioned away from pivot block 750; this is the engagement feature where security slot attachment 720 engages the rest of the apparatus that will secure housing 700 to some fixed object in the vicinity. In this arrangement, the locking element 730 (including rod 732 and locking end 731) is no longer able to pivot about guide 740 fixed in slot 710 of the equipment and thus, the security slot attachment 720 is no longer able to be withdrawn. Also, an optional compression elastomer foam washer 767 may be added to the lower end of guide 740 under exterior portion 742. This washer keeps security slot attachment 720 snug to housing 700 when locked by compressing the foam washer to resist any vibration noise coining from the security slot attachment 720. Such snug fit enhances security.

Figure 73:
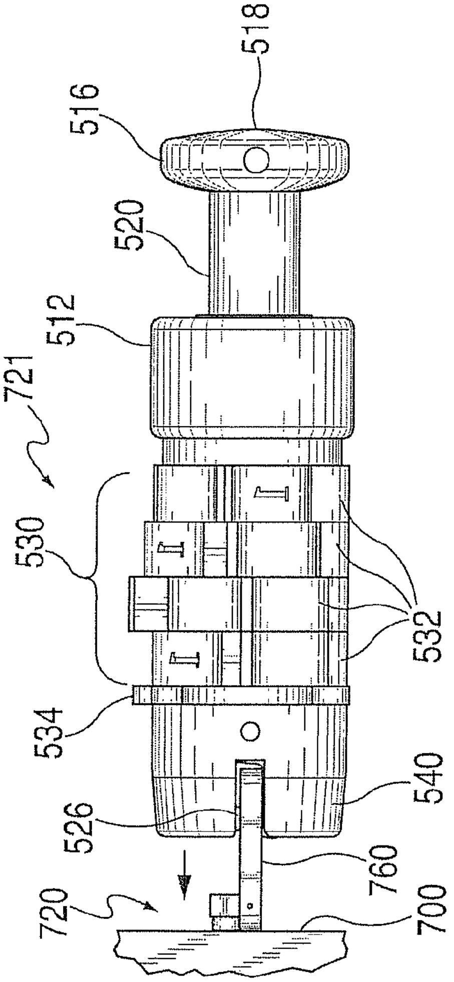
FIG. 73 is a side elevation of a combination lock engaged with the security slot attachment of this invention.
Figure 74:
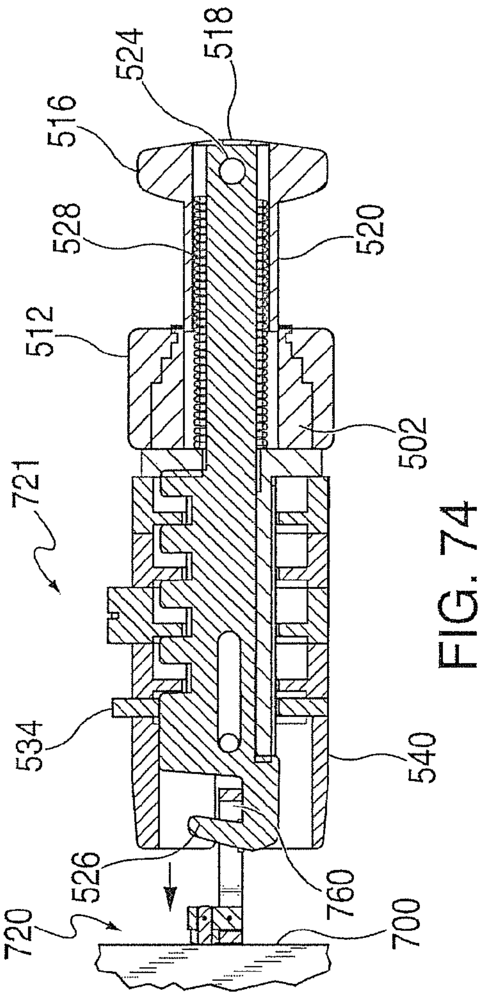
FIG. 74 is a crossection side elevation of a combination lock engaged with the security slot attachment showing the hook more clearly.
Figure 75:
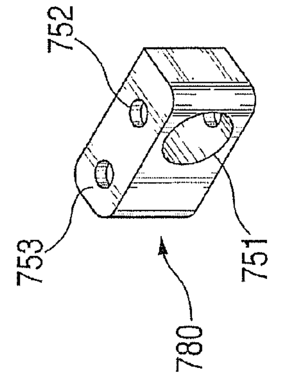
FIG. 75 is a perspective view of pivot block of the preferred embodiment for a security slot attachment.
Figure 76:
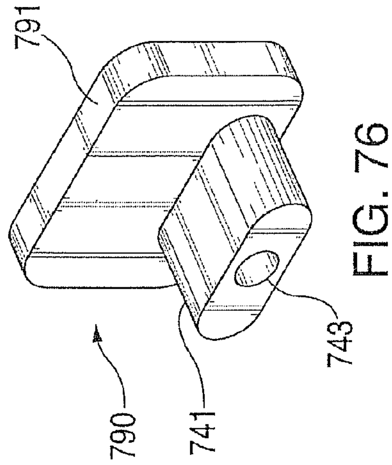
FIG. 76 is a perspective view of the guide part of the preferred embodiment security slot attachment.

FIGS. 73 and 74 show the engagement of a locking member or hook 526 of a lock 721 after same hook is passed through space 768 of the security lock attachment 720. Lock 721 is described (for example, in drawing FIGS. 52-58B) of Co-Applicant Peter Allen's pending US Patent Application Publication number 2010/0284144, filed Nov. 8, 2011, and incorporated by reference in its entirety herein. The reader should note that the locking plate 760 is shown abnormally long in the views of FIGS. 73 and 74 to highlight the locking feature in cooperation with a security lock; actually the end of lock 721 is much closer to housing 700, thereby preventing lock plate 760 from pivoting over. For that matter, the security slot attachment 720 of the invention is limited to use with a lock 721, as shown, but may be used with any locking mechanism or device that uses a locking clasp capable of passing through space 768 of the locking plate 760 of the security lock attachment 720, and locking.

Figure 77:
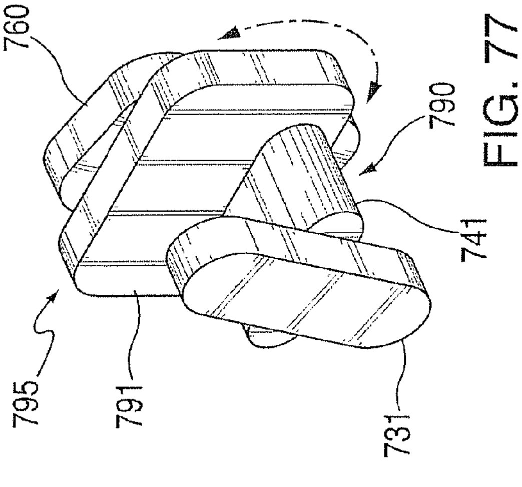
FIG. 77 is a perspective view of an assembled security slot attachment of the preferred embodiment.
Figure 78:
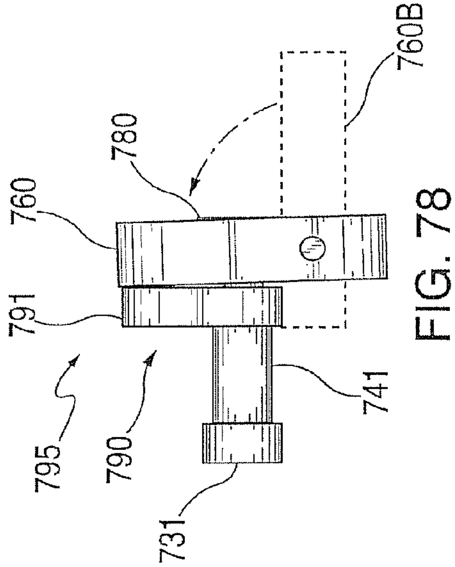
FIG. 78 is a side elevation of the security slot attachment showing the locked position of the locking plate in dashed lines for the preferred embodiment.
Figure 79:
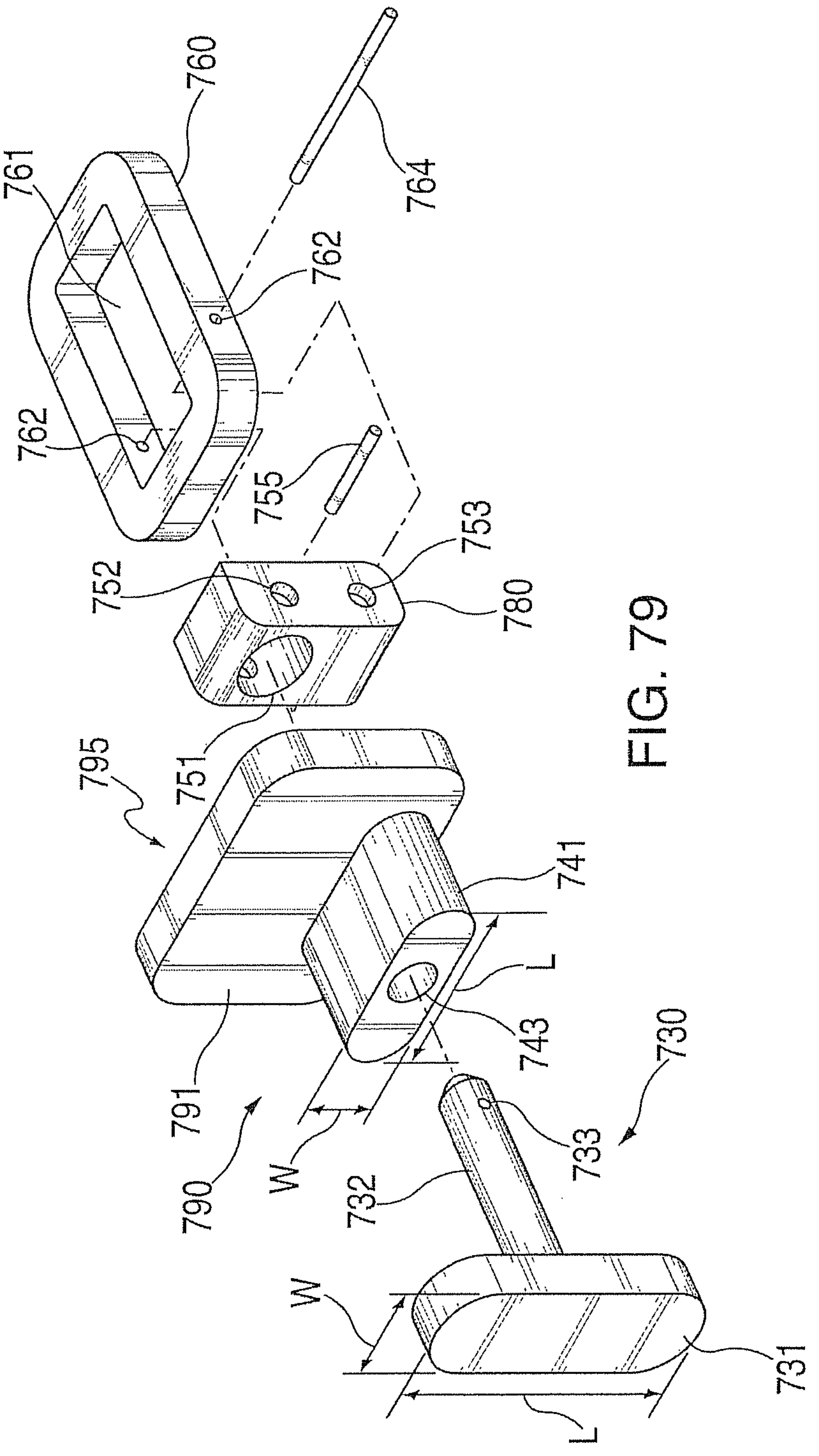
FIG. 79 is a perspective exploded view of the four major parts of the preferred embodiment of the security slot attachment of this invention.

FIGS. 75 through 79 show details of an alternative embodiment of security slot attachment 795 of this invention. In this embodiment, two parts of the security slot attachment 720 (FIGS. 67-74) are modified. That is, pivot block 780 of security slot attachment 795 in FIG. 75 replaces pivot block 750 of security slot attachment 720, but its function and attachment remain the same. The three rounded corners of pivot block 780 permit a closer fit and in some cases better accommodate operational clearances. The other modified part (with respect to security slot attachment 720) is guide 790 (see FIG. 76). Guide 790 replaces guide 740 of the first embodiment disclosed in FIGS. 67-74 herein. Exterior portion 791 of guide 790, which includes extended wings 791 is now wider than front portion 741 of guide 740 of security slot attachment 720:

An assembly of an embodiment of security slot attachment 795 is shown in FIGS. 77, 78 and 79. It is noted that there is only one locking position of lock plate 760 in this embodiment, as shown in dashed lines 760B in FIG. 78. This single locking positional arrangement of lock plate 760 contrasts with the security slot attachment 720 (FIGS. 67-74), where guide 760 can pivot 90 degrees in one direction and 90 degrees in another opposite direction. It is also noted that the entire periphery of security slot 710 of computer equipment housing 700 is covered by parts of security slot attachment 795 in this preferred embodiment, when locked.

FIG. 79 is an exploded view of the parts comprising security slot attachment 795. Locking element 730 (similar to security slot attachment 720 in FIGS. 67-74) also has locking end 731 attached to or formed integrally with rod 730, and including a pin hole 733 for attaching to pivot block 780. It is noted that while rods 730 are shown with pin holes 733 through which a pin 755 is inserted to fix the rods to the respective pivots blocks (750; 780), the invention is not limited to such fastening means. That is, any other means known to the skilled artisan for attaching the rods to the pivots blocks may be used without deviating from the scope and spirit of the invention.

Also, like security slot attachment 720, the length "L" and width "W" of locking end 731 are slightly less than the slot 710 dimensions of computer equipment housing 700. However, guide 790 has a different configuration than guide 740 (FIGS. 67-74). Guide 790 is constructed with a front portion 791 having a through hole 743 to receive rod 732 of locking element 730 in a loose fit.

Exterior or front portion 791 of guide 790 rests on the exterior surface of computer housing 700 upon insertion of extended front portion 741 and locking end 731 through the slot 710 in equipment 700 during use. During assembly, rod 732 of locking element 730 is inserted through hole 743 of guide 790 and then into (in a snug fit) hole 751 of pivot block 780. Hole 733 of locking element 730 is aligned with hole 752 and pin 755 is inserted in a press fit. This forms a subassembly of the locking element 730, locking guide 790 and pivot block 780. The final assembly step is to invert the subassembly so that hole 753 of pivot block 780 can align with holes 762 of lock plate 760, once pivot block 780 is placed within the large rectangular hole 761 of block plate 760. Pin 764 is a press fit in lock plate 760 but is a clearance fit in block 780. When pin 764 is pressed through holes 762 of plate 760 and hole 753 of block 780, the assembly is complete (FIGS. 77 and 78).

FIG. 78 highlights the position of locking plate 760 in the locked position as 760B (dashed lines) along the side of exterior portion 791 of guide 790. As shown, locking end 731 of locking element 730 is now perpendicular to the side of 791 of guide 790. The front part 741 of guide 790 enters through locking slot 710 and computer housing 700 separates locking end 731 from exterior portion 791 of guide 790. (See dashed lines of FIG. 78.)

Figure 80:
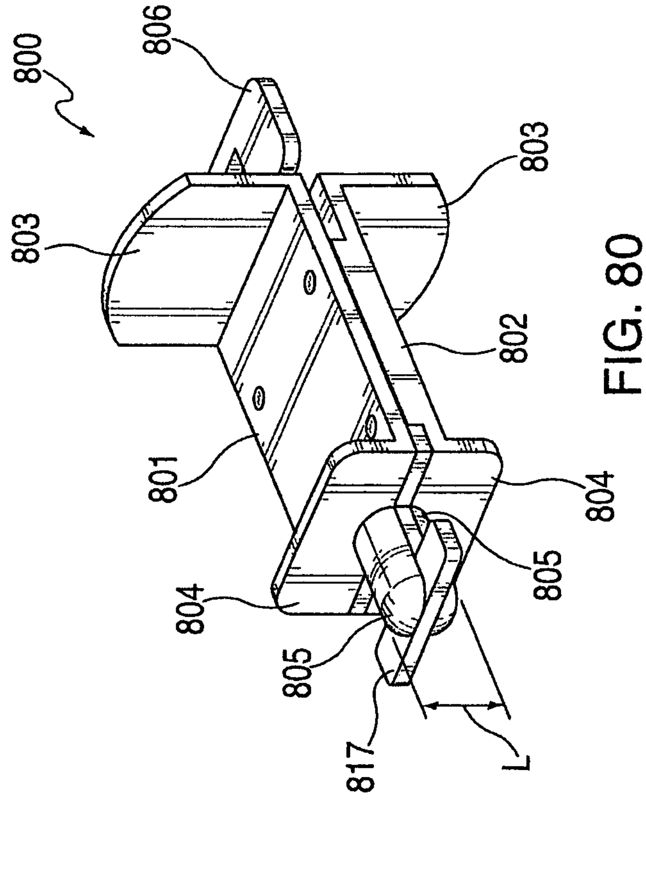
FIG. 80 is a perspective view of an alternate embodiment security slot attachment device of this invention.

The alternate embodiment attachment device 800 is shown in FIG. 80. It has a shallow housing 801, a housing with pedestals 802, and a captured flat plate 806 with an engagement tang 817 at the front end. Both housing portions have front anti-rotation protrusions 805 on either side of engagement tang 817. Note that combined distance from the top of one 805 protrusion to the bottom of the other is "L" which fits the long dimension of attachment slot 710. Front housing sections 804 are contact abutments which contact the device housing when attached. Wings 803 are housing extensions forming finger grasping surfaces.

Figure 81:
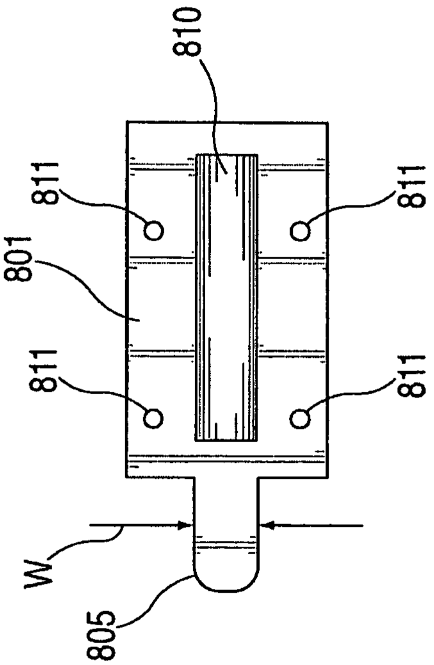
FIG. 81 is an inside plan view of the low housing of the attachment.

The parts forming this embodiment are further detailed in FIGS. 81-84. FIG. 81 shows an inside view of shallow housing 801 with extension 805 of width "W" (i.e. fits short dimension of attachment slot 710). A shallow recess 810 is provided to house spring 820 (see FIG. 83). Holes 811 are for rivets or other secure fasteners which hold the attachment device 800 together.

Figure 82:
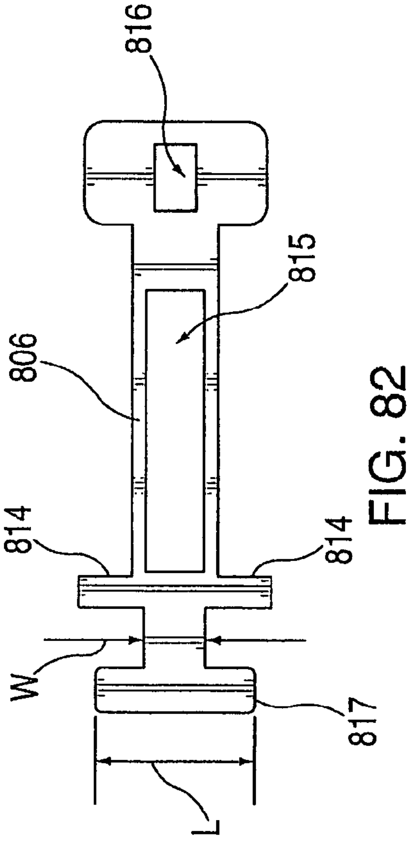
FIG. 82 is a plan top view of the flat plate.
Figure 83:
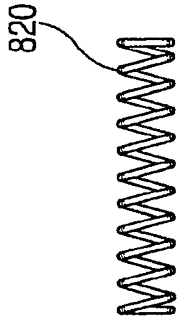
FIG. 83 is a side elevation of the compression spring.

Flat plate 806 is shown in FIG. 82. It has engagement tang 817 at the front end and locking hole 816 for a lock or secure cable adjacent the distal end. It is noted that the neck portion of width "W" and shoulders 814 help to locate plate 806 within the clamshell housing formed from parts 801 and 802. Elongated hole 815 engages spring 820.

Figure 84:
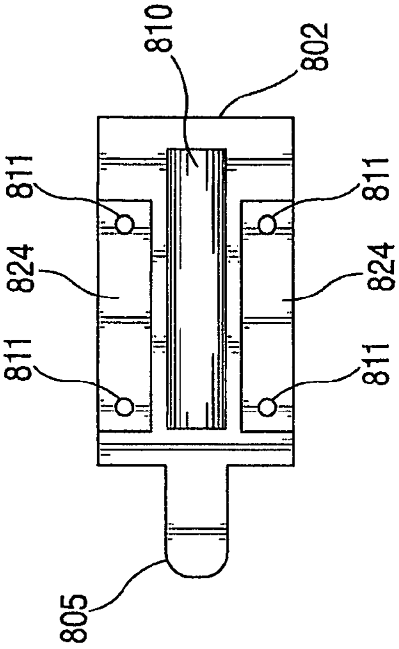
FIG. 84 is an inside plan view of the housing with pedestals.

FIG. 84 shows pedestal housing 802 which is similar to shallow housing 801 with the addition of pedestals 824 which provide space for flat plate 806.

Figure 85:
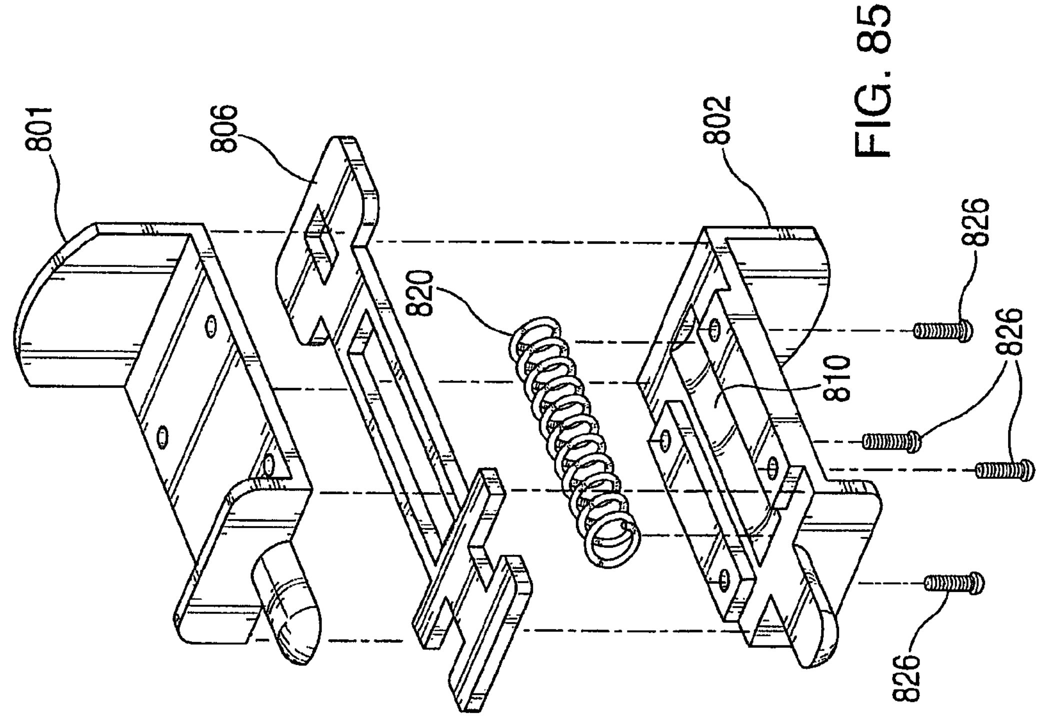
FIG. 85 is an exploded perspective view of the components of the alternate embodiment attachment.

FIG. 85 is an exploded view showing how the parts are assembled together and secured via rivets 826.

Figure 87:
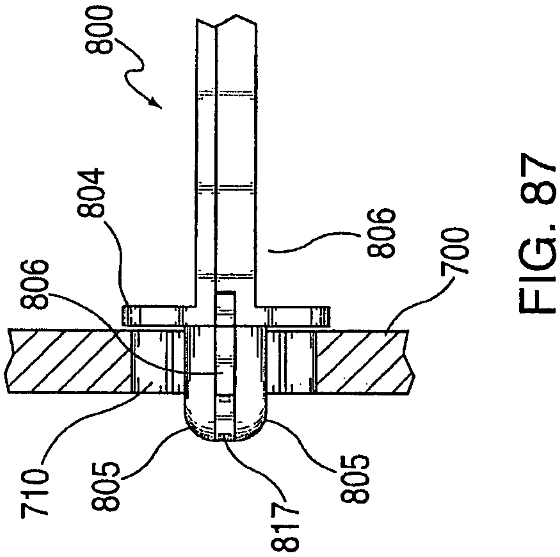
FIG. 87 is a front detail top view of the engagement tang in a locked position through security slot (with the device housing shown in crossection)
Figure 86:
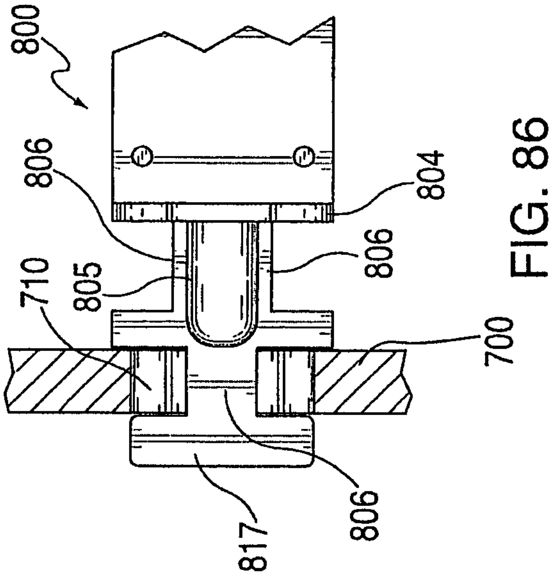
FIG. 86 is a front detail top view of the insertion of the engagement tang inside a security slot (with device housing shown in crossection)

In FIGS. 86 and 87, the device housing 700 of the device being secured is shown in crossection at the center of the long dimension of attachment slot 710.

For example, in FIG. 86, plate 806 is shown pushed forward and engagement tang 817 pushed through housing 700, note that the neck of plate 806 (behind tang 817) is now spaced away from the ends of extensions 805 thereby permitting rotation within slot 710.

Likewise, in FIG. 87, the attachment assembly has been rotated 90 degrees thereby locking device housing 700 to attachment 800 via ends of tang 817 now being transverse to slot length; also note that extensions 805 now fit within slot 710 in this alignment. In FIG. 87, spring 820 has retracted plate 806 within attachment 800 (and simultaneously exposed locking hole 816 at the distal end).

Figure 88:
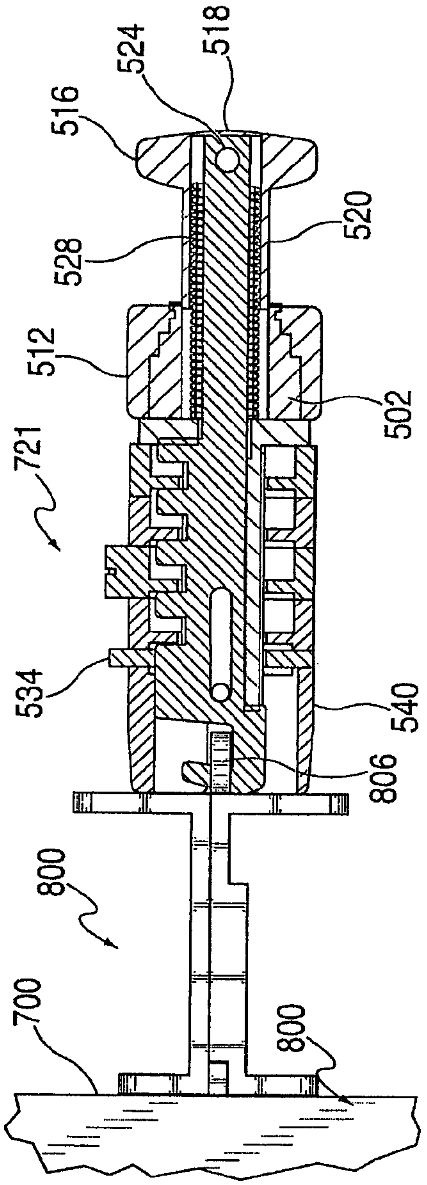
FIG. 88 is a side elevation showing the alternate embodiment attachment device locked onto a device housing a coupling lock; and, FIG. 89 is a side elevation showing the attachment device locked onto a device housing a secure cable.

FIG. 88 is a detail showing the engagement of a coupling lock 721 with plate 806 thereby locking device 700 to attachment 800.

Figure 89:
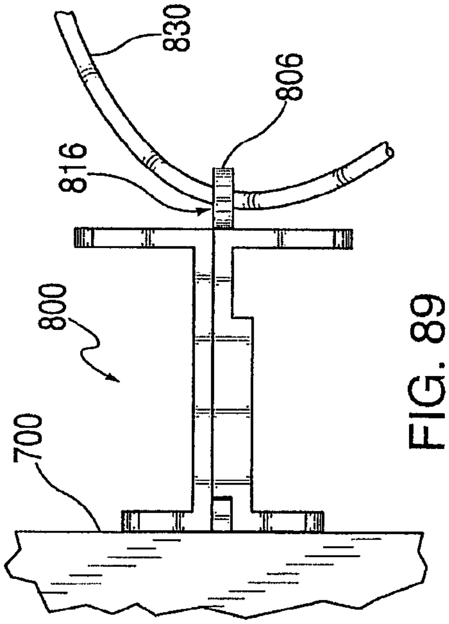

FIG. 89 shows an alternate engagement using a secure cable through hole 816 of plate 806 to perform the locking function.

In the foregoing description, certain terms and visual depictions are used to illustrate the preferred embodiment. However, no unnecessary limitations are to be construed by the terms used or illustrations depicted, beyond what is shown in the prior art, since the terms and illustrations are exemplary only, and are not meant to limit the scope of the present invention.

It is further known that other modifications may be made to the present invention, without departing the scope of the invention, as noted in the appended Claims.

We claim:

1. Security apparatus for a portable device comprising:
- said portable device having a housing with an elongated security slot;
- an attachment device for engaging said security slot;
- said attachment device comprising upper and lower housing portions permanently secured together, and having front and rear ends;
- a captured flat plate slidable forwardly and rearwardly mounted within said attachment device between said upper and lower housing portions;
- said upper and lower housing portions having extended recesses facing said flat plate;
- said flat plate having an extended slot corresponding to and aligned with said recesses;
- a coil spring within said recesses and said slot whereby forward movement of said flat plate compresses said spring;
- said flat plate having front and rear extensions extending out said front and rear ends, respectively, of said upper and lower portions when said spring is not compressed;
- said rear extension of said flat plate having a locking hole; and
- said front extension of said plate having a tang for engaging said portable device housing when said flat plate is pushed forwardly from a resting position for said tang to enter said security slot and said attachment device is rotated 90 degrees in either direction;
- whereby said locking hole in said rear extension of said flat plate is exposed when said flat plate is released after said attachment device is rotated and said flat plate is released thereby allowing a locking member to be inserted through said locking hole to prevent release of said flat plate from said security slot.

2. The security apparatus of claim 1 in which said front ends of said upper and lower housing portions have anti-rotation protrusions enclosing portions of said front extension of said flat plate and said tang when said flat plate is in said resting position, whereby pushing of said flat plate forwardly exposes said tang for rotation within said security slot when said attachment device is rotated.

3. The security apparatus of claim 2 in which said upper and lower housing portions have front wings for abutting a surface of said portable device housing adjacent said security slot for aligning said tang and said anti-rotation protrusions with said security slot.

4. The security apparatus of claim 3 in which said upper and lower housing portions have rear wings for grasping of said attachment device.

5. The security apparatus of claim 4 in which said tang is mounted on an end of a neck extending from said flat plate and extends transversely from said neck.

6. The security apparatus of claim 5 in which the distance between top and bottom surfaces of said anti-rotation protrusions fits the length of said security slot.

7. The security apparatus of claim 6 in which said tang has a width which fits the length of said security slot.

8. The security apparatus of claim 4 in which said upper and lower portions are permanently secured with rivets.

9. The security apparatus of claim 4 in which one of said housing portions has pedestals mounted on faces on opposite sides of the recess thereof to allow slidable movement of said flat plate between said upper and lower housing portions.

10. The security apparatus of claim 4 in which said locking member comprises a cable extending through said locking hole to prevent unauthorized removal of said attachment device.

11. The security apparatus of claim 4 in which said locking member comprises a coupling extending through said locking hole to prevent unauthorized removal of said attachment device.

12. The security slot attachment as in claim 1, wherein said parts are selected from the group consisting of aluminum, stainless steel, plastic, resins, die cast zinc-aluminum alloys, or injection molded metal.

13. The security slot attachment as in claim 1, wherein to remove said attachment, said captured locking plate is moved forward by finger force overcoming spring force, said locking plate and tang being rotated 90 degrees in its own plane, to permit said security slot attachment to be removed out of said security slot.

* * * * *